(12) United States Patent
Liao et al.

(10) Patent No.: US 10,170,555 B1
(45) Date of Patent: Jan. 1, 2019

(54) INTERMETALLIC DOPING FILM WITH DIFFUSION IN SOURCE/DRAIN

(71) Applicant: Taiwan Semiconductor Manufacturing Company, Ltd., Hsinchu (TW)

(72) Inventors: Chih-Teng Liao, Hsinchu (TW); Yi-Wei Chiu, Kaohsiung (TW); Tzu-Chan Weng, Kaohsiung (TW); Chih Hsuan Cheng, Houlong Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/665,968

(22) Filed: Aug. 1, 2017

Related U.S. Application Data

(60) Provisional application No. 62/527,698, filed on Jun. 30, 2017.

(51) Int. Cl.
*H01L 21/84* (2006.01)
*H01L 29/08* (2006.01)
(Continued)

(52) U.S. Cl.
CPC ...... *H01L 29/0847* (2013.01); *H01L 27/0924* (2013.01); *H01L 29/66545* (2013.01); *H01L 29/66795* (2013.01); *H01L 29/785* (2013.01)

(58) Field of Classification Search
CPC ............ H01L 29/0847; H01L 27/0924; H01L 29/66545; H01L 29/66795; H01L 29/785; H01L 21/2033; H01L 21/823418; H01L 29/0843; H01L 29/66636; H01L 2924/13067; H01L 21/845; H01L 27/0886
(Continued)

(56) References Cited

U.S. PATENT DOCUMENTS

| 8,487,378 B2 | 7/2013 | Goto et al. |
| 8,729,634 B2 | 5/2014 | Shen et al. |

(Continued)

FOREIGN PATENT DOCUMENTS

| KR | 20170003345 A | 1/2017 |
| KR | 101707785 B1 | 2/2017 |

(Continued)

*Primary Examiner* — Shahed Ahmed
(74) *Attorney, Agent, or Firm* — Slater Matsil, LLP

(57) ABSTRACT

A method includes etching a substrate to form a first semiconductor strip. A first dummy gate structure is formed over a first channel region of the first semiconductor strip. First and second recesses are etched in the first semiconductor strip on either side of a first dummy gate. An intermetallic doping film is formed in the first recess and the second recess. A dopant of the intermetallic doping film is diffused into the first semiconductor strip proximate the recesses. Source/drain regions are epitaxially grown in the recesses. A device includes semiconductor strips and a plurality of gate stacks. A first epitaxial source/drain region is interposed between a first two of the plurality of gate stacks. A first dopant diffusion area surrounds the first epitaxial source/drain region and has a first concentration of a first dopant greater than a second concentration of the first dopant outside the first dopant diffusion area.

20 Claims, 58 Drawing Sheets

(51) Int. Cl.
*H01L 29/78* (2006.01)
*H01L 27/092* (2006.01)
*H01L 29/66* (2006.01)

(58) Field of Classification Search
USPC ......... 257/288, 368, 369; 438/151, 197, 199
See application file for complete search history.

(56) References Cited

U.S. PATENT DOCUMENTS

| | | |
|---|---|---|
| 8,826,213 B1 | 9/2014 | Ho et al. |
| 8,887,106 B2 | 11/2014 | Ho et al. |
| 2008/0048186 A1* | 2/2008 | Cheng ............... H01L 27/10841 257/48 |
| 2013/0032865 A1* | 2/2013 | Chan .................. H01L 21/2254 257/288 |
| 2014/0282326 A1 | 9/2014 | Chen et al. |
| 2015/0236155 A1* | 8/2015 | Chiu ................. H01L 29/66628 257/408 |
| 2015/0270342 A1* | 9/2015 | Tsai .................... H01L 29/0847 257/43 |
| 2017/0005011 A1 | 1/2017 | Ching et al. |
| 2017/0005196 A1 | 1/2017 | Chen et al. |
| 2017/0062436 A1* | 3/2017 | Guillorn ................. H01L 28/40 |
| 2017/0069725 A1* | 3/2017 | Bhimarasetti ..... H01L 29/66545 |
| 2017/0125591 A1 | 5/2017 | Giles et al. |
| 2017/0148797 A1 | 5/2017 | Kim et al. |

FOREIGN PATENT DOCUMENTS

| | | |
|---|---|---|
| KR | 101735209 B1 | 5/2017 |
| KR | 20170059234 A | 5/2017 |

\* cited by examiner

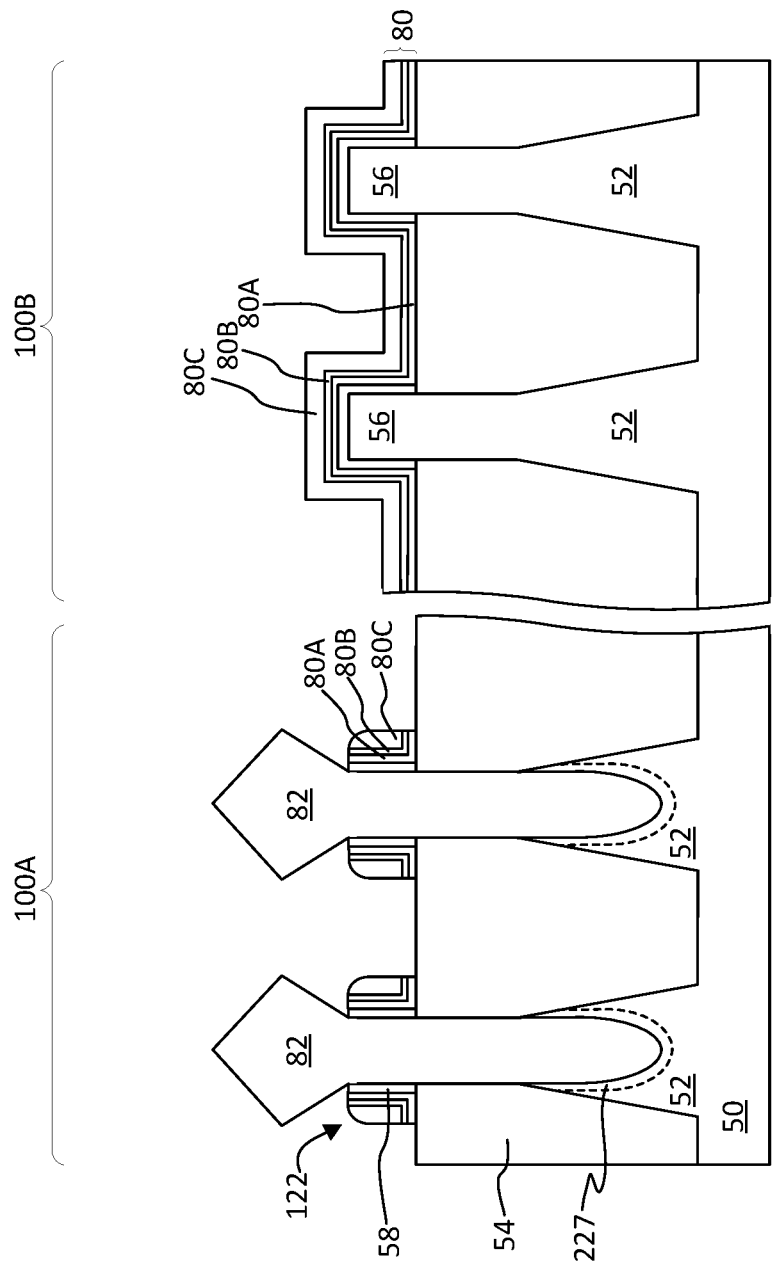

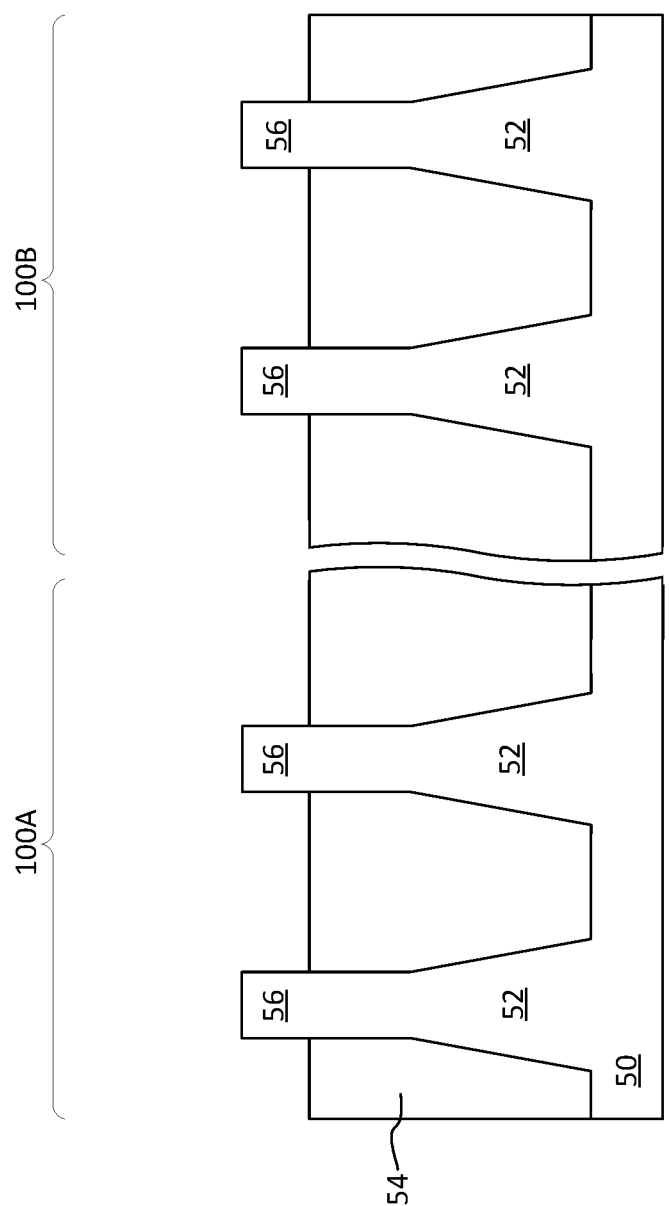

INTERMETALLIC DOPING FILM WITH DIFFUSION IN SOURCE/DRAIN

PRIORITY CLAIM AND CROSS-REFERENCE

This application claims the benefit of U.S. Provisional Application No. 62/527,698, entitled, "Intermetallic Doping Film with Diffusion in Source/Drain," filed on Jun. 30, 2017, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 26A, 26B, and 26C are cross-sectional views of intermediate stages in the manufacture of a FinFET device in accordance with some embodiments.

DETAILED DESCRIPTION OF ILLUSTRATIVE EMBODIMENTS

Figure 1:
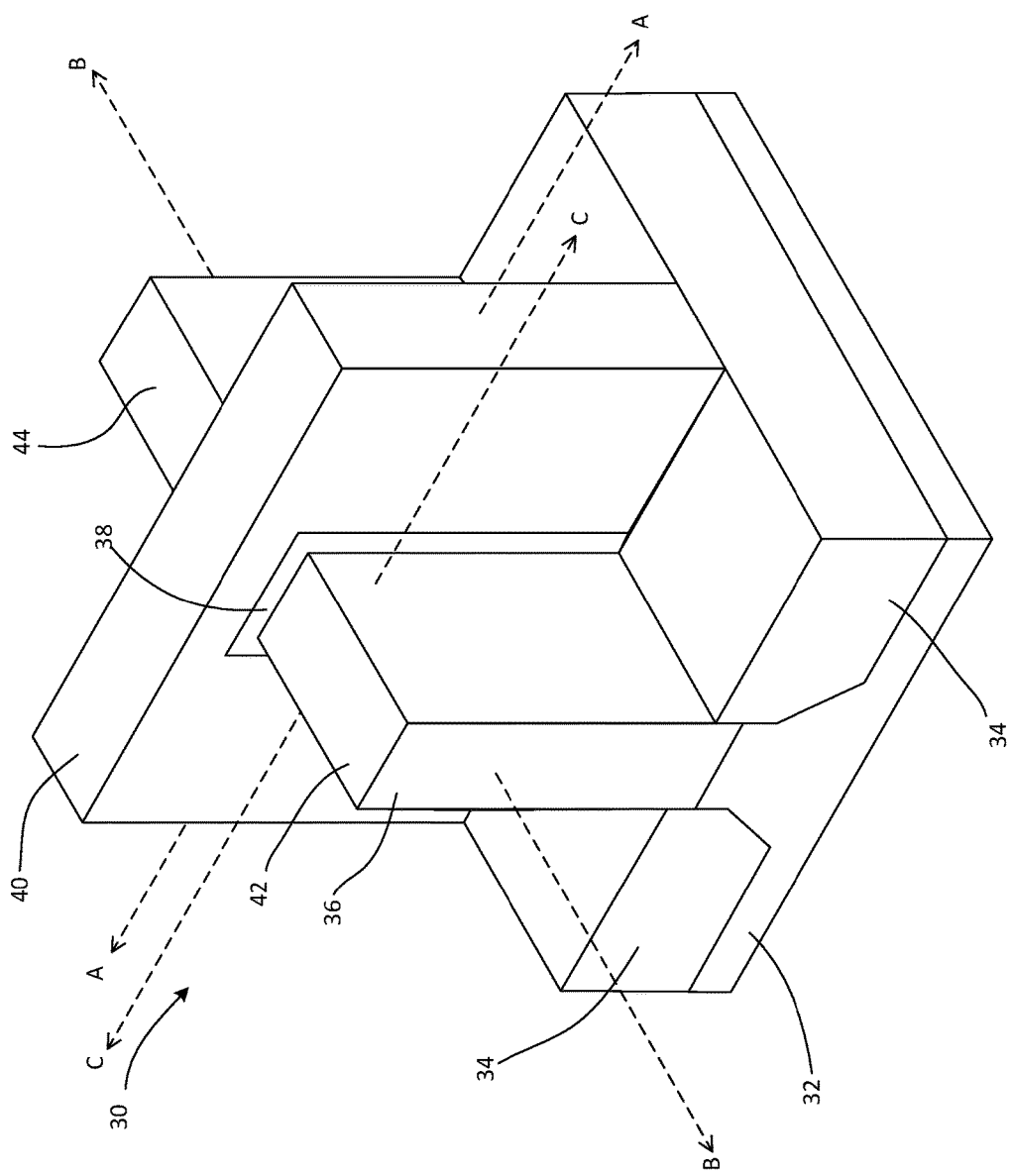
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments discussed herein allow for forming source/drain regions of a FinFET device, such that dopant concentration is increased in a recess interface of the source/drain region to reduce sheet resistance and increase carrier mobility. Various embodiments presented herein are discussed in the context of FinFETs formed using a gate-last process. In other embodiments, a gate-first process may be used. Also, some embodiments contemplate aspects used in planar devices, such as planar FETs.

FIG. 1 illustrates an example of a fin field-effect transistor (FinFET) 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in subsequent figures. Cross-section A-A is across a channel, gate dielectric 38, and gate electrode 40 of the FinFET 30. Cross-section C-C is in a plane that is parallel to cross section A-A and is across fin 36 outside of the channel. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2A through 26A-C are cross-sectional views of intermediate stages in the manufacturing of FinFETs in accordance with some embodiment. In FIGS. 2A through 26A-C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some instances, cross-section illustrations are omitted at certain steps, for example, if the omitted cross-section is not specifically discussed.

Figure 2A:
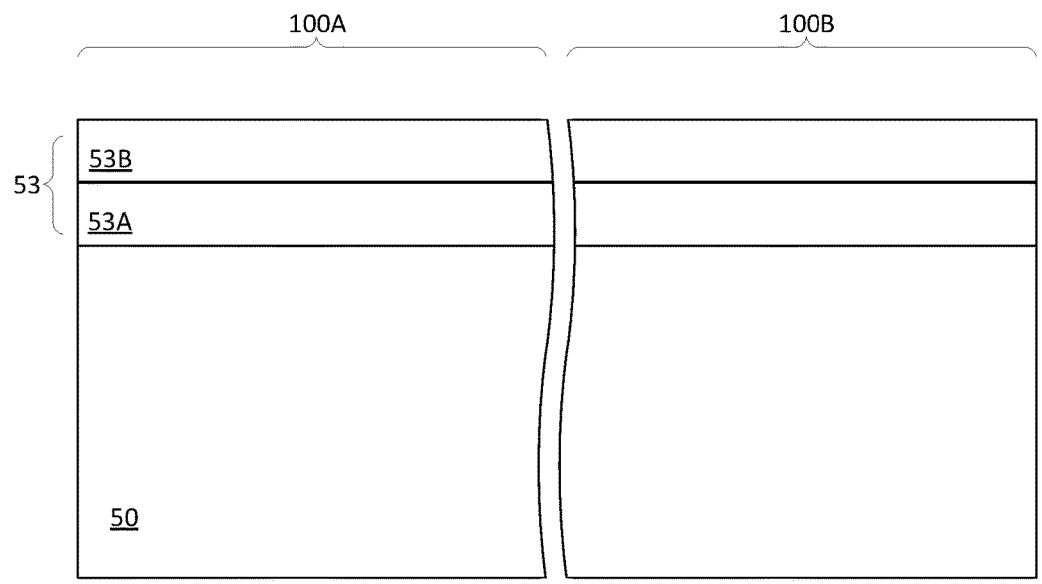

FIG. 2A illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 50 to generate the structural and functional requirements of the design for the resulting FinFETs. The integrated circuit devices may be formed using any suitable methods.

In some embodiments, the substrate 50 may comprise a first region 100A and a second region 100B. The first region 100A can be for forming n-type devices, such as n-type metal oxide semiconductor (NMOS) transistors, such as n-type FinFETs. The second region 100B can be for forming p-type devices, such as p-type metal oxide semiconductor (PMOS) transistors, such as p-type FinFETs. Accordingly, the first region 100A may be also referred to as an NMOS region 100A, and the second region 100B may be also referred to as a PMOS region 100B.

FIG. 2A further illustrates the formation of a mask 53 over the substrate 50. In some embodiments, the mask 53 may be used in a subsequent etching step to pattern the substrate 50 (See FIG. 3A). As shown in FIG. 2A, the mask 53 may include a first mask layer 53A and a second mask layer 53B. The first mask layer 53A may be a hard mask layer. In some embodiments, the first mask layer 53A may comprise silicon nitride, silicon oxynitride, silicon carbide, silicon carbonitride, a combination thereof, or the like, and may be formed using any suitable process, such as atomic layer deposition (ALD), physical vapor deposition (PVD), chemical vapor deposition (CVD), a combination thereof, or the like. The first mask layer 53A may be used to prevent or minimize etching of the substrate 50 underlying the first mask layer 53A in the subsequent etch step (See FIG. 3A). The second mask layer 53B may comprise photoresist, and in some embodiments, may be used to pattern the first mask layer 53A for use in the subsequent etching step discussed above. The second mask layer 53B may be formed by using a spin-on technique and may be patterned using acceptable photolithography techniques. In some embodiments, the mask 53 may comprise three or more mask layers.

Figure 3A:
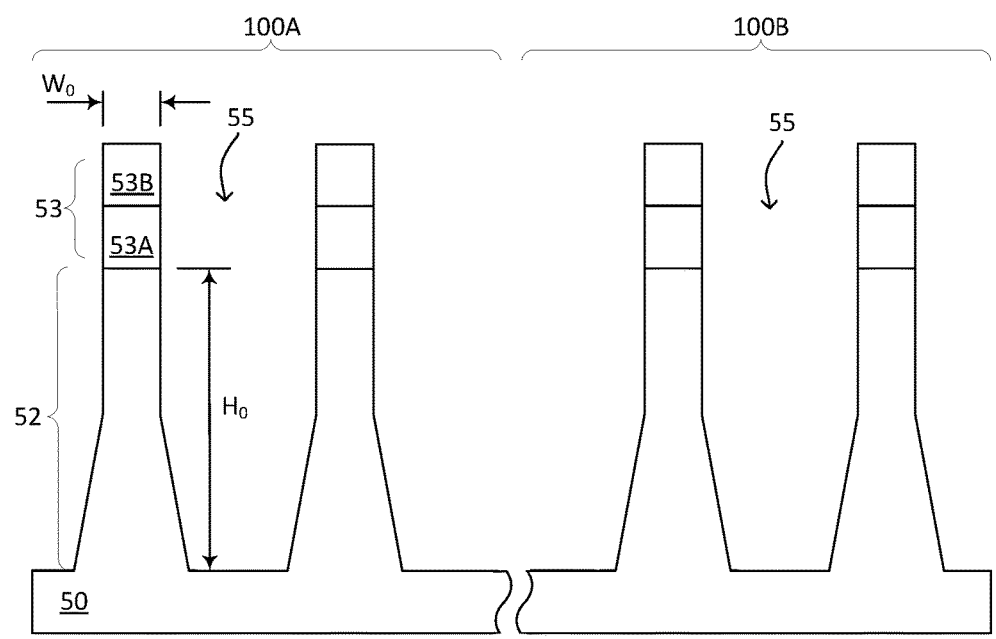

FIG. 3A illustrates the formation of semiconductor strips 52 in the substrate 50. First, the mask layers 53A and 53B may be patterned, where openings in the mask layers 53A and 53B expose areas of the substrate 50 where trenches 55 will be formed. Next, an etching process may be performed, where the etching process creates the trenches 55 in the substrate 50 through the openings in the mask 53. The remaining portions of the substrate 50 underlying a patterned mask 53 form a plurality of semiconductor strips 52. The etching may be any acceptable etch process, such as a reactive ion etch (RIE), neutral beam etch (NBE), the like, or a combination thereof. The etch process may be anisotropic. In some embodiments, the semiconductor strips 52 may have a height $H_0$ between about 50 nm and about 60 nm, and a width $W_0$ between about 6 nm and about 8 nm.

Figure 4A:
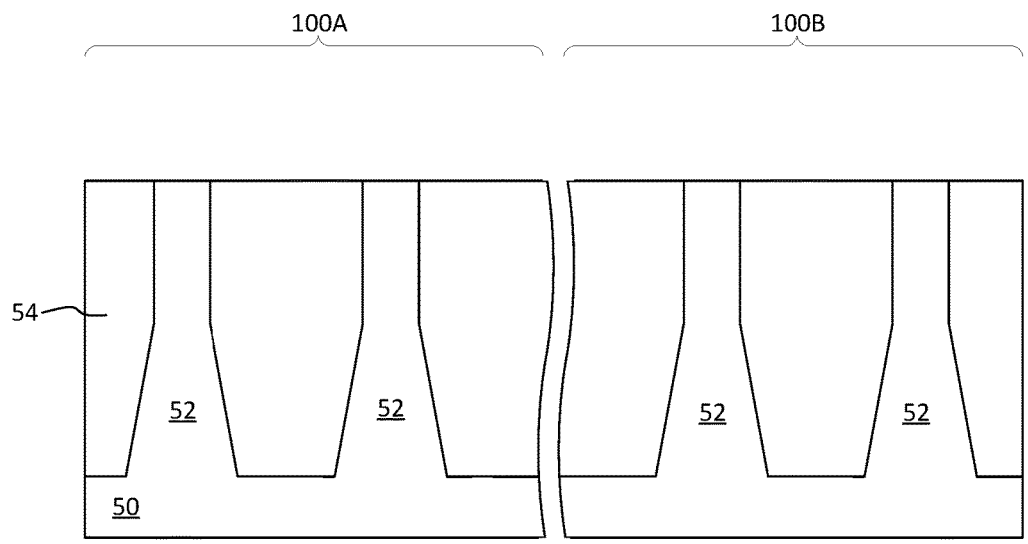

FIG. 4A illustrates the formation of an insulation material in the trenches 55 (see FIG. 3A) between neighboring semiconductor strips 52 to form isolation regions 54. The insulation material may be an oxide, such as silicon oxide, a nitride, such as silicon nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable processes may be also used.

Furthermore, in some embodiments, the isolation regions 54 may include a liner (not illustrated) formed on sidewalls and a bottom surface of the trenches 55 (see FIG. 3A) prior to the filling of the trenches 55 with an insulation material of the isolation regions 54. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, or the like. The formation of the liner may include any suitable method, such as ALD, CVD, HDP-CVD, PVD, a combination thereof, or the like. In some embodiments, the formation of the liner may result in a conformally deposited layer with horizontal portions and vertical (or non-horizontal) portions having substantially the same thickness, for example, with the vertical thickness of the vertical portions of the liner and the horizontal thickness of the horizontal portions of the liner having a difference smaller than 20 percent. In such embodiments, the liner may prevent (or at least reduce) the diffusion of the semiconductor material from the semiconductor strips 52 (e.g., Si and/or Ge) into the surrounding isolation regions 54 during the subsequent annealing of the isolation regions 54. For example, after the insulation material of the isolation regions 54 are deposited, an annealing process may be performed on the insulation material of the isolation regions 54.

Referring further to FIG. 4A, a planarization process, such as a chemical mechanical polishing (CMP), may remove any excess insulation material of the isolation regions 54, such that top surfaces of the isolation regions 54 and top surfaces of the semiconductor strips 52 are coplanar (within process variations). In some embodiments, the CMP may also remove the mask 53. In other embodiments, the mask 53 may be removed using a wet cleaning process separate from the CMP.

Figure 5A:
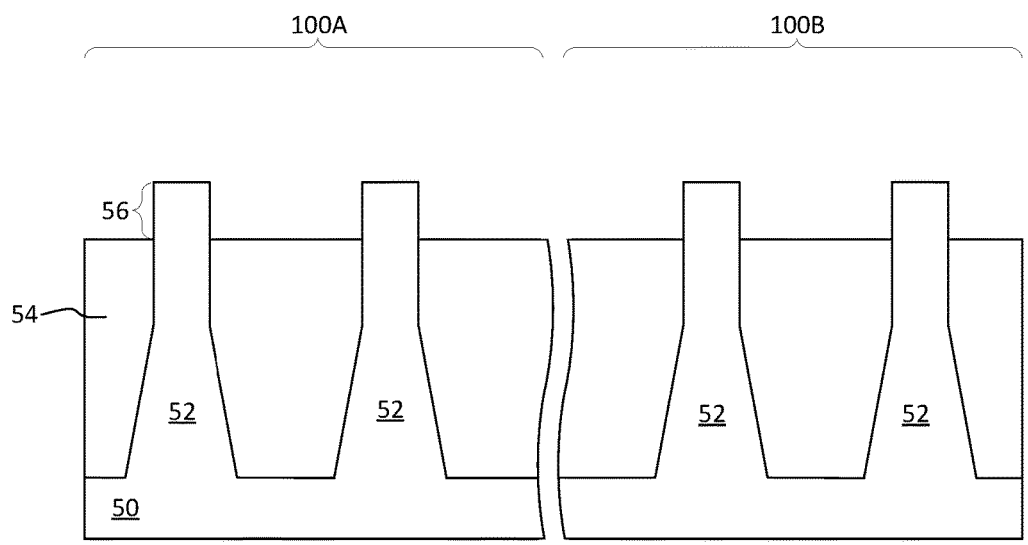

FIG. 5A illustrates the recessing of the isolation regions 54 to form Shallow Trench Isolation (STI) regions 54. The isolation regions 54 are recessed such that fins 56 in the first region 100A and in the second region 100B protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. For example, a chemical oxide removal using a CERTAS® etch, an Applied Materials SICONI tool, or dilute hydrofluoric (dHF) acid may be used.

The process described with respect to FIGS. 2A through 5A is just one example of how the fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 52 in FIG. 4A can be recessed, and a material different from the semiconductor strips 52 may be epitaxially grown in their place. In even further embodiments, a dielectric layer can be formed over a top surface of the substrate 50; trenches can be etched through the dielectric layer; heteroepitaxial structures can be epitaxially grown in the trenches using a material different from the substrate 50o; and the dielectric layer can be recessed such that the heteroepitaxial structures protrude from the dielectric layer to form fins 56. In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. Still further, it may be advantageous to epitaxially grow a material in the NMOS region 100A different from the material in the PMOS region 100B. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
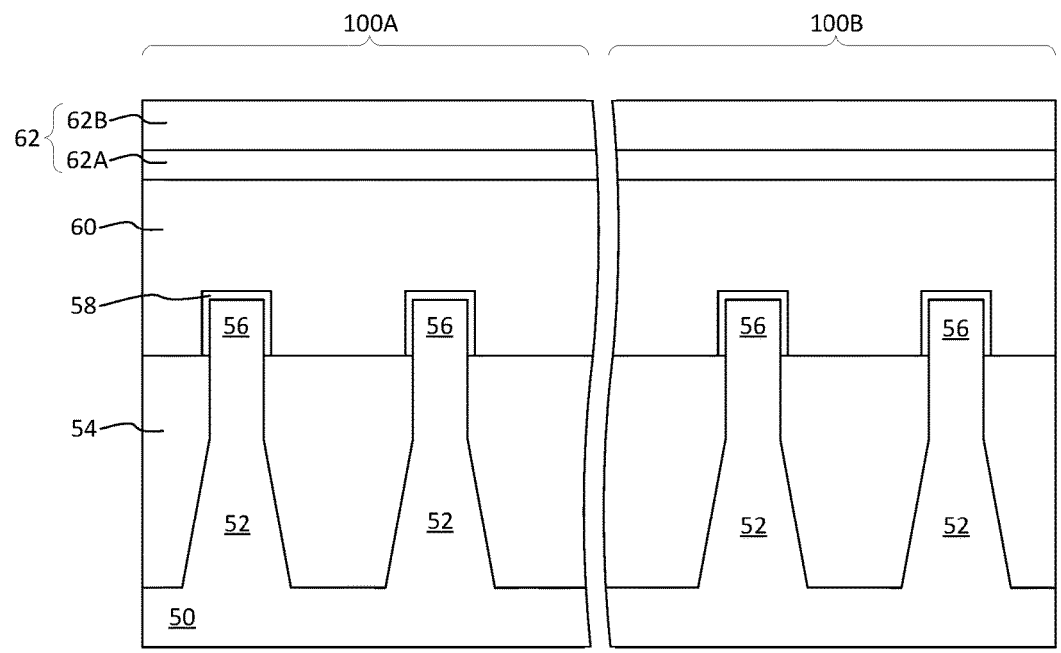
Figure 6B:
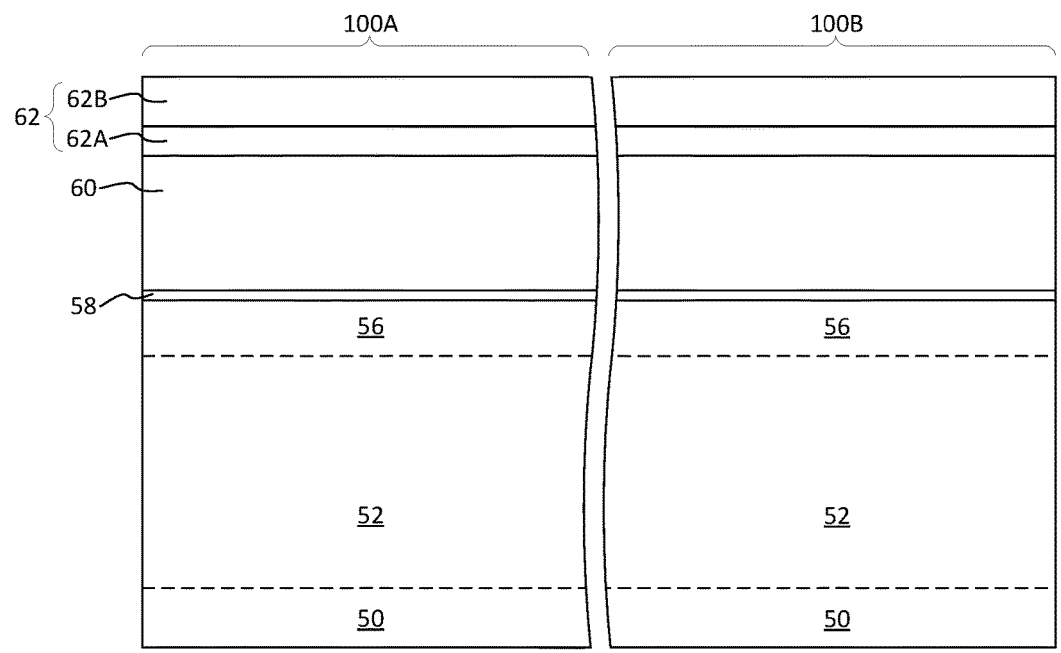

In FIGS. 6A and 6B, a dummy dielectric layer 58 is formed on the fins 56. The dummy dielectric layer 58 may be, for example, silicon oxide, silicon nitride, a combination thereof, or the like, and may be deposited (using, for example, CVD, PVD, a combination thereof, or the like) or thermally grown (for example, using thermal oxidation, or the like) according to acceptable techniques. A dummy gate layer 60 is formed over the dummy dielectric layer 58, and a mask 62 is formed over the dummy gate layer 60. In some embodiments, the dummy gate layer 60 may be deposited over the dummy dielectric layer 58 and then planarized using, for example, a CMP process. The mask 62 may be deposited over the dummy gate layer 60. The dummy gate layer 60 may be made of, for example, polysilicon, although other materials that have a high etching selectivity with respect to the material of the isolation regions 54 may also be used. The mask 62 may include one or more layers of, for example, silicon nitride, silicon oxynitride, silicon carbide, silicon carbonitride, the like, or a combination thereof. In an embodiment, the mask 62 comprises a first mask layer 62A formed of silicon nitride and a second mask layer 62B formed of silicon oxide. In some embodiments, the first mask layer 62A may have a thickness between about 18 nm and about 22 nm, and the second mask layer 62B may have a thickness between about 50 nm and about 90 nm. In some embodiments, the dummy dielectric layer 58 may have a thickness between about 11 nm and about 15 nm, and the dummy gate layer 600 may have a thickness between about 50 nm and about 80 nm. In some embodiments, the dummy dielectric layer 58 may be omitted.

Referring further to FIGS. 6A and 6B, in the illustrated embodiment, a single dummy dielectric layer 58, a single dummy gate layer 60, and a single mask 62 are formed across the first region 100A and the second region 100B. In other embodiments, separate dummy dielectric layers, separate dummy gate layers, and separate masks may be formed in the first region 100A and the second region 100B.

Referring further to FIGS. 6A and 6B, appropriate doped wells (not shown) may be formed in the fins 56, the semiconductor strips 52, and/or the substrate 50. Wells may be formed before or after the dummy gates 70 and 76 (described below with respect to FIGS. 7A, 7B, and 7C) are formed. In embodiments where wells are formed prior to the formation of the dummy gates 70 and 76, for example, wells may be formed prior to the formation of the dummy dielectric layer 58. For example, a P-well may be formed in the first region 100A, and an N-well may be formed in the second region 100B. The different implant steps for the different regions 100A and 100B may be achieved using a photoresist or other masks (not shown). For example, a photoresist is formed over the fins 56 and the isolation regions 54 in the first region 100A and the second region 100B. The photoresist is patterned to expose the second region 100B of the substrate 50, such as a PMOS region, while protecting the first region 100A, such as an NMOS region. The photoresist can be formed by using a spin-on technique and can be patterned using acceptable photolithography techniques. Once the photoresist is patterned, n-type impurities are implanted in the second region 100B, and the photoresist may act as a mask to substantially prevent n-type impurities from being implanted into the first region 100A. The n-type impurities may be phosphorus, arsenic, or the like, and may be implanted in the second region 100B to a concentration of equal to or less than $10^{18}$ $cm^{-3}$, such as in a range from about $10^{17}$ $cm^{-3}$ to about $10^{18}$ $cm^{-3}$. After the implantation process, the photoresist is removed using, for example, an acceptable ashing process followed by a wet cleaning process.

Following the implanting of the second region 100B, a second photoresist (not shown) is formed over the fins 56 and the isolation regions 54 in the first region 100A and the second region 100B. The second photoresist is patterned to expose the first region 100A of the substrate 50, while protecting the second region 100B. The second photoresist can be formed by using a spin-on technique and can be patterned using acceptable photolithography techniques. Once the second photoresist is patterned, p-type impurities are implanted in the first region 100A, and the second photoresist may act as a mask to substantially prevent p-type impurities from being implanted into the second region 100B. The p-type impurities may be boron, $BF_2$, or the like, and may be implanted in the first region 100A to a concentration of equal to or less than $10^{18}$ $cm^{-3}$, such as in a range from about $10^{17}$ $cm^{-3}$ to about $10^{18}$ $cm^{-3}$. After the implantation process, the second photoresist is removed using, for example, an acceptable ashing process followed by a wet cleaning process.

After implanting appropriate impurities in first region 100A and the second region 100B, an anneal may be performed to activate the p-type and n-type impurities that were implanted. The implantation process may form a P-well in the first region 100A, and an N-well in the second region 100B. In some embodiments where the fins are epitaxial grown, the grown materials of the fins 56 may be in situ doped during the growth process.

Figure 7A:
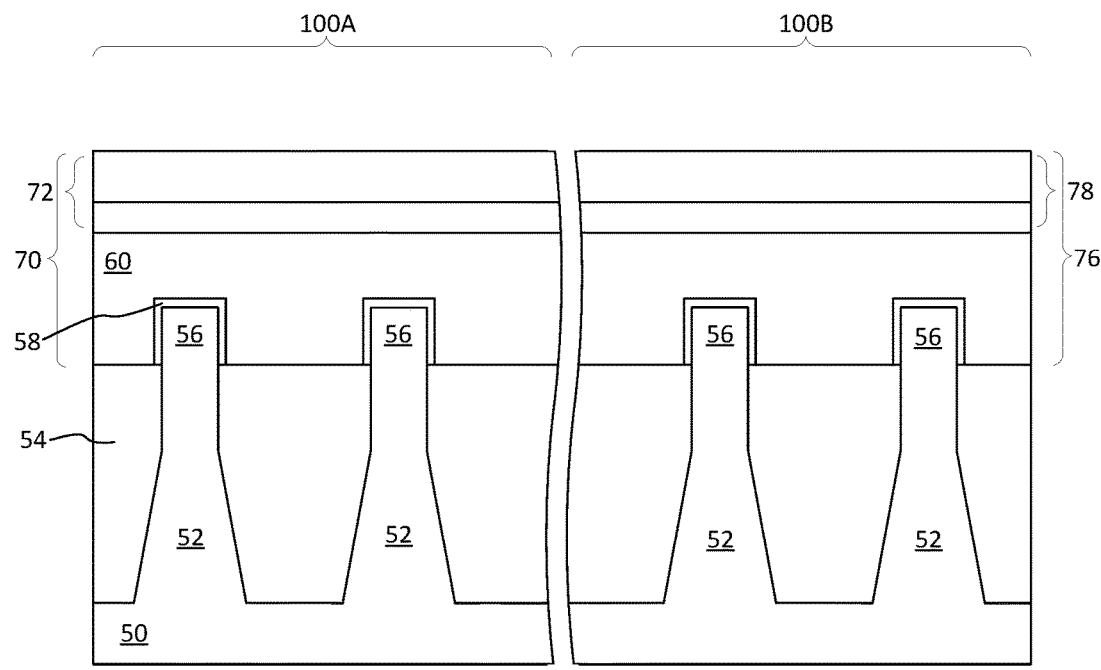
Figure 7B:
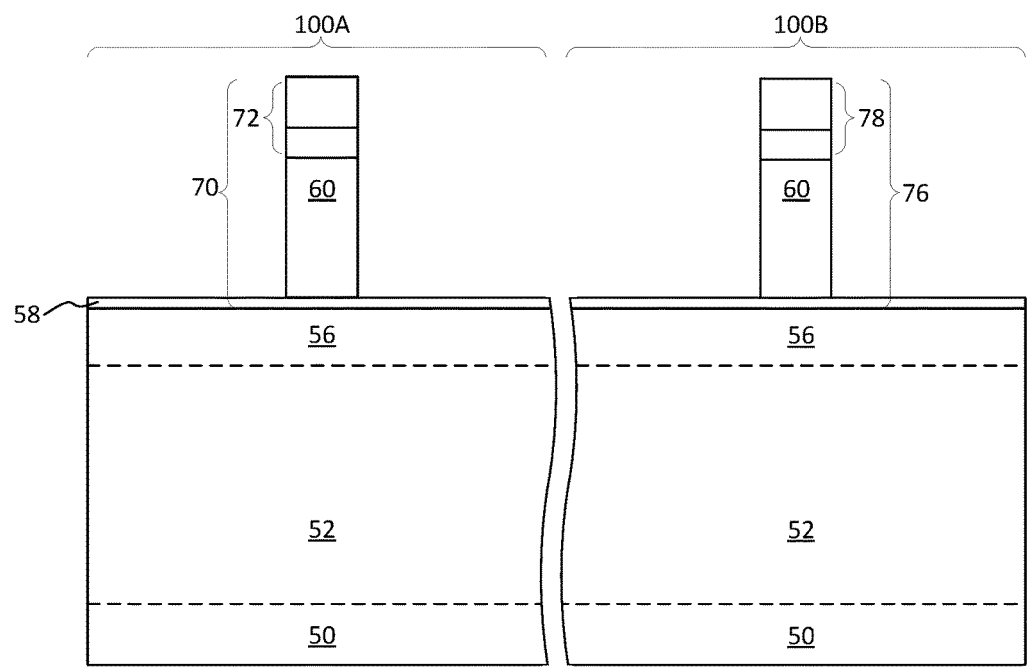
Figure 7C:
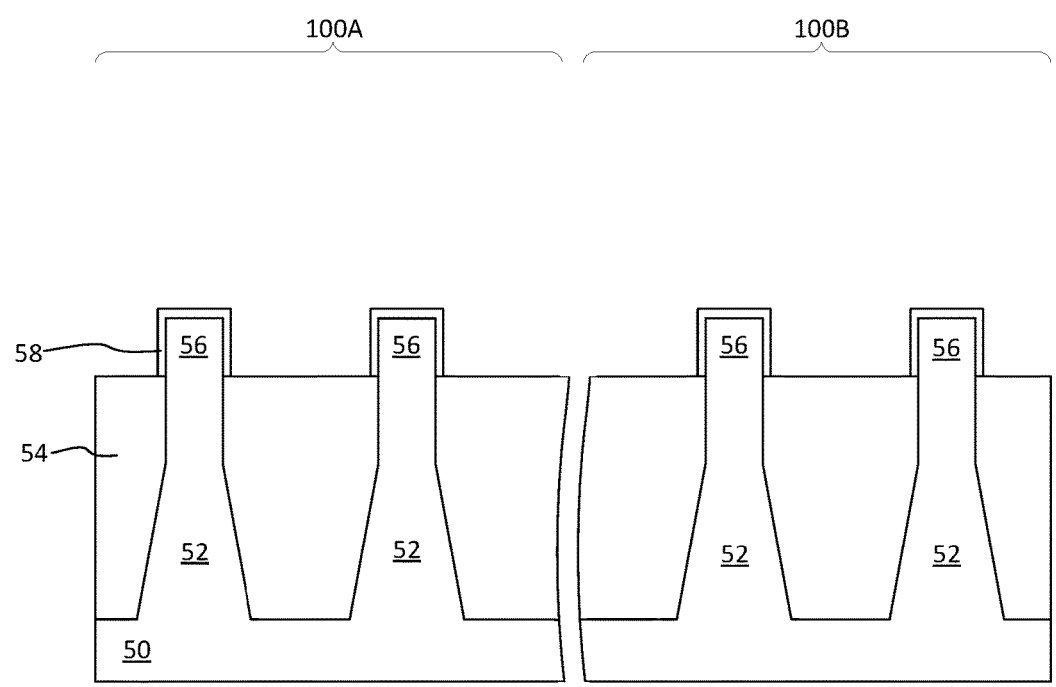

In FIGS. 7A, 7B, and 7C, the mask 62 (see FIGS. 6A and 6B) may be patterned using acceptable photolithography and etching techniques to form a mask 72 in the first region 100A and a mask 78 in the second region 100B. The pattern of the masks 72 and 78 then may be transferred to the dummy gate layer 60 by an acceptable etching technique to form dummy gates 70 in the first region 100A and dummy gates 76 in the second region 100B. Optionally, the pattern of the masks 72 and 78 may similarly be transferred to dummy dielectric layer 58. The pattern of the dummy gates 70 and 76 cover respective channel regions of the fins 56 while exposing source/drain regions of the fins 56. The dummy gates 70 and 76 may also have a lengthwise direction substantially perpendicular to the lengthwise direction of respective fins 56. A size of the dummy gates 70 and 76, and a pitch between dummy gates 70 and 76, may depend on a region of a die in which the dummy gates are formed. In some embodiments, dummy gates 70 and 76 may have a larger size and a larger pitch when located in an input/output region of a die (e.g., where input/output circuitry is disposed) than when located in a logic region of a die (e.g., where logic circuitry is disposed). In some embodiments, the dummy gates 70 may have a height between about 135 nm and about 175 nm, and the dummy gates 76 may have a width between about 15 nm and about 27 nm.

Figure 8A:
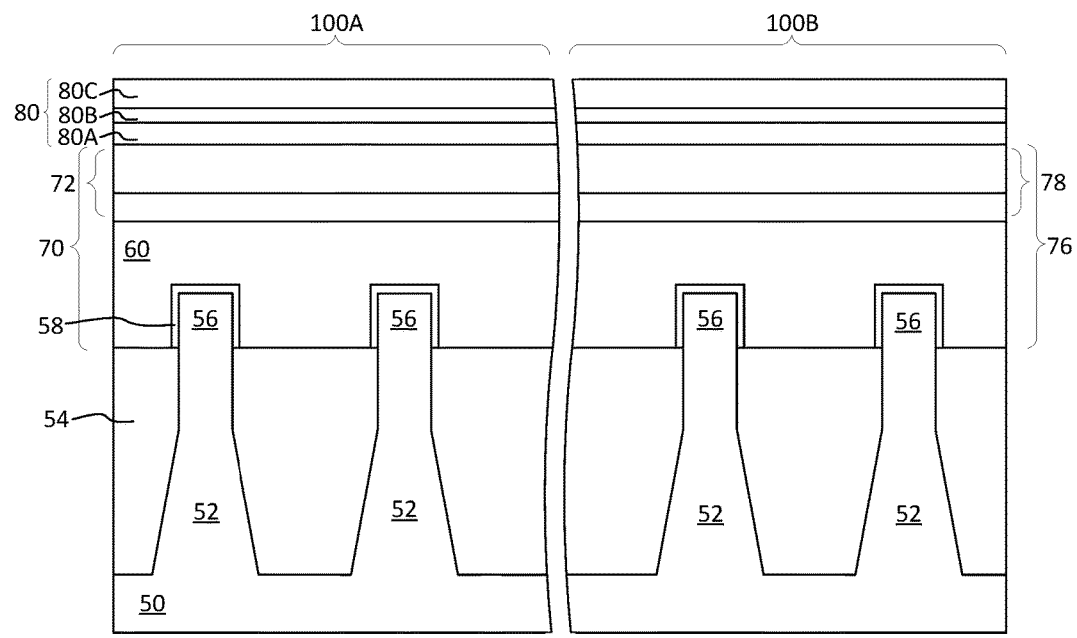
Figure 8B:
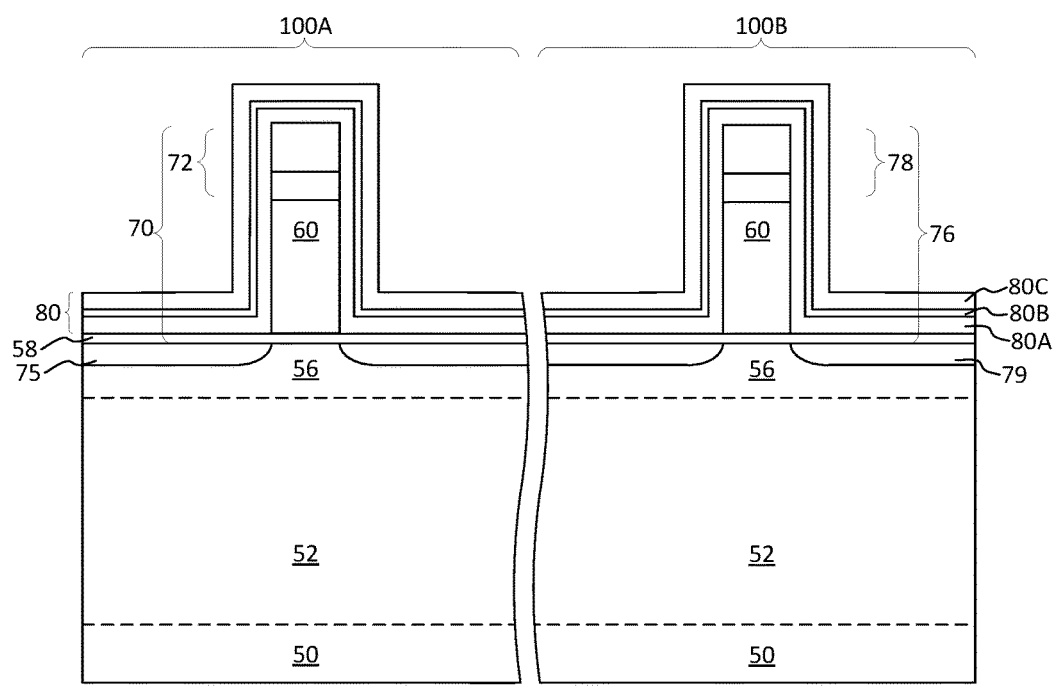
Figure 8C:
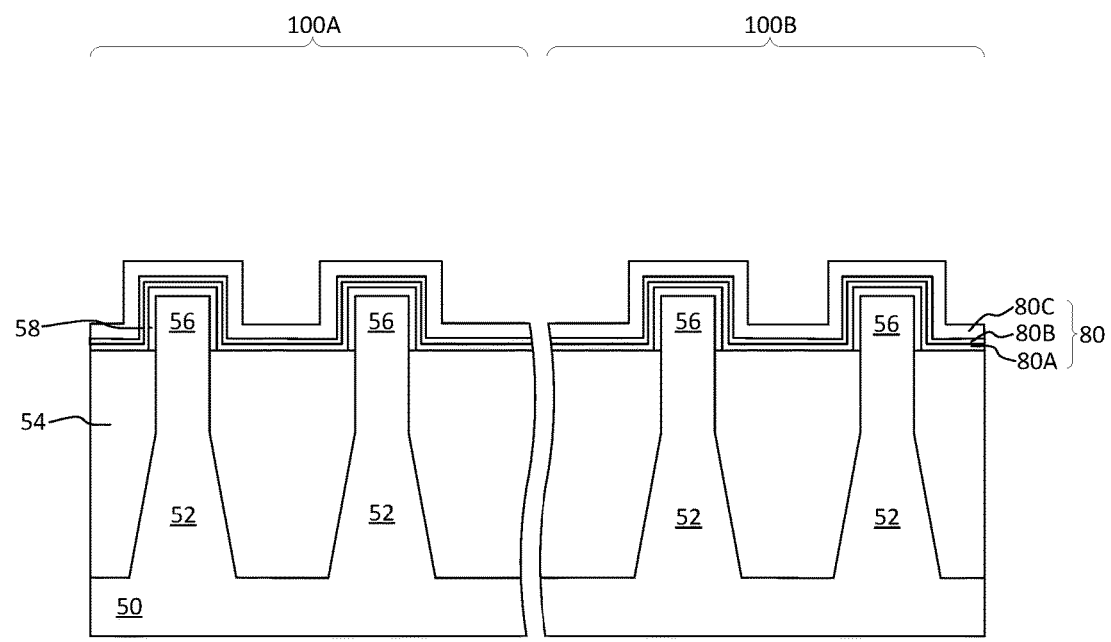

In FIGS. 8A, 8B, and 8C, a gate spacer layer 80 is formed on exposed surfaces of the dummy gates 70 and 76 (see FIGS. 8A and 8B) and/or the dummy dielectric layer 58 over the fins 56 (see FIG. 8C). Any suitable methods of forming the gate spacer layer 80 may be used. In some embodiments, a deposition (such as CVD, ALD, or the like) may be used form the gate spacer layer 80. In some embodiments, the gate spacer layer 80 may include one or more layers of, for example, silicon nitride (SiN), silicon oxynitride, silicon carbonitride, silicon oxycarbonitride (SiOCN), a combination thereof, or the like. In some embodiments, the gate spacer layer 80 may comprise a first gate spacer layer 80A, a second gate spacer layer 80B over the first gate spacer layer 80A, and a third gate spacer layer 80C of the second gate spacer layer 80B. In an embodiment, the first gate spacer layer 80A comprises SiOCN, the second gate spacer layer 80B comprises SiOCN, and the third gate spacer layer 80C comprises SiN. In some embodiment, the first gate spacer layer 80A has a thickness between about 3 nm and about 5 nm, the second gate spacer layer 80B has a thickness between about 3 nm and about 5 nm, and the third gate spacer layer 80C has a thickness between about 4 nm and about 6 nm.

Referring further to FIGS. 8A, 8B, and 8C, after forming the first spacer layer 80A, lightly doped source/drain (LDD) regions 75 and 79 may be formed in the substrate 50 in the first region 100A and the second region 100B, respectively. Similar to the implantation process discussed above with reference to FIGS. 7A, 7B and 7C, a mask (not shown), such as a photoresist, may be formed over the first region 100A, e.g., the NMOS region, while exposing the second region 100B, e.g., the PMOS region, and p-type impurities may be implanted into the exposed fins 56 in the second region 100B to create LDD regions 79. During the implantation of the LDD regions 79, the dummy gate 76 may act as a mask to prevent (or at least reduce) dopants from implanting into a channel region of the exposed fins 56. Thus, the LDD regions 79 may be formed substantially in source/drain regions of the exposed fins 56. The mask may then be removed. Subsequently, a second mask (not shown), such as a photoresist, may be formed over the second region 100B, while exposing the first region 100A, and n-type impurities may be implanted into the exposed fins 56 in the first region 100A to create LDD regions 75. During the implantation of the LDD regions 75, the dummy gate 70 may act as a mask to prevent (or at least reduce) dopants from implanting into a channel region of the exposed fins 56. Thus, the LDD regions 75 may be formed substantially in source/drain regions of the exposed fins 56. The second mask may then be removed. The n-type impurities may be any of the n-type impurities previously discussed, and the p-type impurities may be any of the p-type impurities previously discussed. The LDD regions 75 and 79 may each have a concentration of impurities from about $10^{15}$ cm$^{-3}$ to about $10^{16}$ cm$^{-3}$. An annealing process may be performed to activate the implanted impurities.

Figure 9A:
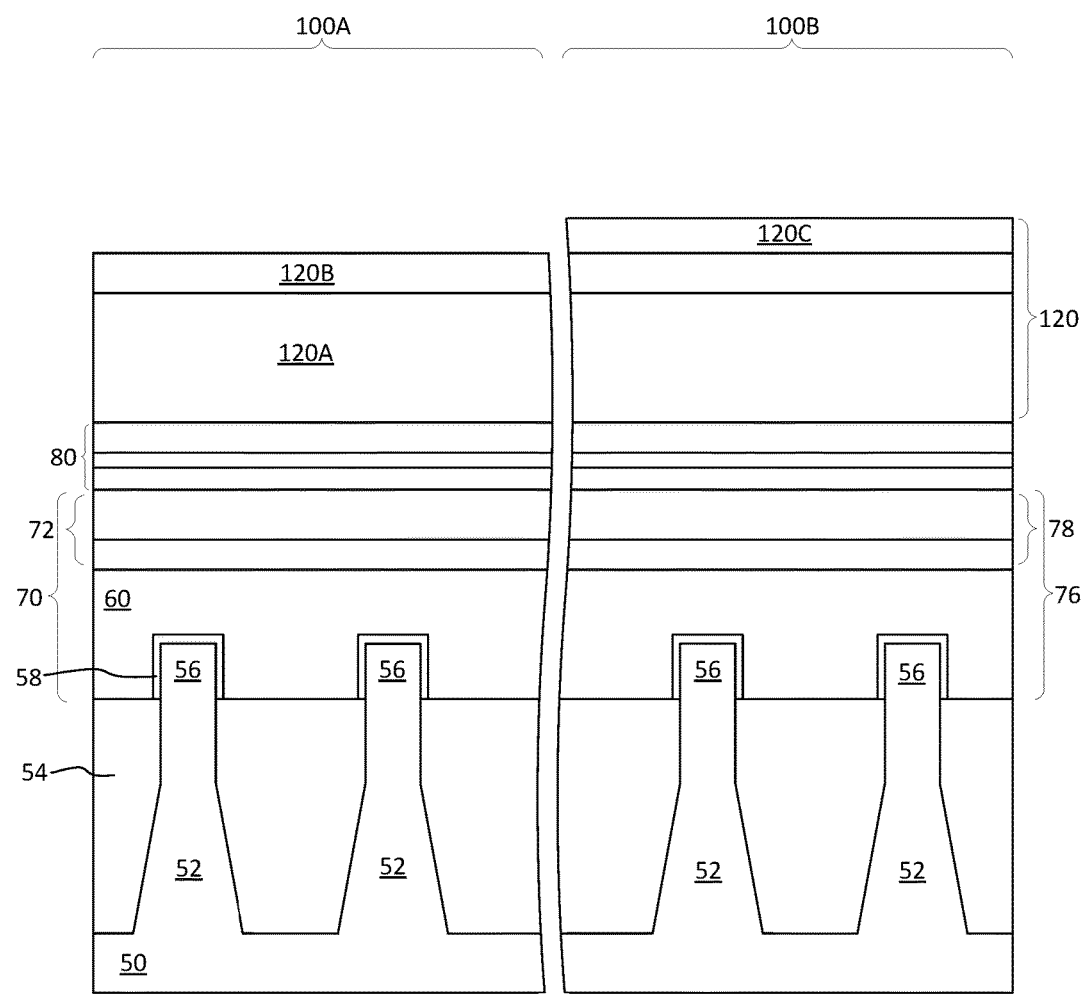
Figure 9B:
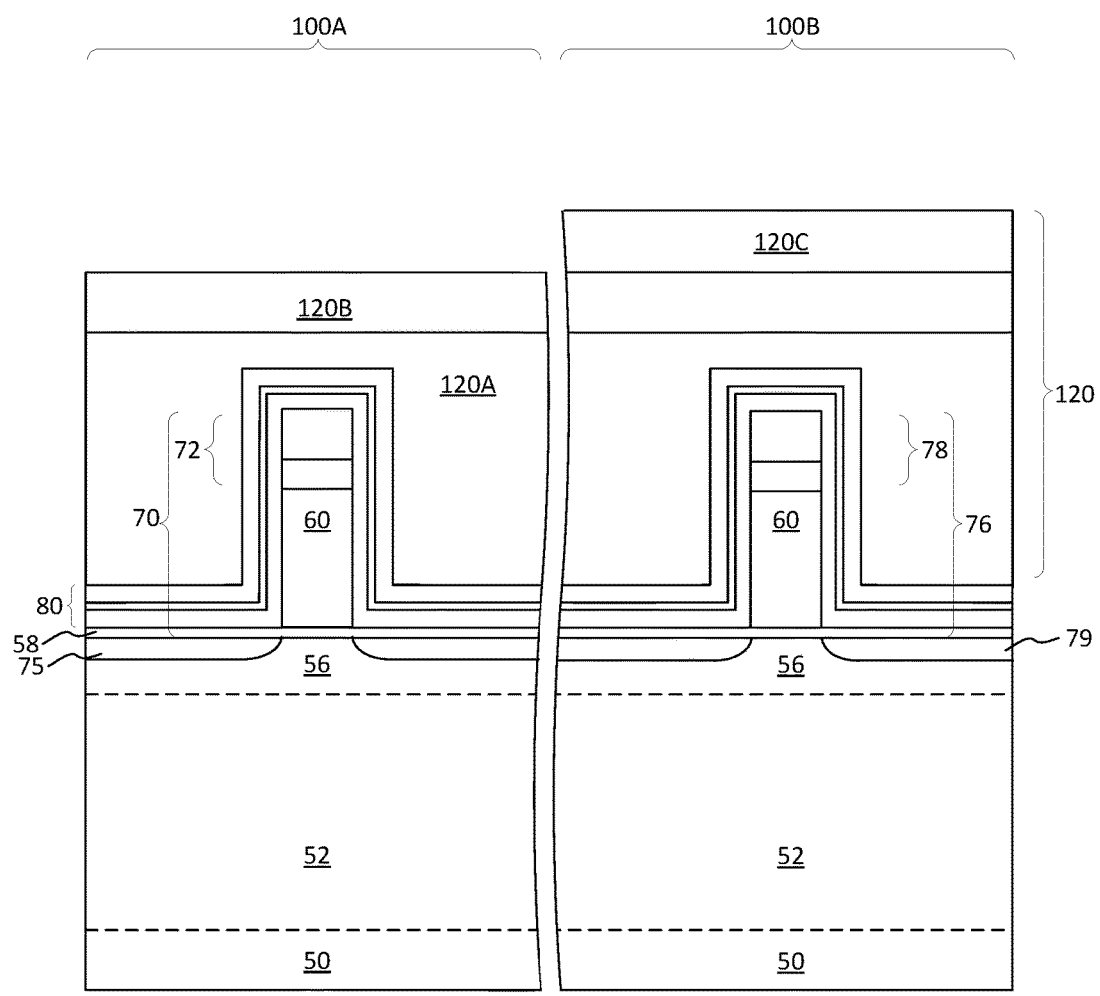
Figure 9C:
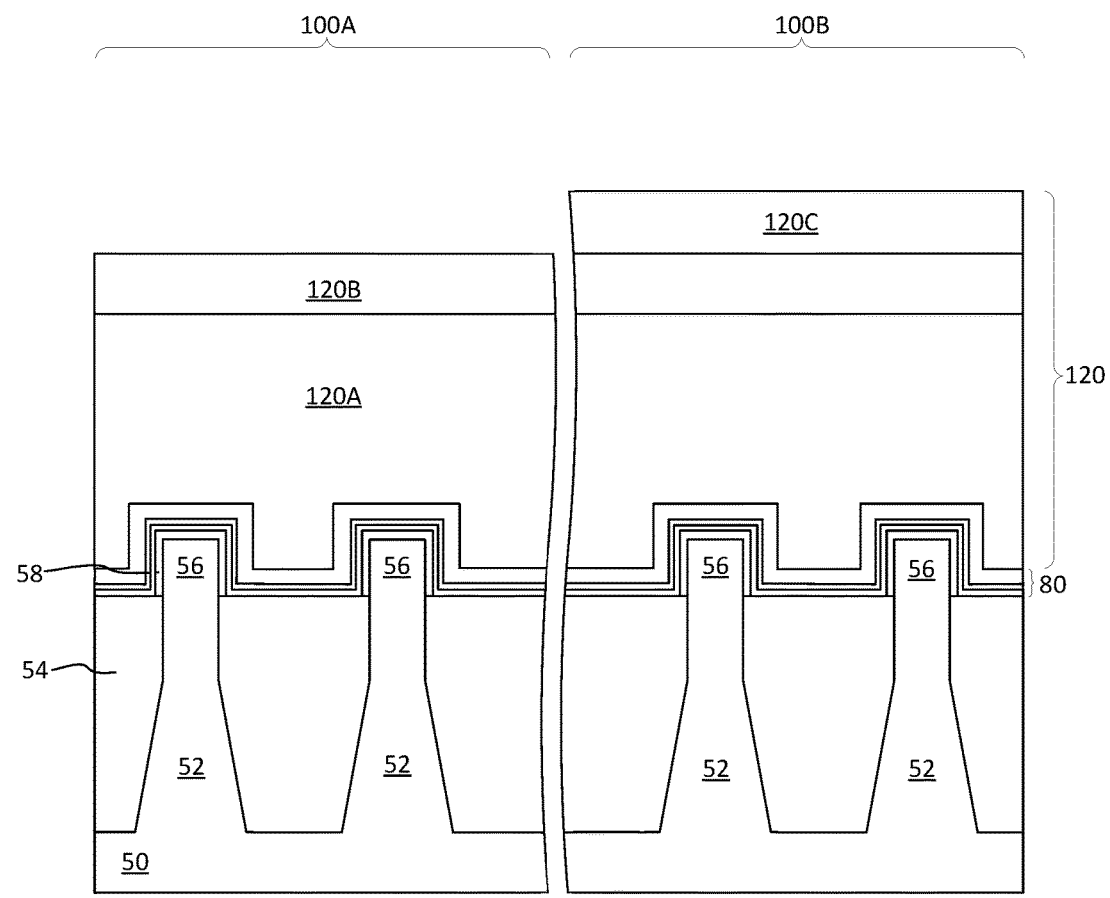

Referring to FIGS. 9A, 9B, 9C, 10A, 10B, and 10C, a patterning process is performed to remove excess portions of the spacer layer 80 in the first region 100A. Any acceptable patterning process may be used. Referring first to FIGS. 9A, 9B, and 9C, in some embodiments, a tri-layer mask 120 is formed over the first region 100A and the second region 100B. The tri-layer mask 120 comprises a bottom layer 120A, a middle layer 120B over the bottom layer 120A, and a top layer 120C over the middle layer 120B. In some embodiments, the bottom layer 120A may comprise an organic material, such as a spin-on carbon (SOC) material, or the like, and may be formed using spin-on coating, CVD, ALD, or the like. The middle layer 120B may comprise an inorganic material, which may be a nitride (such as SiN, TiN, TaN, or the like), an oxynitride (such as SiON), an oxide (such as silicon oxide), or the like, and may be formed using CVD, ALD, or the like. The top layer 120C may comprise an organic material, such as a photoresist material, and may be formed using a spin-on coating, or the like. In some embodiments, the top layer 120C of the tri-layer mask 120 is patterned to expose the first region 100A. The top layer 120C may be patterned using suitable photolithography techniques.

Figure 10A:
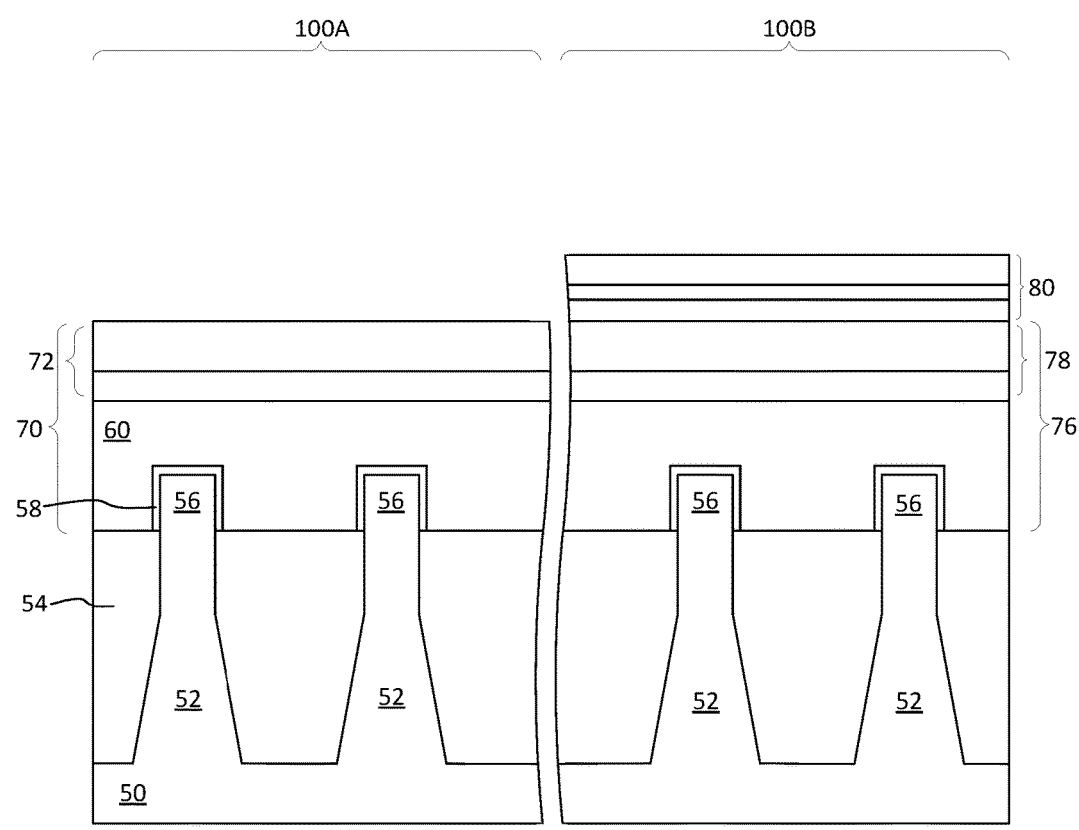
Figure 10B:
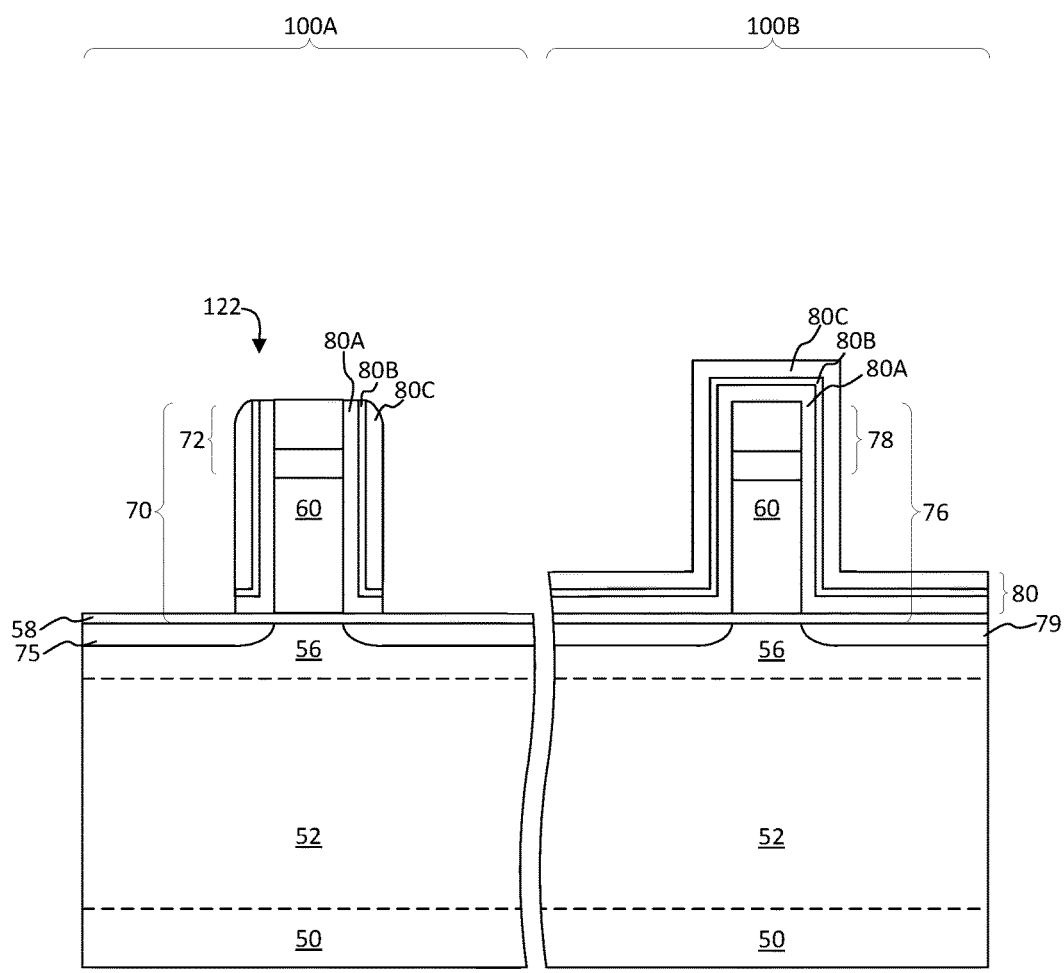
Figure 10C:
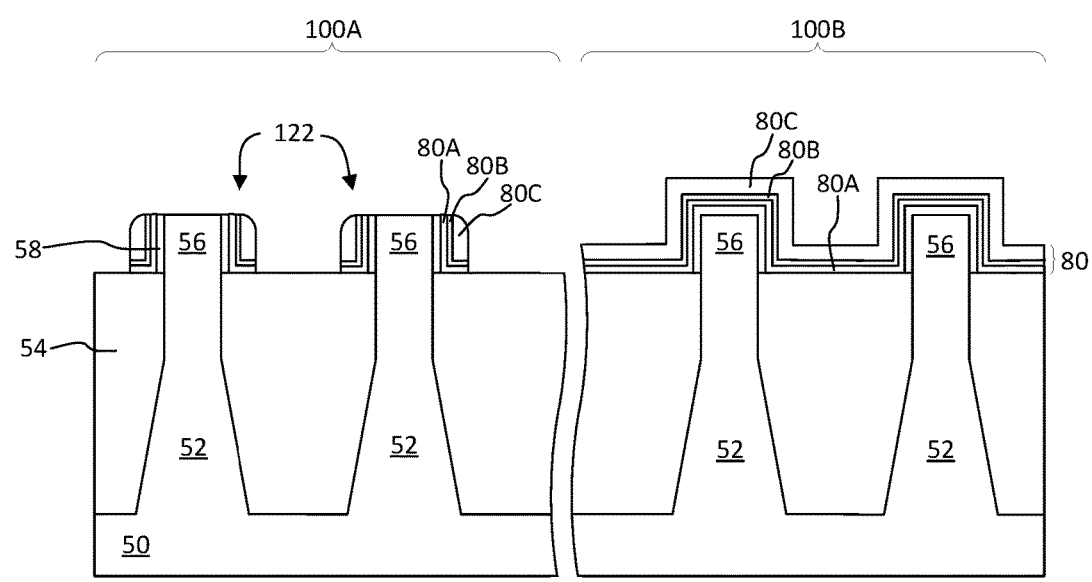

Referring to FIGS. 10A, 10B, and 10C, an etching process is performed using the patterned tri-layer mask 120 as a mask. The etching process may be anisotropic. After preforming the etching process, lateral portions of the first spacer layer 80A, the second spacer layer 80B, and the third spacer layer 80C over the LDD regions 75 and over the isolation regions 54 may be removed to expose top surfaces of the fins 56 and the masks 72 for the dummy gate stacks 70. Portions of the first spacer layer 80A, the second spacer layer 80B, and the third spacer layer 80C along sidewalls of the dummy gates 70 and the fins 56 may remain and form spacers 122. In other embodiments, the spacer layer 80 may also be removed from the sidewalls of the fins 56. After patterning the spacer layer 80, the tri-layer mask 120 may be removed using any suitable removal process.

FIGS. 11B through 21C illustrate the formation of epitaxial source/drain regions 82 and 84 in the first region 100A and the second region 100B. In some embodiments, the epitaxial source/drain regions 82 (see FIGS. 21B and 21C) in the first region 100A may be formed before the epitaxial source/drain regions 84 (see FIGS. 21B and 21C) are formed in the second region 100B. In other embodiments, the epitaxial source/drain regions 84 in the second region 100B may be formed before forming the epitaxial source/drain regions 82 in first region 100A.

FIGS. 11B through 14C illustrate the formation of the epitaxial source/drain regions 82 in the first region 100A. During the formation of the epitaxial source/drain regions 82 in first region 100A, e.g., the NMOS region, the second region 100B, e.g., the PMOS region may be masked (not shown).

Figure 11B:
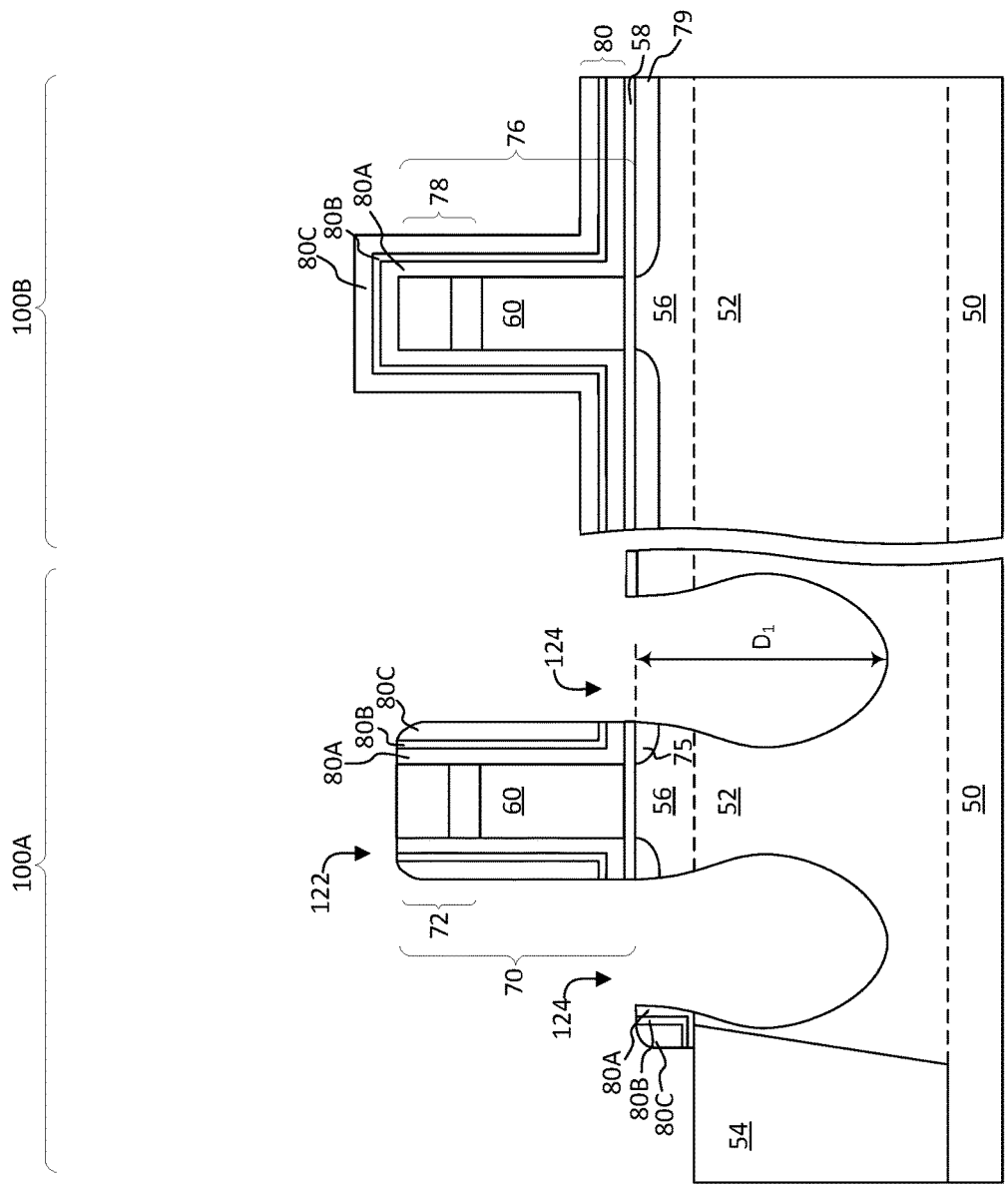
Figure 11C:
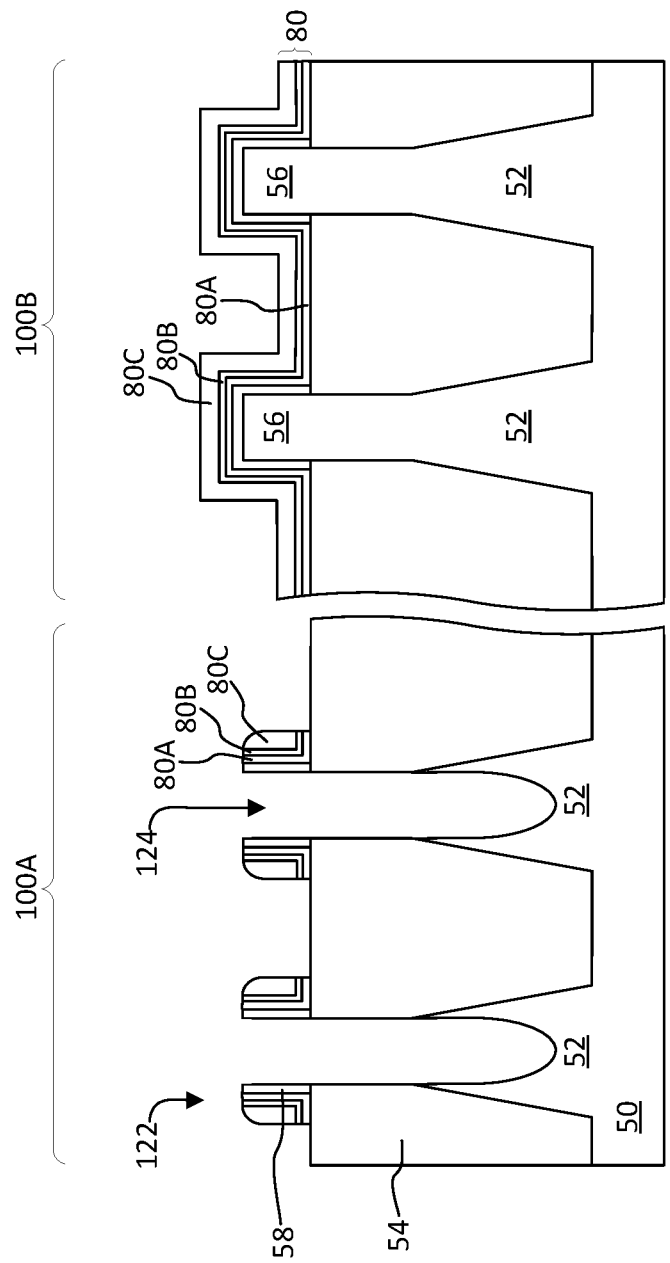

Referring to FIGS. 11B and 11C, a first patterning process is performed on the fins 56 to form recesses 124 in source/drain regions of the fins 56. The first patterning process may be performed in a manner such that the recesses 124 are formed between neighboring dummy gates 70 (in interior regions of the fins 56, see, e.g., FIG. 13D), or between an isolation region 54 and adjacent dummy gate 70 (in end regions of the fins 56, for example as shown in the cross section illustrated in FIG. 11B). In some embodiments, the first patterning process may include a suitable anisotropic dry etching process, while using the dummy gates 70, the spacers 122 and/or isolation regions 54 as a combined mask. The suitable anisotropic dry etching process may include a reactive ion etch (RIE), neutral beam etch (NBE), the like, or a combination thereof. In some embodiments where the RIE is used in the first patterning process, process parameters such as, for example, a process gas mixture, a voltage bias, and an RF power may be chosen such that etching is predominantly performed using physical etching, such as ion bombardment, rather than chemical etching, such as radical etching through chemical reactions. In some embodiments, a voltage bias may be increased to increase energy of ions used in the ion bombardment process and, thus, increase a rate of physical etching. Since, the physical etching in anisotropic in nature and the chemical etching is isotropic in nature, such an etching process has an etch rate in the vertical direction that is greater than an etch rate in the lateral direction. In some embodiments, the anisotropic etching process may be performed using a process gas mixture including $CH_3F$, $CH_4$, HBr, $O_2$, Ar, a combination thereof, or the like.

In some embodiments, the first patterning process forms recesses 124 having U-shaped bottom surfaces. The recesses 124 may also be referred to as U-shaped recesses 124. In some embodiments, the U-shaped recesses 124 have a depth $D_1$, as measured from a top surface of the fins 56, between about 45 nm and about 65 nm. As a result of the first patterning process, the recesses 124 may have rough surfaces. In some embodiments, the etching process for forming the U-shaped recesses 124 may also etch a top surface of isolation regions 54. The shape and profile of the U-shaped recesses 124 are further described below with respect to FIG. 13D, following a thermal diffusion process.

Figure 12B:
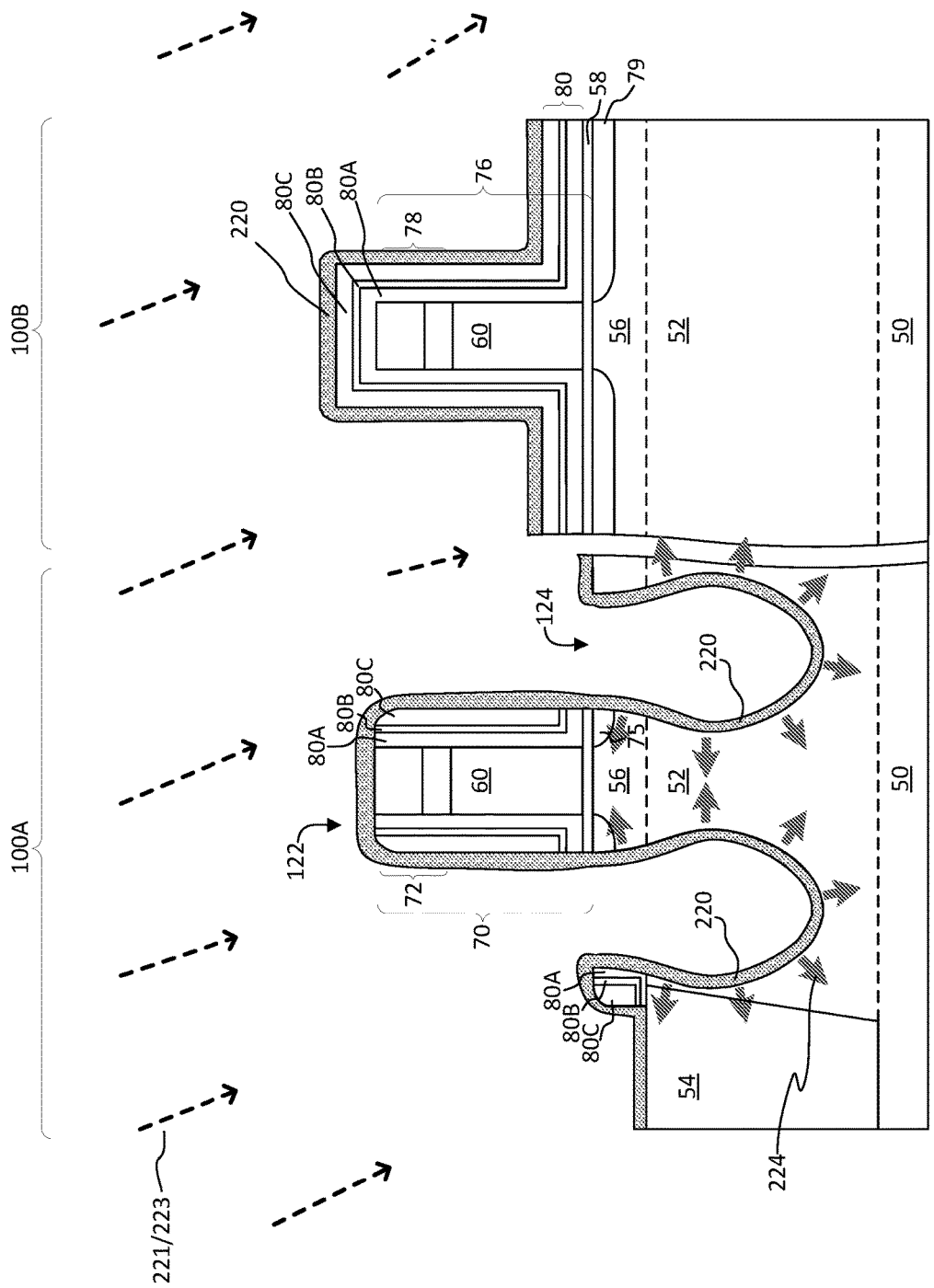
Figure 12C:
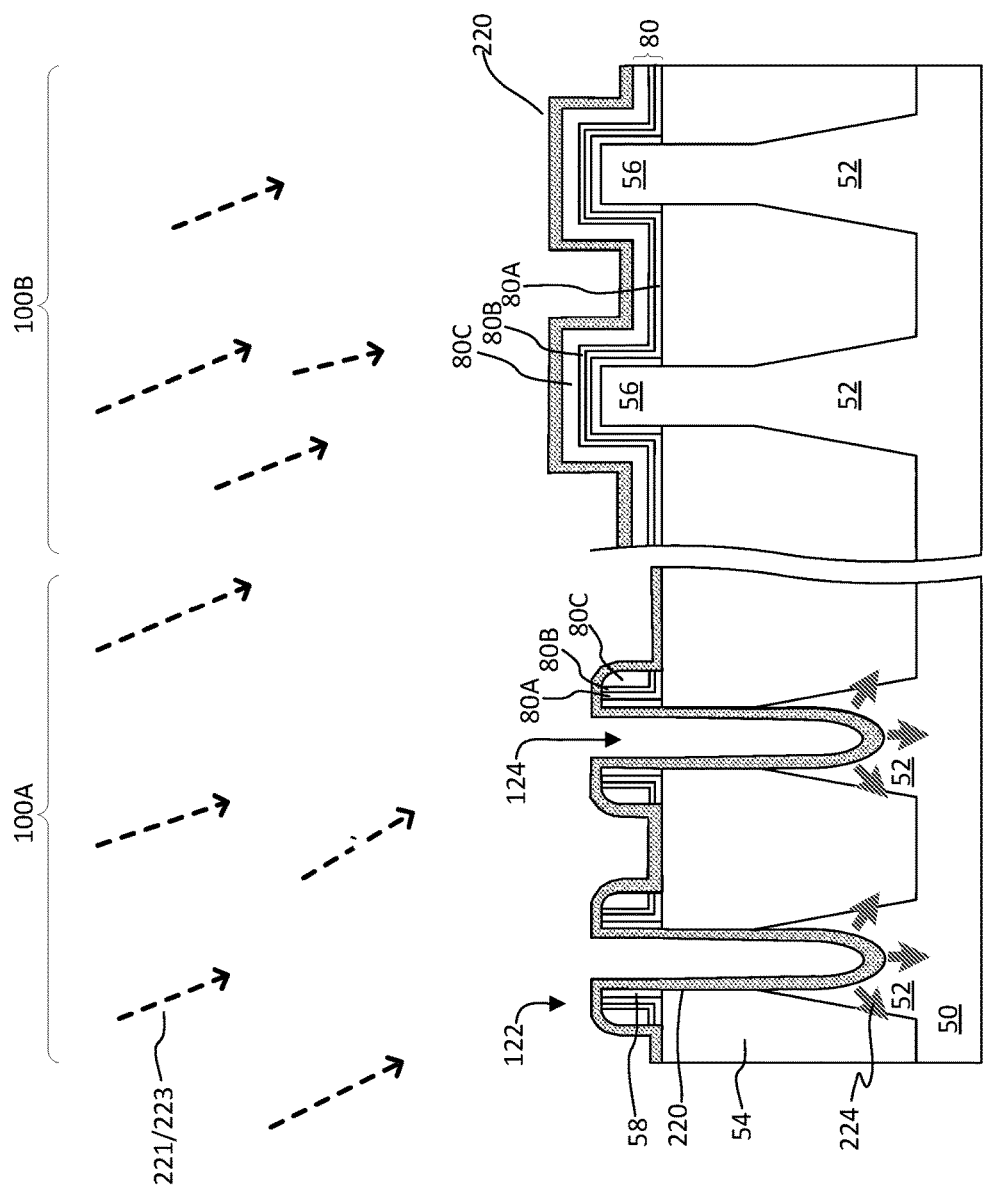

FIGS. 12B and 12C illustrate the formation of an intermetallic doping film and thermal diffusion of dopants into the fin 56 and semiconductor strips 52. A first intermetallic doping film 220 is formed over the device in the first region 100A and the second region 100B. The first intermetallic doping film 220 may also be referred to as first doping film 220. The first doping film 220 may comprise a doped silicate glass. The dopant used can include any suitable group V n-type impurity, such as any of those previously discussed, such as phosphorous, arsenic, antimony, or bismuth, and so forth, or combinations thereof. The first doping film 220 may be deposited (represented by arrows 221) by any suitable method, such as ALD, CVD, plasma-enhanced CVD (PECVD), and so forth, to form a thin layer over the dummy gates 70 and 76 and in the U-shaped recesses 124.

A concentration of the dopant in the first doping film 220 can be adjusted by varying the ratio of gases in the process environment, such as a deposition chamber. For example, where phosphorous is used to make phosphosilicate glass (PSG), process gasses may include tetraethylorthosilicate (TEOS) or silane $SiH_4$ as a source for the silicate and $PH_3$ or $POCl_3$ as a source for the phosphorous, and other process gases (such as oxygen, nitrogen, hydrogen, or argon). The ratio of the phosphorous dopant source can be adjusted to include more or less phosphorous in the formed PSG. For example, a ratio of $PH_3$ to $SiH_4$ may be about 15% to about 45%. A ratio of process gasses can be adjusted in a similar manner for other dopants. In some embodiments, the resulting concentration of dopant in the first doping film 220 may be between about $3.5 \times 10^{19}$ cm$^{-3}$ to about $8.5 \times 10^{19}$ cm$^{-3}$. In some embodiments, the first doping film 220 may be deposited to a thickness between about 0.8 nm and about 2 nm. In other embodiments, the first doping film 220 may be deposited to a thickness less than about 0.8 nm or more than about 2 nm.

Still referring to FIGS. 12B and 12C, following the formation of the first doping film 220, a thermal diffusion process (represented by arrows 223) can be performed to diffuse the dopant of the first doping film 220 into the fins 56 and semiconductor strips 52 surrounding the recesses 224. The thermal diffusion process 223 may include any suitable thermal diffusion process, include a rapid thermal anneal (RTA), microwave anneal, furnace anneal, and the like. For example, an RTA may be performed at a temperature of between about 900° C. to about 1000° C. for about 3 to 6 seconds, for example about 5 seconds.

In some embodiments, a mask (not shown) may be formed over the second region 100B to substantially prevent dopant from the first doping film 220 from diffusing into structures of the second region 100B. In some embodiments, one or more layers of the gate spacer layer 80 may serve to inhibit dopant from diffusing into underlying structures of the second region 100B. A conformal liner (not shown, see the discussion accompanying FIG. 4A, above) may be formed between the isolation area 54 and the semiconductor strips 52 to act as a diffusion barrier to prevent diffusion of dopant from the first doping layer 220 into the isolation regions 54.

The diffusion of dopant from the first doping layer 220 into the surrounding fin 56 and semiconductor strips 52 provides an increased doping concentration to lower sheet resistance and to enhance carrier mobility in the source/drain region of the device formed in the first region 100A. The concentration of dopant in the dopant diffusion area 227 of the surrounding fin 56 and semiconductor strips 52 is greater than the concentration of the same dopant outside the dopant diffusion area 227, for example, in an outside diffusion area which surrounds and is continuous with at least a portion of the dopant diffusion area 227 in the surrounding fin 56 and semiconductor strips 52. The concentration of dopant provided by the first doping layer 220 (such as an n-type impurity) in the dopant diffusion area 227 (see FIGS. 13B, 13C, and 13D) may be between about $1.2 \times 10^{19}$ cm$^{-3}$ to about $6.2 \times 10^{19}$ cm$^{-3}$. Resulting carrier mobility may be between about 15 cm$^2$/V–s to about 35 cm$^2$/V–s. Sheet resistance may be between about 200Ω–cm to about 1200Ω–cm.

Figure 13B:
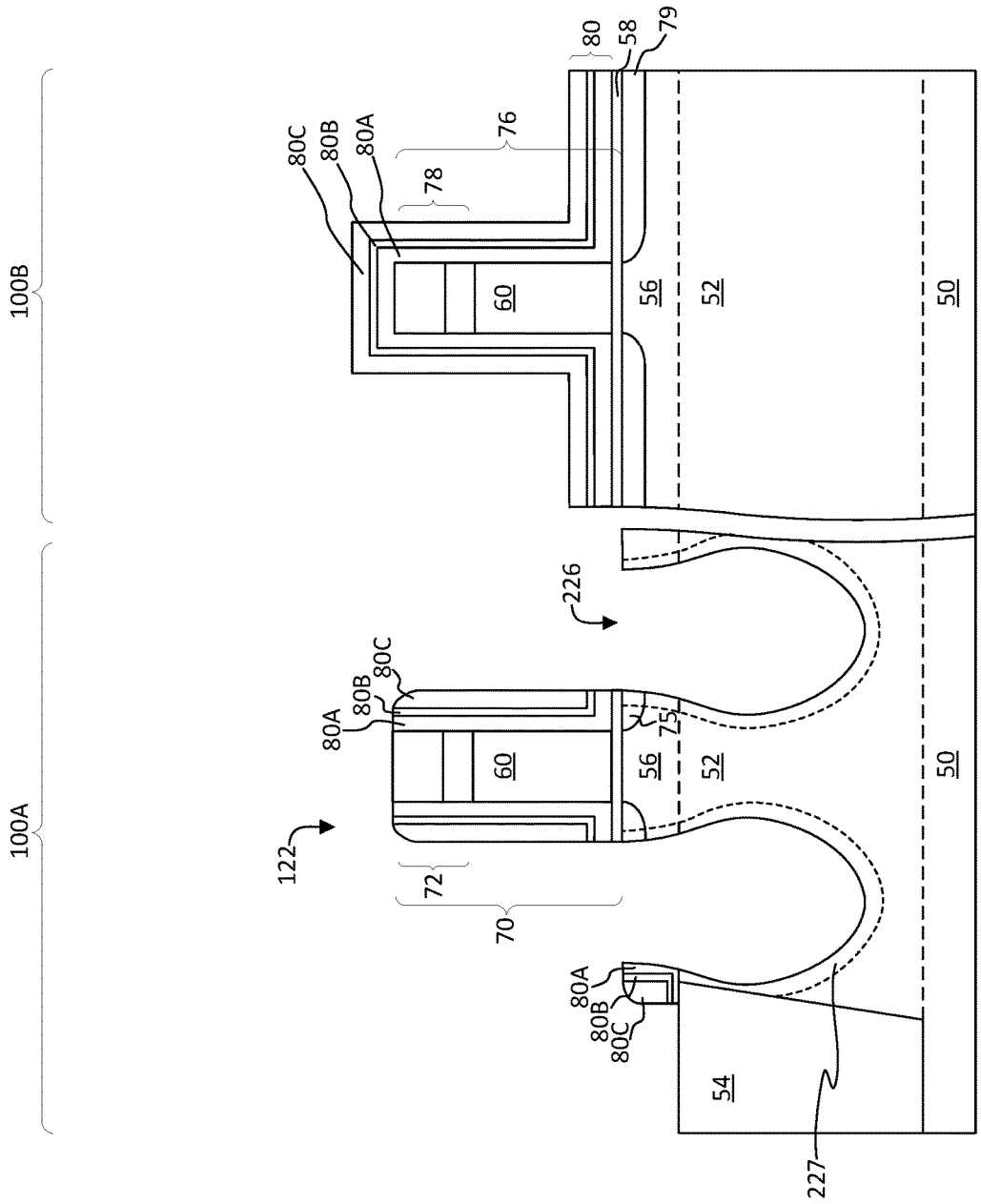
Figure 13C:
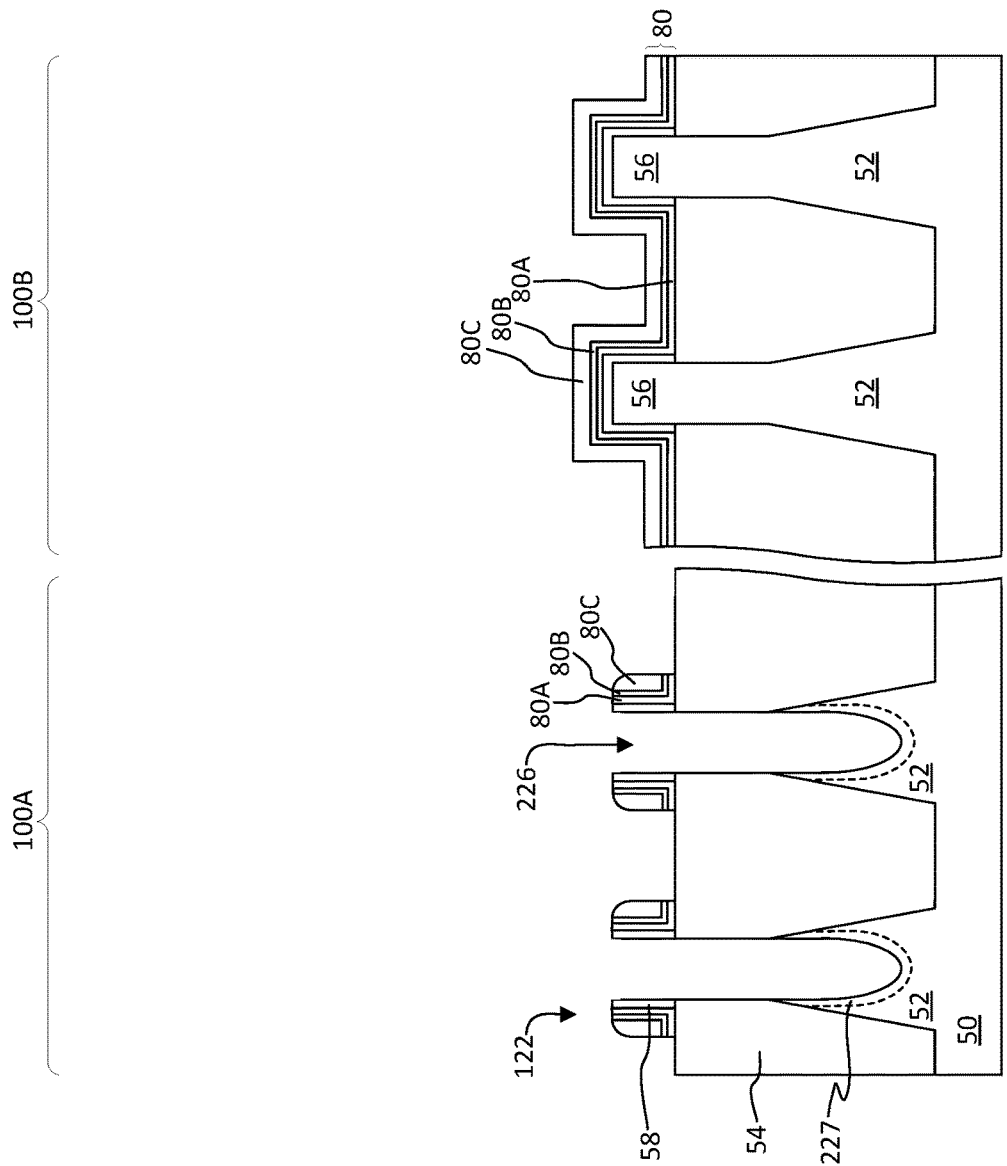
Figure 13D:
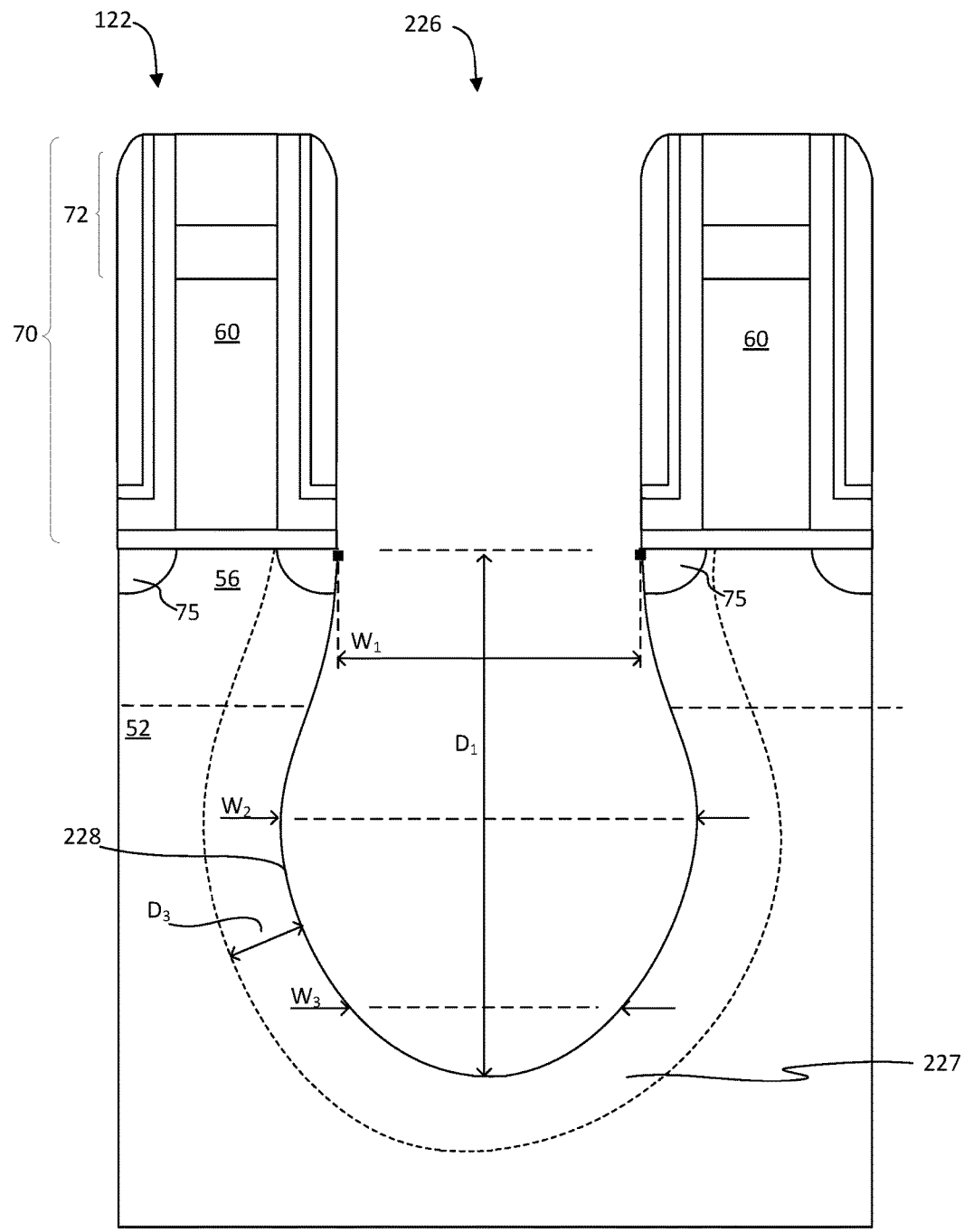

Referring to FIGS. 13B, 13C, and 13D, following the thermal diffusion process 223, the first doping film 220 is removed by any suitable process, for example by a wet etch. The first doping diffusion area 227 is formed in the fins 56 and semiconductor strips 52.

FIG. 13D illustrates a magnified view of a portion of FIG. 13B to show details of the dimensions of the opening 226 following the doping from the intermetallic doping film. FIG. 13D illustrates the opening 226 disposed between two adjacent dummy gates 70. In some embodiments, the depth $D_3$ of the dopant diffusion area 227 may be about 3 nm to about 18 nm. The depth $D_1$, as measured from an upper surface of the fins 56, may be between about 45 nm and about 65 nm. The surfaces 228 of the opening 226, including along the sides and bottom of the opening 226, are smoothed by the intermetallic doping film process. A width $W_1$ of the opening 226 is measured at the top of the opening. A width $W_2$ of the opening 226 is measured at 50% of the depth (the middle) of the opening. A width $W_3$ of the opening 226 is measured at 90% of the depth (the 90% bottom) of the opening. In some embodiments, a ratio of the width $W_1:W_2$ may be about 1.00:1.13-1.22; a ratio of the width $W_1:W_3$ may be about 1.00:1.01-1.52; and a ratio of the width $W_2:W_3$ may be about 1.13-1.22:1.01-1.52. In other words, the middle width $W_2$ may be about 13 to 22 percent wider than the top width $W_1$ and the 90% bottom width $W_3$ may be about 1 to about 52 percent wider than the top width $W_1$.

The dopant diffusion area 227 results in an increased concentration of dopant in the the semiconductor fins 56 and semiconductor strips 52, which provides increased carrier mobility. In some embodiments, the dopant diffusion area 227 includes a portion of the channel region under the dummy gate 60. In other words, that the dummy gate 600 is vertically aligned with a portion of the dopant diffusion area 227 in some embodiments.

The smooth surfaces 228 of the opening 226 are beneficial for the growing of an epitaxial material therein, as described in greater detail below. The smooth surfaces 228 result in an epitaxial structure of the source/drain regions with a correspondingly smooth surface and having a greater height and greater width than the epitaxial structure of the source/drain regions would have without the thermal diffusion doping process.

Figure 14B:
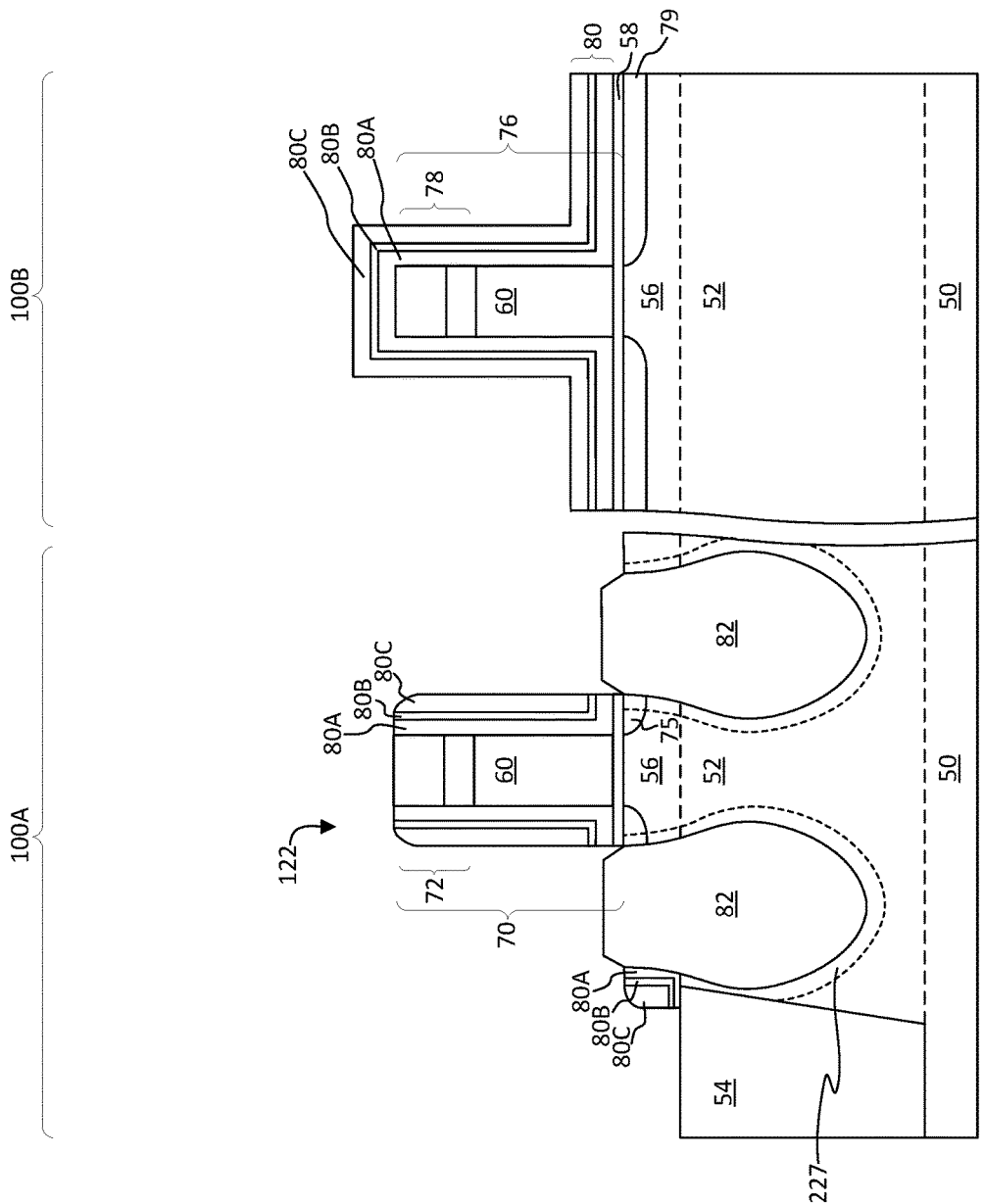
Figure 14D:
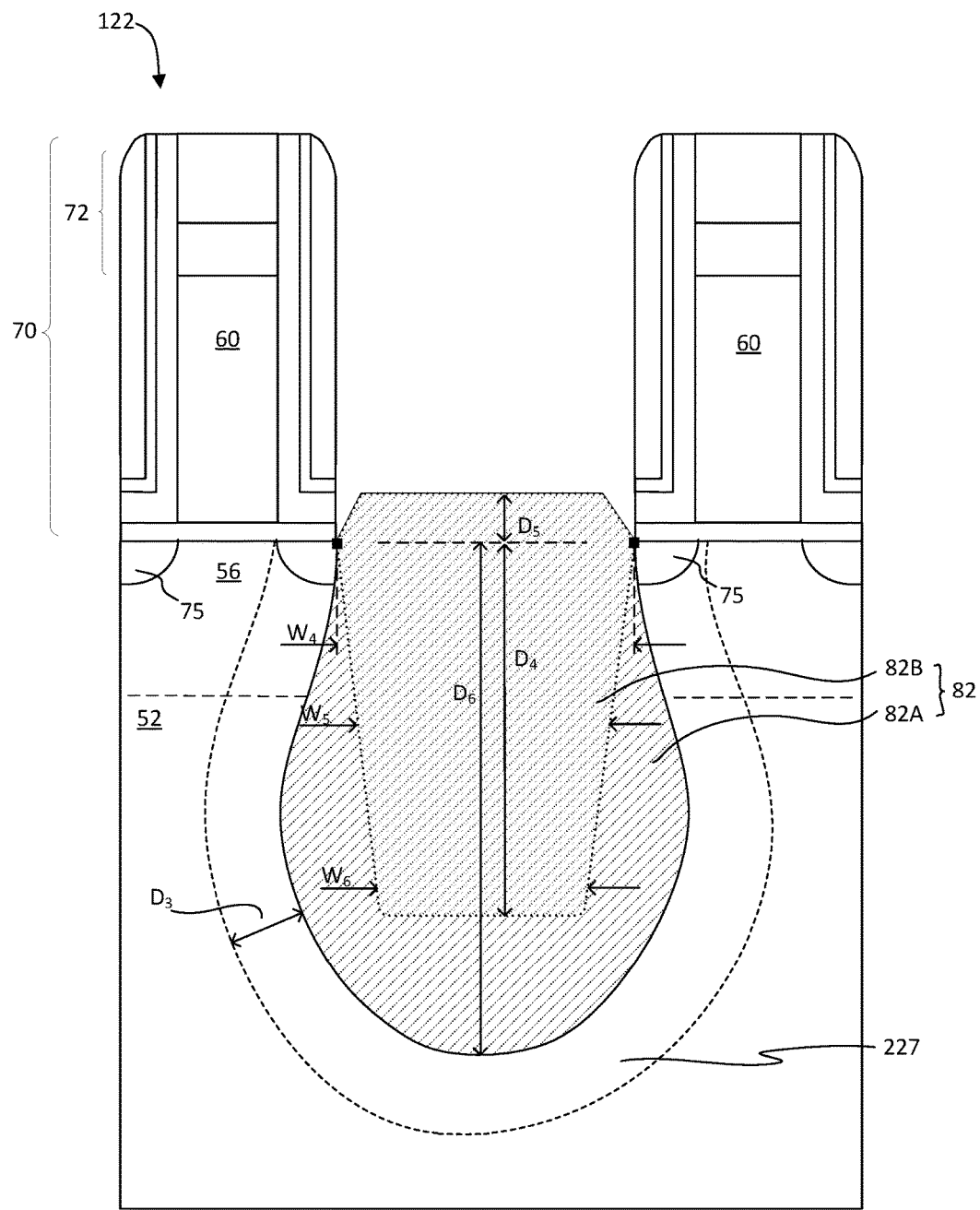

FIGS. 14B, 14C, and 14D illustrate the formation of epitaxial source/drain regions 82 in the first region 100A. In some embodiments, the epitaxial source/drain regions 82 are epitaxially grown in the doped U-shaped recesses 226 (See FIGS. 13B and 13C) using metal-organic CVD (MOCVD), molecular beam epitaxy (MBE), liquid phase epitaxy (LPE), vapor phase epitaxy (VPE), selective epitaxial growth (SEG), a combination thereof, or the like. The epitaxial source/drain regions 82 may include any acceptable material, such as any material that is appropriate for n-type FinFETs. For example, if the fin 56 is silicon, the epitaxial source/drain regions 82 may include silicon, SiC, SiCP, SiP, or the like. The epitaxial source/drain regions 82 may have surfaces raised from respective surfaces of the fins 56 and may have facets. The epitaxial source/drain regions 82 are formed in the fins 56 such that each dummy gate 70 is disposed between respective neighboring pairs of the epitaxial source/drain regions 82. In some embodiments the epitaxial source/drain regions 82 may extend past the fins 56 and into the semiconductor strips 52, such as illustrated in FIG. 14B.

Figure 27C:
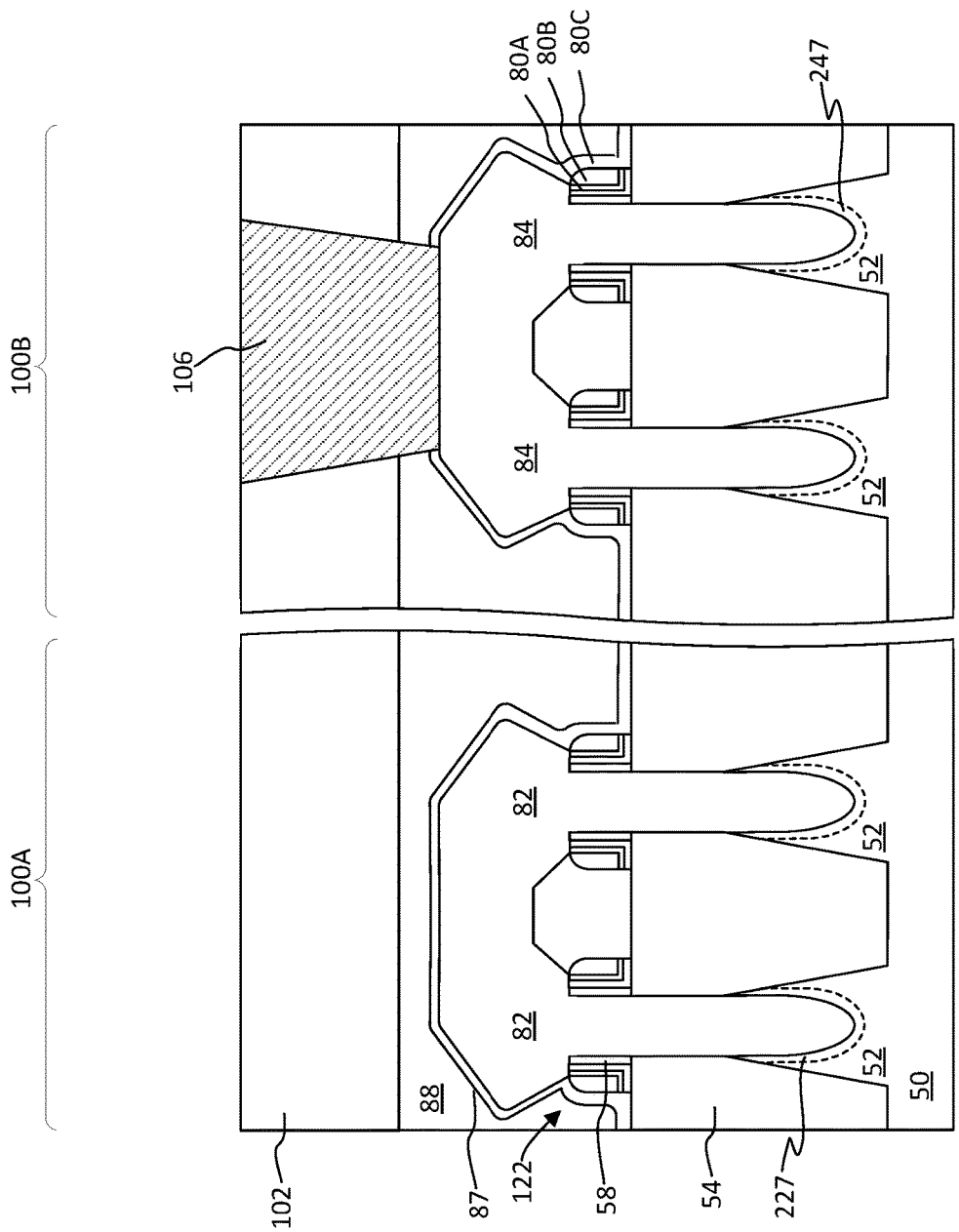
FIGS. 27C, 28C, and 29C are cross-sectional views of a FinFET device in accordance with some embodiments.

The material of the epitaxial source/drain regions 82 in the first region 100A may be implanted with dopants, similar to the process previously discussed for forming the LDD regions 75, followed by an anneal (see FIGS. 8A, 8B, and 8C and its associated description). The epitaxial source/drain regions 82 may have an impurity concentration of in a range from about $10^{19}$ cm$^{-3}$ to about $10^{21}$ cm$^{-3}$. The n-type impurities for source/drain regions in the first region 100A, e.g., the NMOS region, may be any of the n-type dopant impurities previously discussed. In other embodiments, the material of the epitaxial source/drain regions 82 may be in situ doped during growth. In the illustrated embodiments, each of the source/drain regions 82 is physically separate from other source/drain regions 82. In other embodiments, two or more adjacent source/drain regions 82 may be merged. Examples of such embodiments are depicted in FIGS. 27C and 31C, such that two or three adjacent source/drain regions 82 are merged to form a common source/drain region. In some embodiments, more than two or three adjacent source/drain regions 82 may be merged.

Due to the film doping of the U-shaped recess 226 (see FIGS. 13B, 13C, and 13D) providing a smooth sidewall profile of the recess, the epitaxial source/drain regions 82 may be formed in a more uniform manner and produce a larger volume than would otherwise be produced without the film doping.

FIG. 14D illustrates a magnified portion of the cross-section illustrated by FIG. 14B. The epitaxial source/drain regions 82 may include one or more layers, 82A and 82B. The layer 82A is a first set of one or more layers of the epitaxial source/drain regions 82. The layer 82B is a second set of one or more layers of the epitaxial source/drain regions 82. In some embodiments, the epitaxial source/drain regions 82 may be formed of a single continuous layer. The first layer 82A may be formed using processes and materials such as described above with respect to FIG. 14B. The second layer 82B may also be formed using processes and materials such as described above with respect to FIG. 14B. The first layer 82A provides a first growth of epitaxial material in the epitaxial source/drain regions 82. The second layer 82B provides a subsequent growth of epitaxial material epitaxial source/drain regions 82. The first layer 82A may have a first lattice constant. The second layer 82B may have a second lattice constant. In some embodiments, the first lattice constant is the same as the second lattice constant. In some embodiments, the first lattice constant is different than the second lattice constant.

In some embodiments, the depth $D_6$ of the epitaxial source/drain 82 as measured from the upper surface of the fin 56 may be about 45 nm to about 65 nm. The depth $D_5$, from an upper point of the epitaxial source/drain material 82 to the upper surface of the fin 56, may be about 0.5 nm to about 3.0 nm. The depth $D_4$, from the upper surface of the fin 56 to a lower interface of the second layer 82B may be about 30 nm to about 50 nm. A width $W_4$ of the second layer 82B of the epitaxial source/drain material is measured at the top of the opening. A width $W_5$ of the second layer 82B of the epitaxial source/drain material is measured at 50% of the depth (the middle) of the second layer 82B. A width $W_6$ of the second layer 82B of the epitaxial source/drain material is measured at 90% of the depth (the 90% bottom) of the opening. In some embodiments, a ratio of the width $W_4$:$W_5$ may be about 1.00:0.8-0.9; a ratio of the width $W_4$:$W_6$ may be about 1.00:1.02-1.61; and a ratio of the width $W_5$:$W_6$ may be about 0.8-0.9:1.02-1.61. In other words, the middle width $W_5$ may be about 80% to about 90% of the top width $W_4$ and the 90% bottom width $W_6$ may be about 2% to about 61% wider than the top width $W_4$.

Referring to the widths and ratios discussed in FIG. 13D and the widths and ratios discussed in FIG. 14D, a ratio relationship may be described between the opening 226 and the second layer 82B of the epitaxial source/drain material. A ratio of the top width $W_1$ of the opening 226 to the top width $W_4$ of the second layer 82B ($W_1$:$W_4$) may be about 1.14 to about 1.19:1. A ratio of the middle width $W_2$ of the opening 226 to the top width $W_5$ of the second layer 82B ($W_2$:$W_5$) may be about 1.52 to about 1.61. A ratio of the 90% bottom width $W_3$ of the opening 226 to the top width W6 of the second layer 82B ($W_3$:$W_6$) may be about 1.02 to about 1.21. These ratios are examples of possible ratios in some embodiments. Other dimensions and ratios may be used.

Referring to FIGS. 15A, 15B, 15C, 16A, 16B, and 16C, a patterning process is performed to remove excess portions of the spacer layer 80 in the second region 100B. Any acceptable patterning process may be used.

Figure 15A:
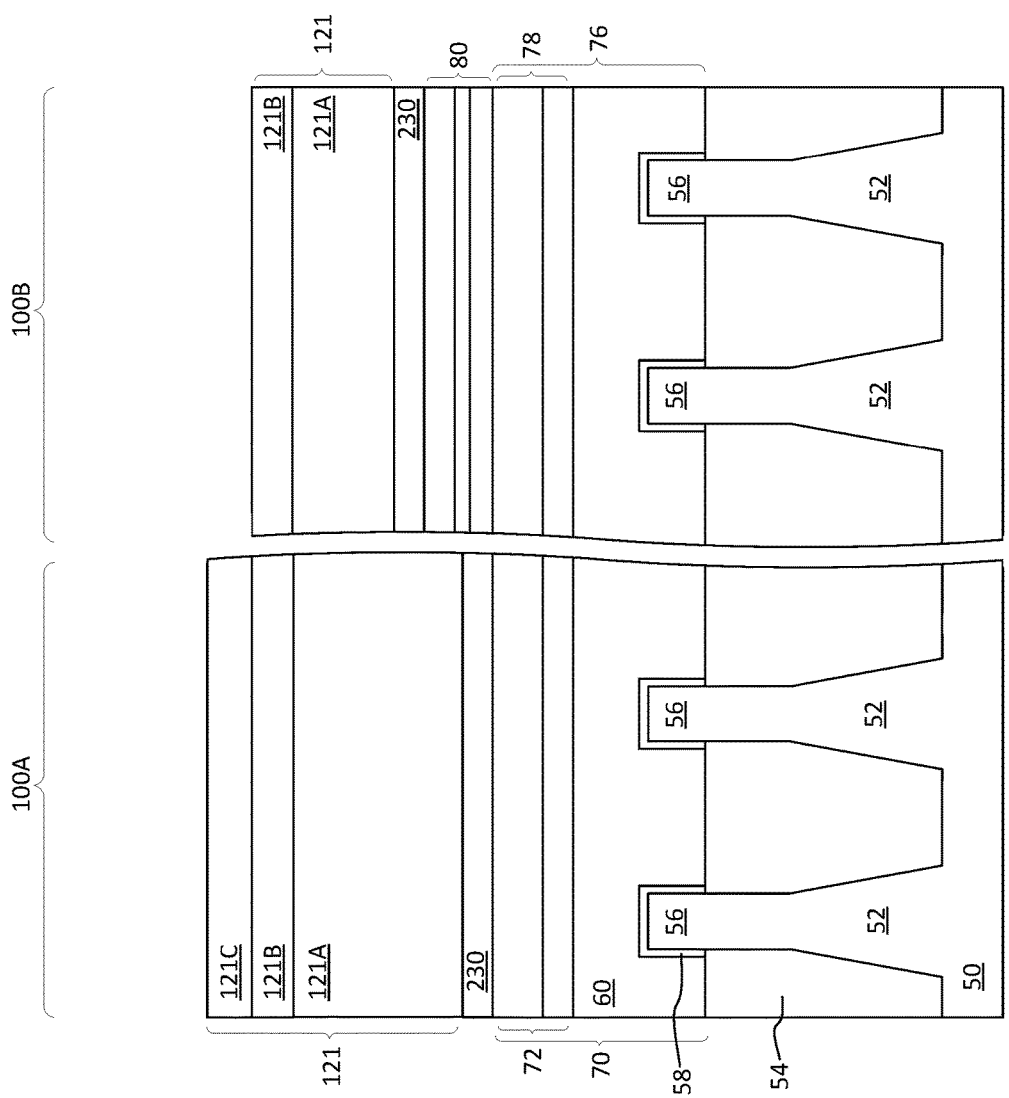
Figure 15B:
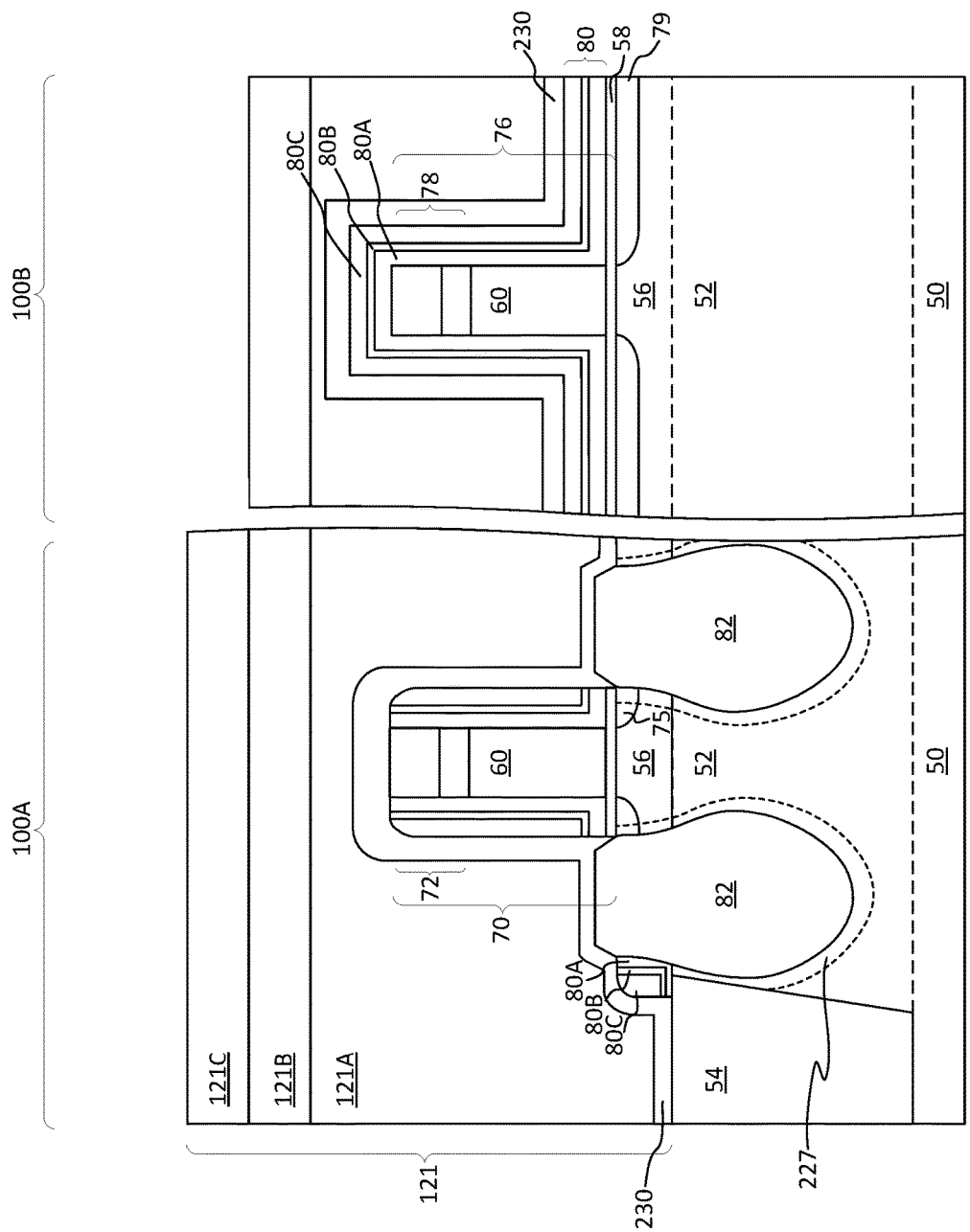
Figure 15C:
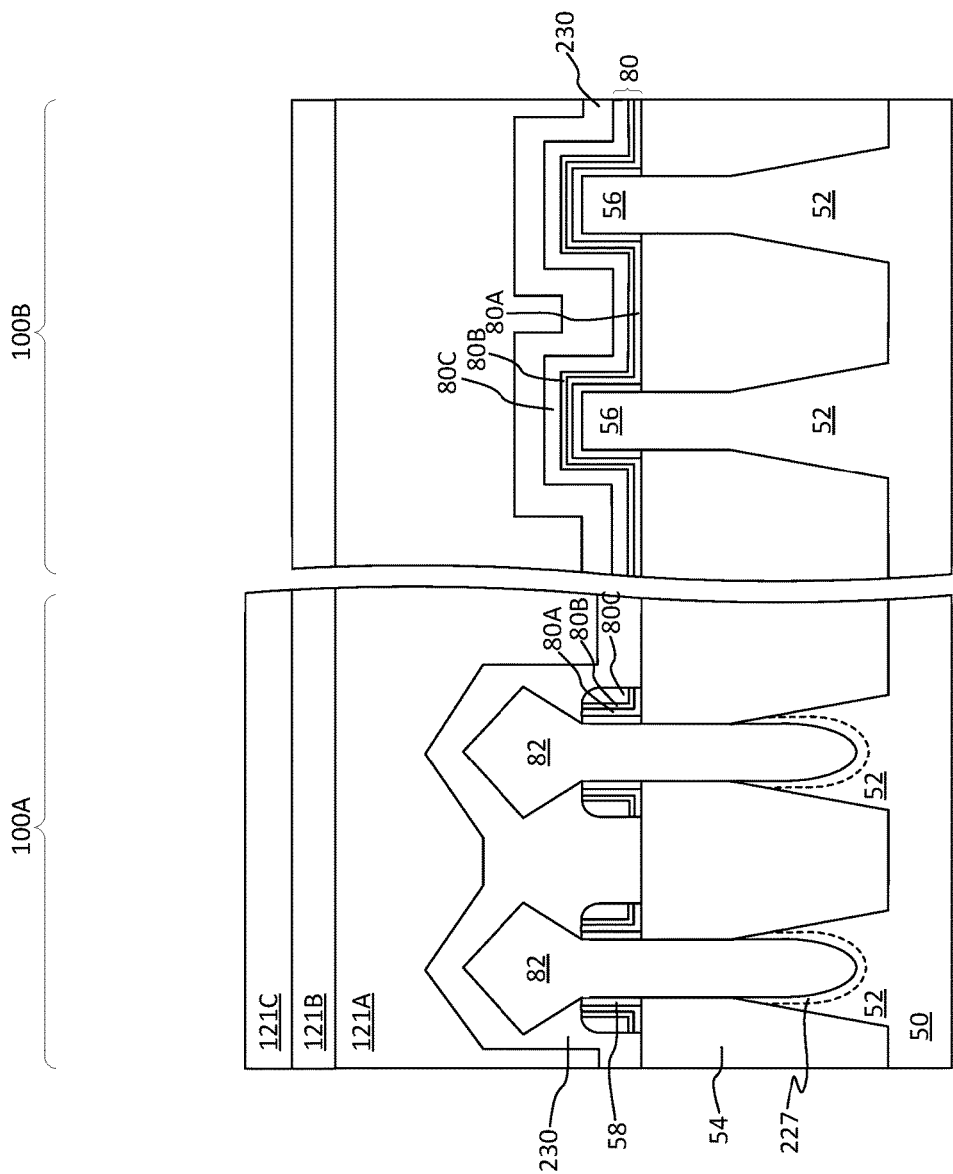

Referring first to FIGS. 15A, 15B, and 15C, in some embodiments, a tri-layer mask 121 is formed over the first region 100A and the second region 100B. The tri-layer mask 121 comprises a bottom layer 121A, a middle layer 121B over the bottom layer 121A, and a top layer 121C over the middle layer 121B. The tri-layer mask 121 can be formed using processes and materials such as those discussed above with respect to FIGS. 9A, 9B, and 9C, which are not repeated. In some embodiments, the top layer 121C of the tri-layer mask 121 is patterned to expose the second region 100B. The top layer 121C may be patterned using suitable photolithography techniques.

In some embodiments, a mask layer 230 may be formed over the first region 100A to protect the first region while processing the second region 100B. Any suitable methods of forming the mask layer 230 may be used. In some embodiments, a deposition (such as CVD, ALD, or the like) or spin-on coating may be used form the mask layer 230o. In some embodiments, the mask layer 230 may include one or more layers of, for example, a nitride (such as SiN, TiN, TaN, or the like), an oxynitride (such as SiON), a carbonitride (such as SiOCN), spin-on-carbon, a combination thereof, or the like. Although depicted prior to the formation of the tri-layer mask 121 of FIGS. 15A, 15B, and 15C, in some embodiment, mask layer 230 may be formed after removal of the tri-layer mask 121.

Figure 16A:
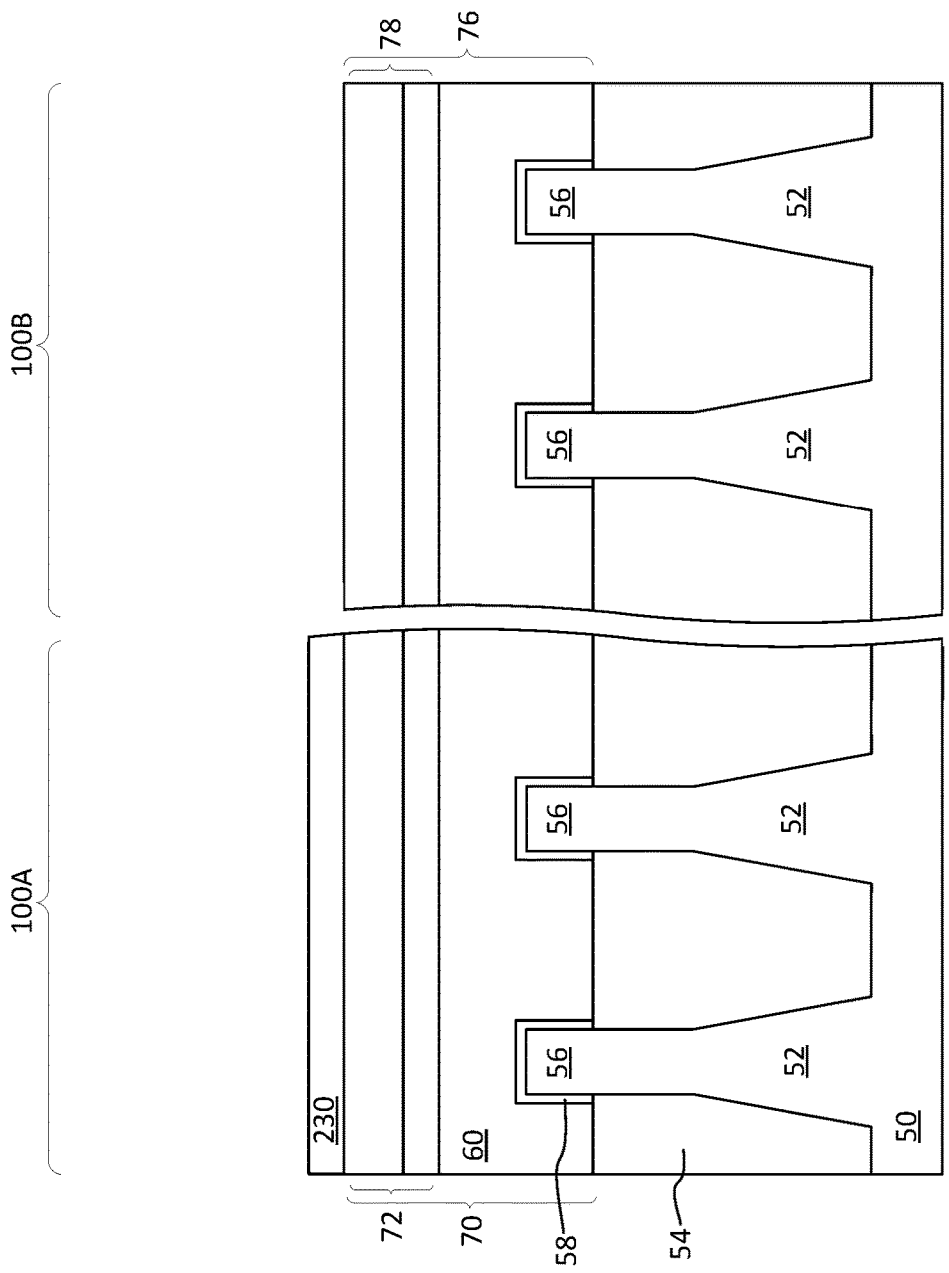
Figure 16B:
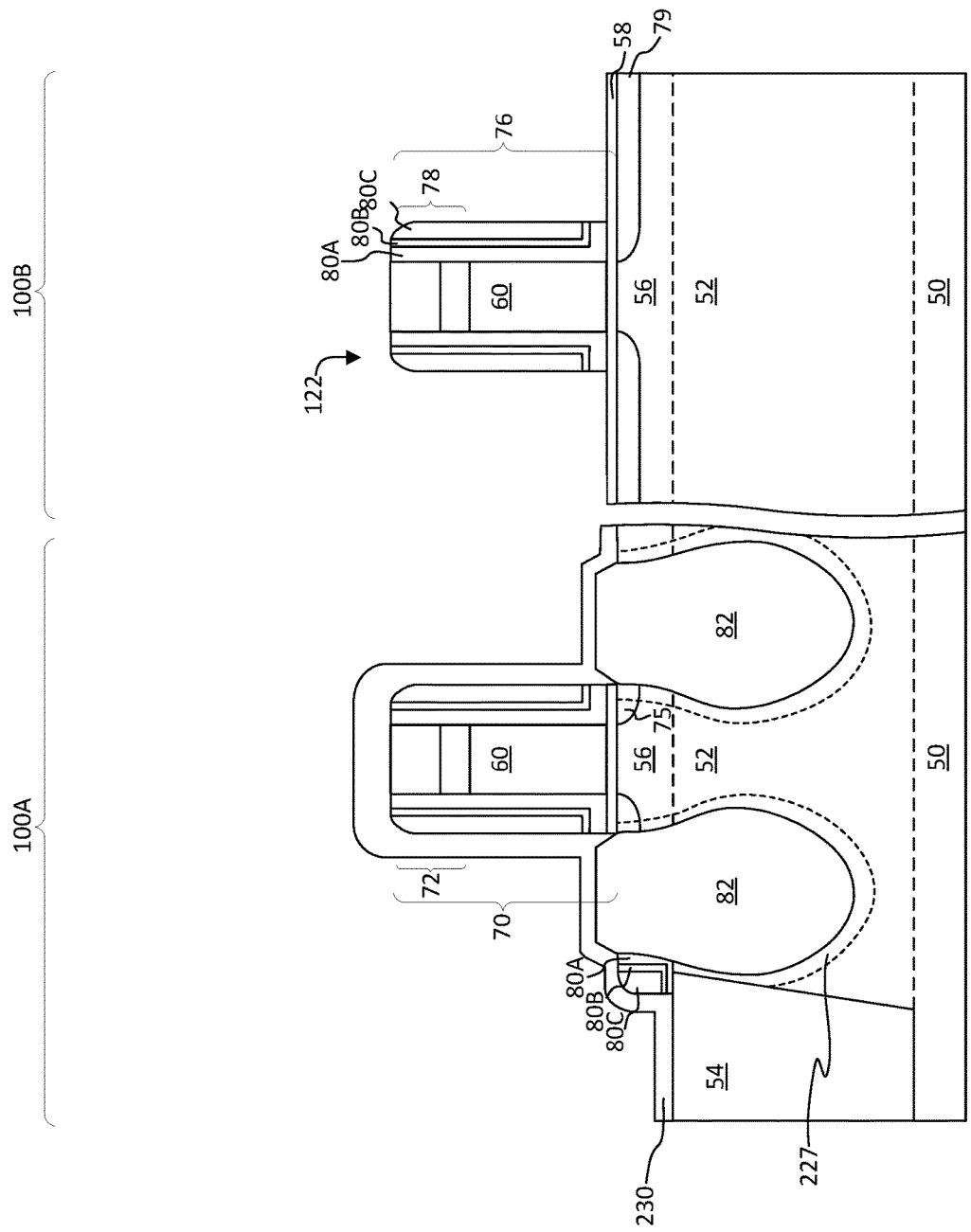
Figure 16C:
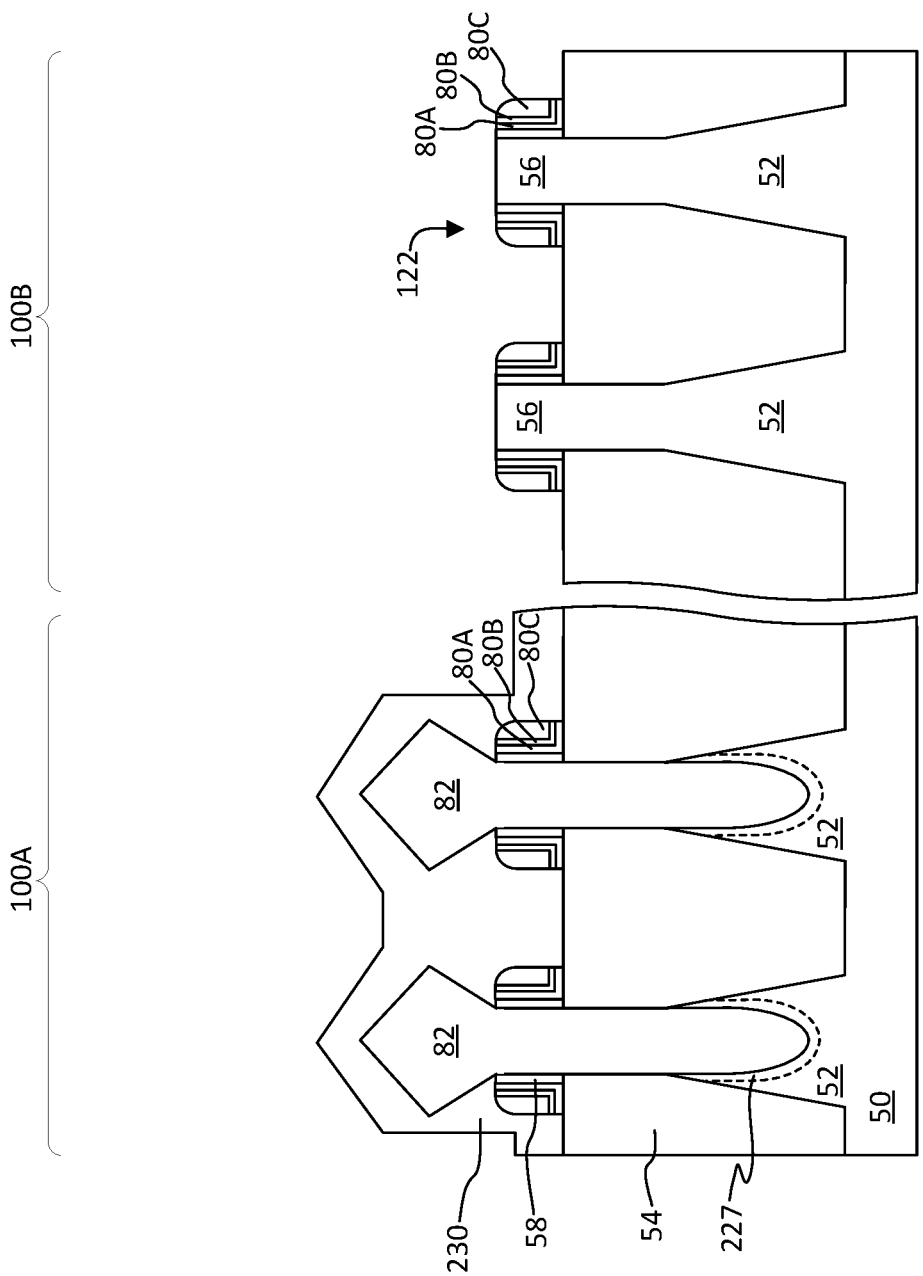

Referring to FIGS. 16A, 16B, and 16C, an etching process is performed using the patterned tri-layer mask 121 as a mask. The etching process may be anisotropic. After pre-forming the etching process, lateral portions of the first spacer layer 80A, the second spacer layer 80B, and the third spacer layer 80C over the LDD regions 75 and over the isolation regions 54 may be removed to expose top surfaces of the fins 56 and the masks 78 for the dummy gate stacks 76. Portions of the first spacer layer 80A, the second spacer layer 80B, and the third spacer layer 80C along sidewalls of the dummy gates 78 and the fins 56 may remain and form spacers 122. In other embodiments, the spacer layer 80 may also be removed from the sidewalls of the fins 56. After patterning the spacer layer 80, the tri-layer mask 121 may be removed using any suitable removal process.

FIGS. 17B through 21C illustrate the formation of the epitaxial source/drain regions 84 in the second region 100B. During the formation of the epitaxial source/drain regions 84 in first region 100B, e.g., the PMOS region, the first region 100A, e.g., the NMOS region may be masked by mask layer 230 or another type of mask.

Figure 17B:
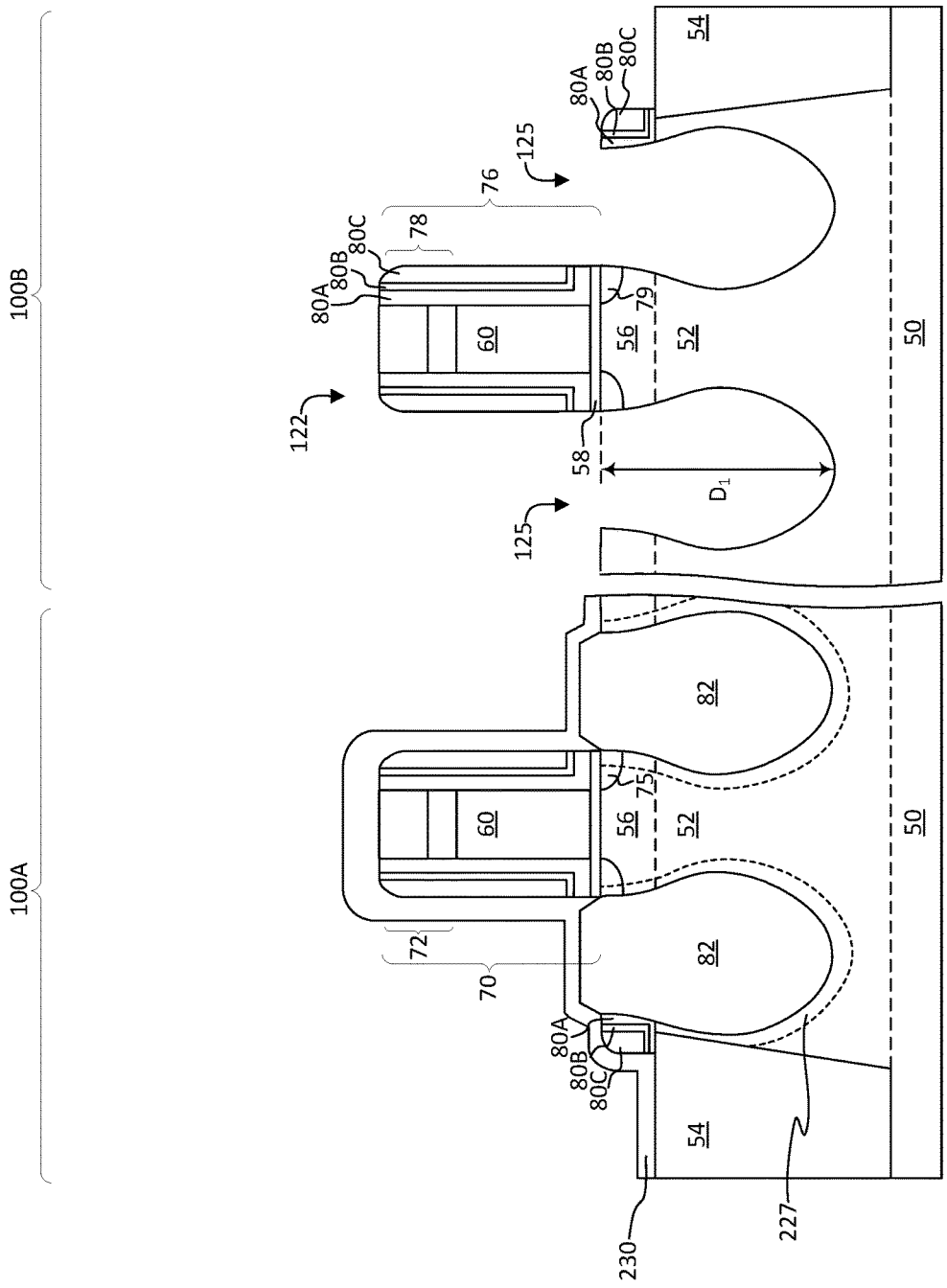
Figure 17C:
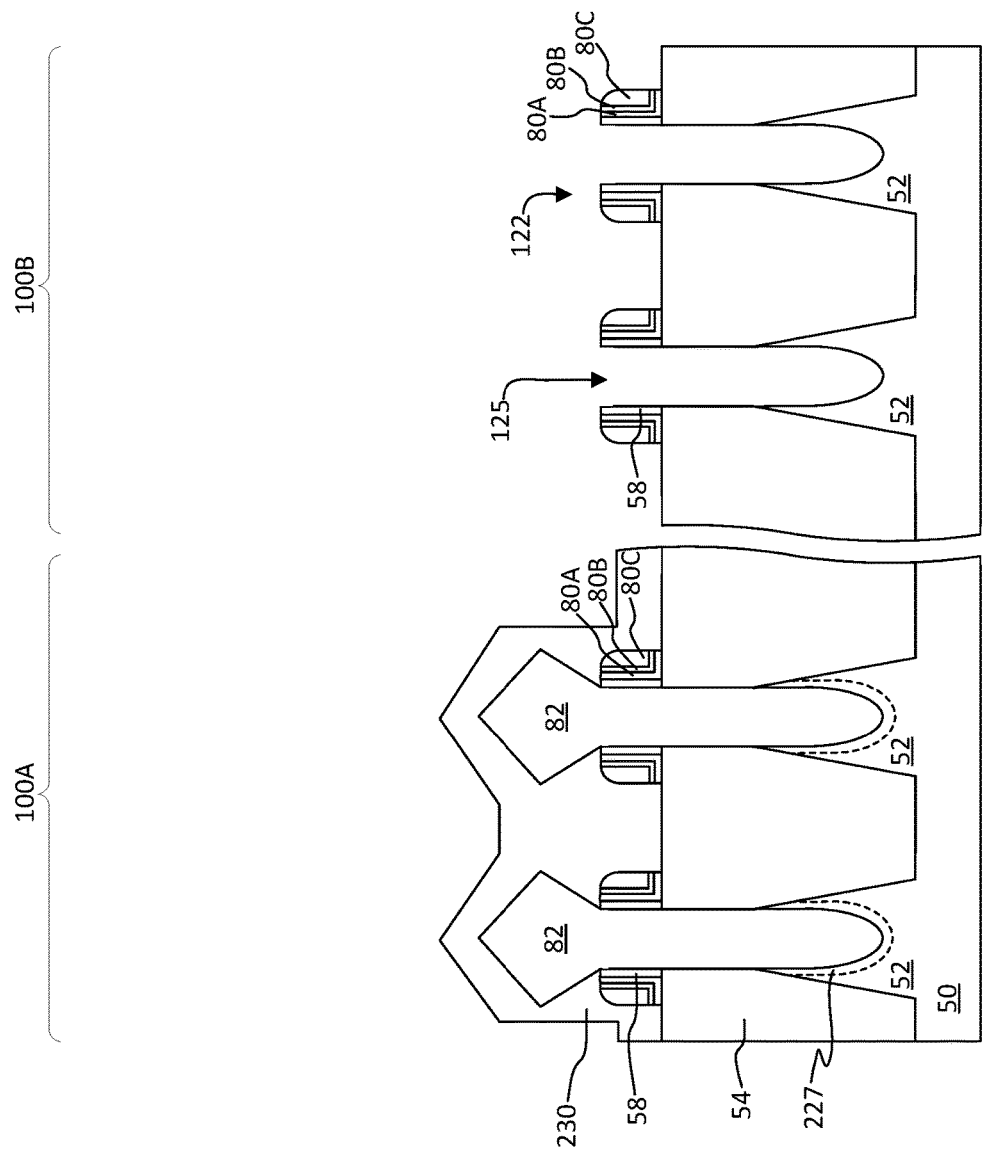

Referring to FIGS. 17B and 17C, a second patterning process is performed on the fins 56 to form recesses 125 in source/drain regions of the fins 56. The recesses 125 in the second region 100B may be formed using similar processes and materials as the U-shaped recesses 124 in the first region 100A, described above with reference to FIGS. 1A, 11B, and 11C, and the description is not repeated.

In some embodiments, the second patterning process forms recesses 125 having U-shaped bottom surfaces in the second region 100B. The recesses 125 may also be referred to as U-shaped recesses 125. In some embodiments, the U-shaped recesses 125 have a depth $D_1$, as measured from a top surface of the fins 56, between about 45 nm and about 65 nm. As a result of the first patterning process, the recesses 125 may have rough surfaces. In some embodiments, the etching process for forming the U-shaped recesses 125 may also etch a top surface of isolation regions 54.

Figure 18B:
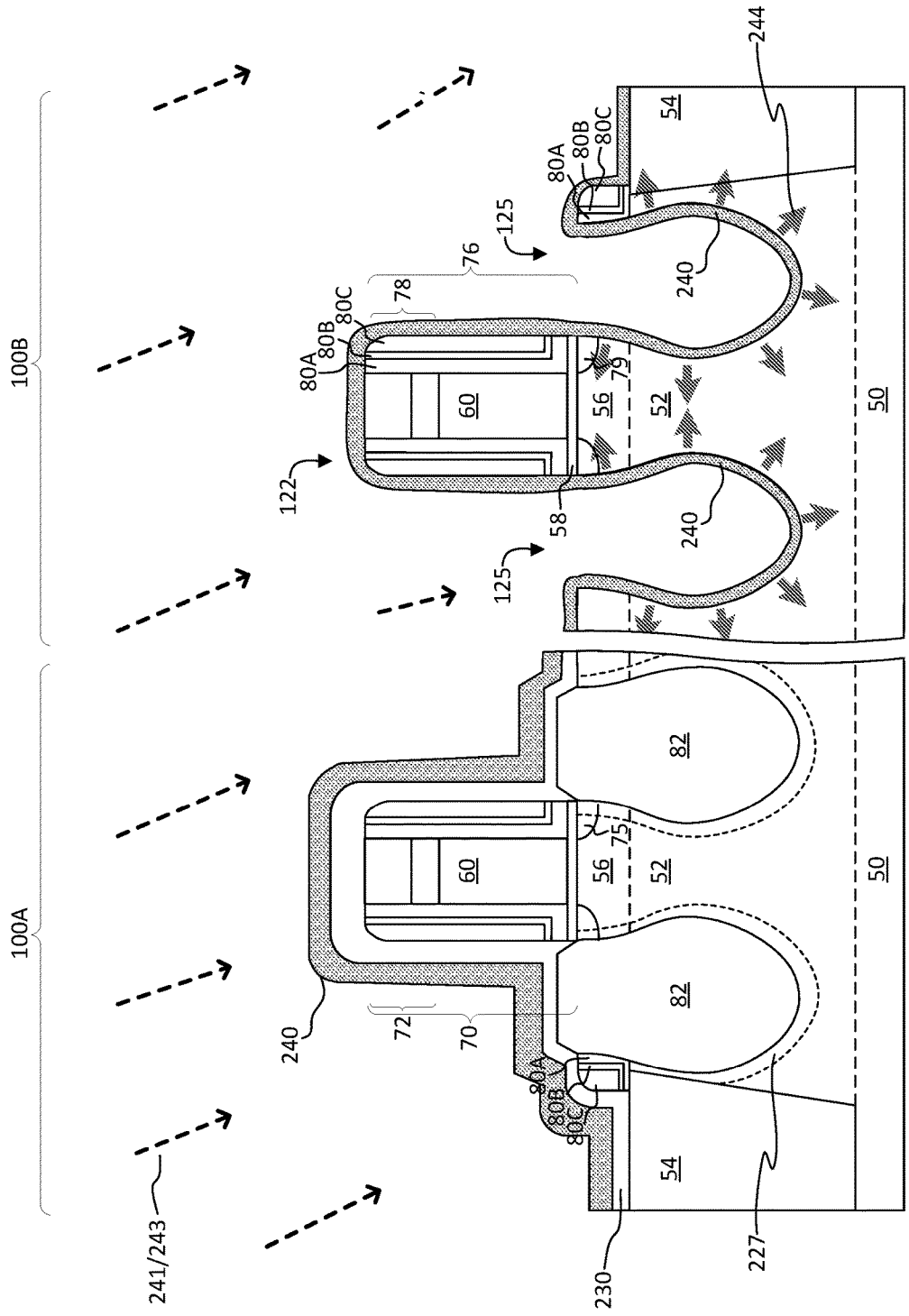
Figure 18C:
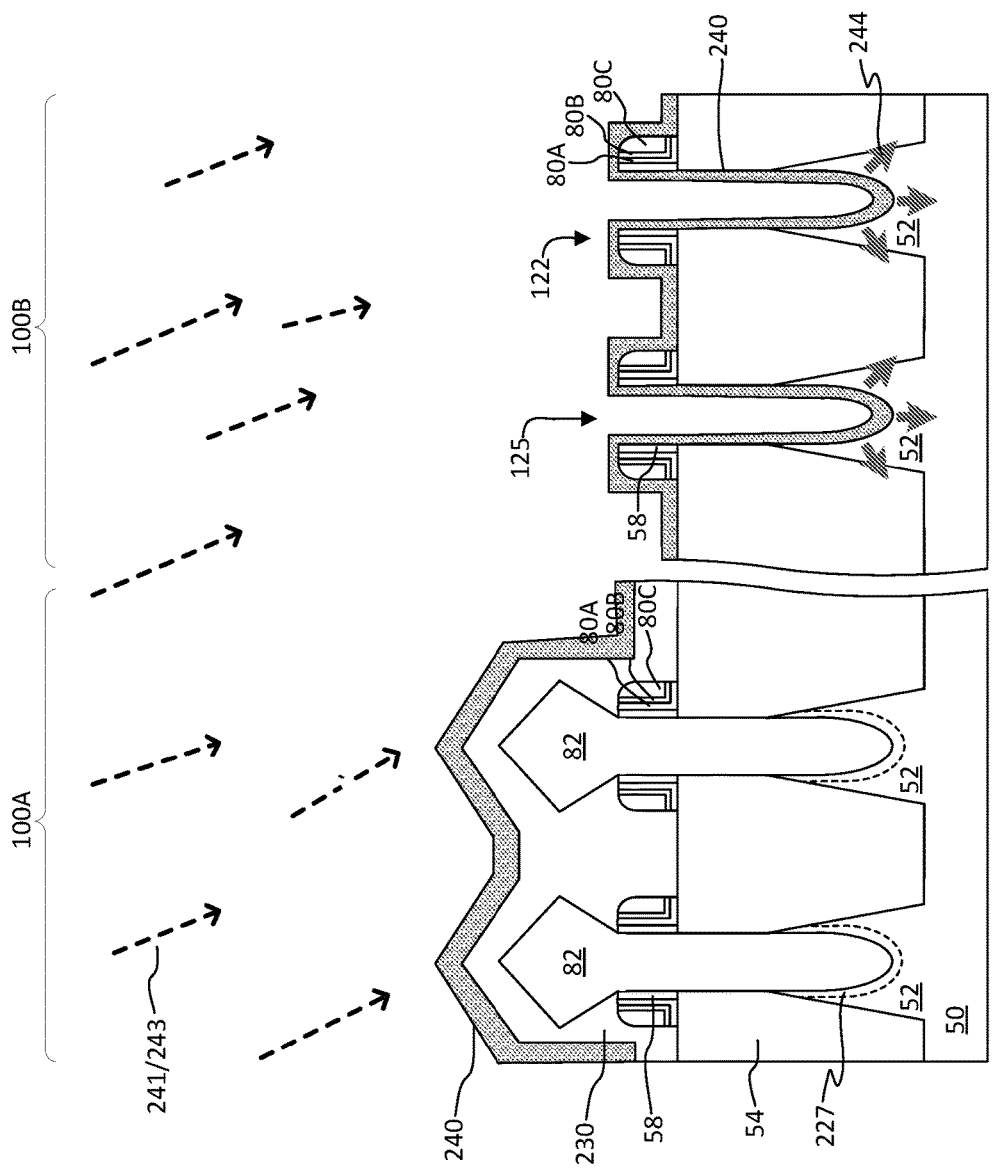

FIGS. 18B and 18C illustrate the formation of a second intermetallic doping film and thermal diffusion of dopants into the fin 56 and semiconductor strips 52. A second intermetallic doping film 240 is formed over the device in the first region 100A and the second region 100B. The second intermetallic doping film 240 may also be referred to as second doping film 240. The second doping film 240 may comprise a doped silicate glass. The dopant used can include any suitable Group III p-type impurity, such as any of those previously discussed, such as boron, aluminum, gallium, or indium, and so forth, or combinations thereof. The second doping film 240 may be deposited (represented by arrows 241) by any suitable method, such as CVD, spin-on coating, PECVD, and so forth, to form a thin layer over the dummy gates 70 and 76 and in the U-shaped recesses 125.

A concentration of the dopant in the second doping film 240 can be adjusted by varying the ratio of gases in the process environment. For example, where boron is used to make borosilicate glass (BSG), process gasses may include silane $SiH_4$ as a source for the silicate and $B_2H_6$ as a source for the boron. The ratio of the boron dopant source can be adjusted to include more or less boron in the formed BSG. For example, a ratio of $B_2H_6$ to $SiH_4$ may be about 15% to about 45%. A ratio of process gasses can be adjusted in a similar manner for other dopants. In some embodiments, the resulting concentration of dopant in the second doping film 240 may be between about $2.5 \times 10^{18}$ cm$^{-3}$ to about $7.5 \times 10^{18}$ cm$^{-3}$. In some embodiments, the thickness of the second doping film 240 may be between about 0.8 nm and about 2 nm. In some embodiments, the thickness of the second doping film 240 may be less than about 0.8 nm or greater than about 2 nm thick.

Still referring to FIGS. 18B and 18C, following the formation of the second doping film 240, a thermal diffusion process (represented by arrows 243) can be performed to diffuse the dopant of the second doping film 240 into the fins 56 and semiconductor strips 52 surrounding the recesses 125. The thermal diffusion process 243 may be performed by processes described above with respect to thermal diffusion process 223 of FIGS. 12B and 12C, which are not repeated.

The mask 230 substantially prevents dopant from the second doping film 240 from diffusing into the source/drain areas 82 of the first region 100A. A conformal liner (not shown, see the discussion accompanying FIG. 4A, above) may be formed between the isolation area 54 and the semiconductor strips 52 to act as a diffusion barrier to prevent diffusion of dopant from the second doping film 240 into the isolation regions 54.

The diffusion of dopant into the surrounding fin 56 and semiconductor strips 52 provides an increased doping concentration to lower sheet resistance and to enhance carrier mobility in the source/drain region of the device formed in the second region 100B. The concentration of dopant in the dopant diffusion area 247 is greater than the concentration of the same dopant outside the dopant diffusion area 247, for example, in an outside diffusion area which surrounds and is continuous with at least a portion of the dopant diffusion area 247 in the surrounding fin 56 and semiconductor strips 52. The concentration of dopant provided by the second doping film 240 (such as a p-type impurity) in the dopant diffusion area 247 (see FIGS. 19B and 19C) may be between about $2.5 \times 10^{19}$ cm$^{-3}$ to about $7.5 \times 10^{19}$ cm$^{-3}$. Resulting carrier mobility may be between about 8 cm$^2$/V–s to about 20 cm$^2$/V–s. Sheet resistance may be between about 150Ω–cm to about 190Ω–cm.

Figure 19B:
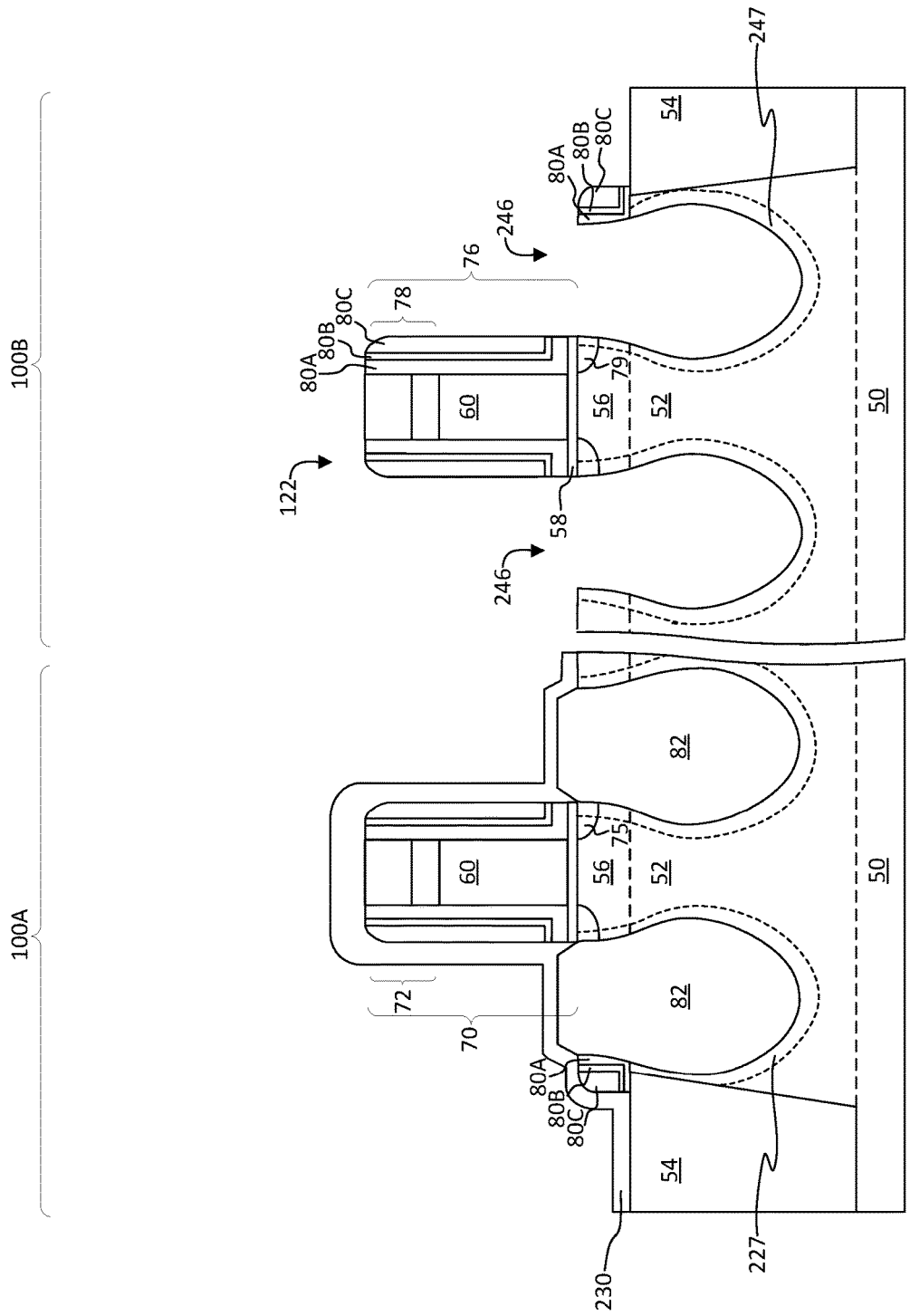
Figure 19C:
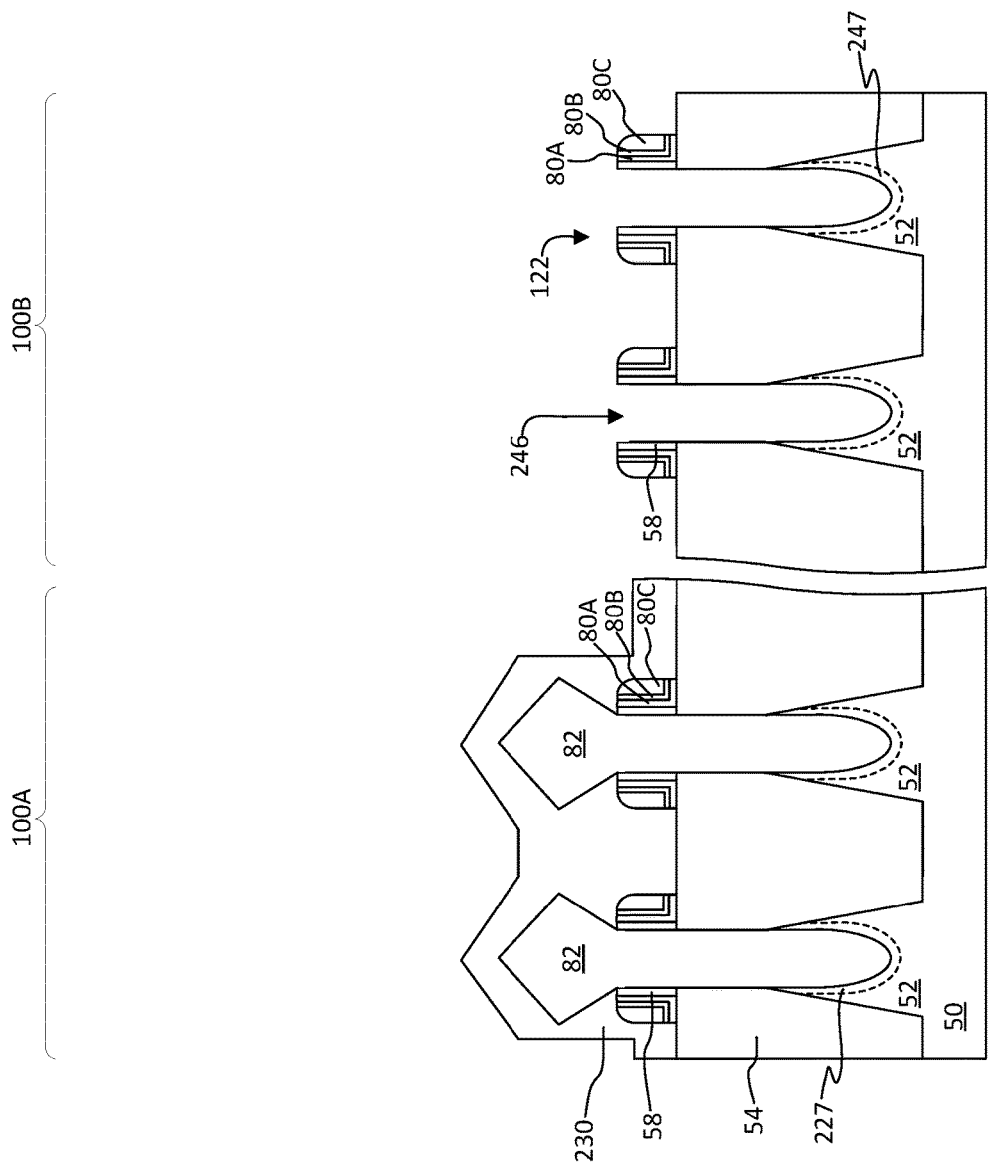

Referring to FIGS. 19B and 19C, following the thermal diffusion process 243, the second doping film 240 is removed by any suitable process, for example by a wet etch. A second doping diffusion area 247 is formed in the fins 56 and semiconductor strips 52.

The dimensions and characteristics of the opening 125 and thermal diffusion area 247 are consistent with those discussed above with respect to the opening 124 and thermal diffusion area 227 of FIG. 13D and are not repeated.

Figure 20B:
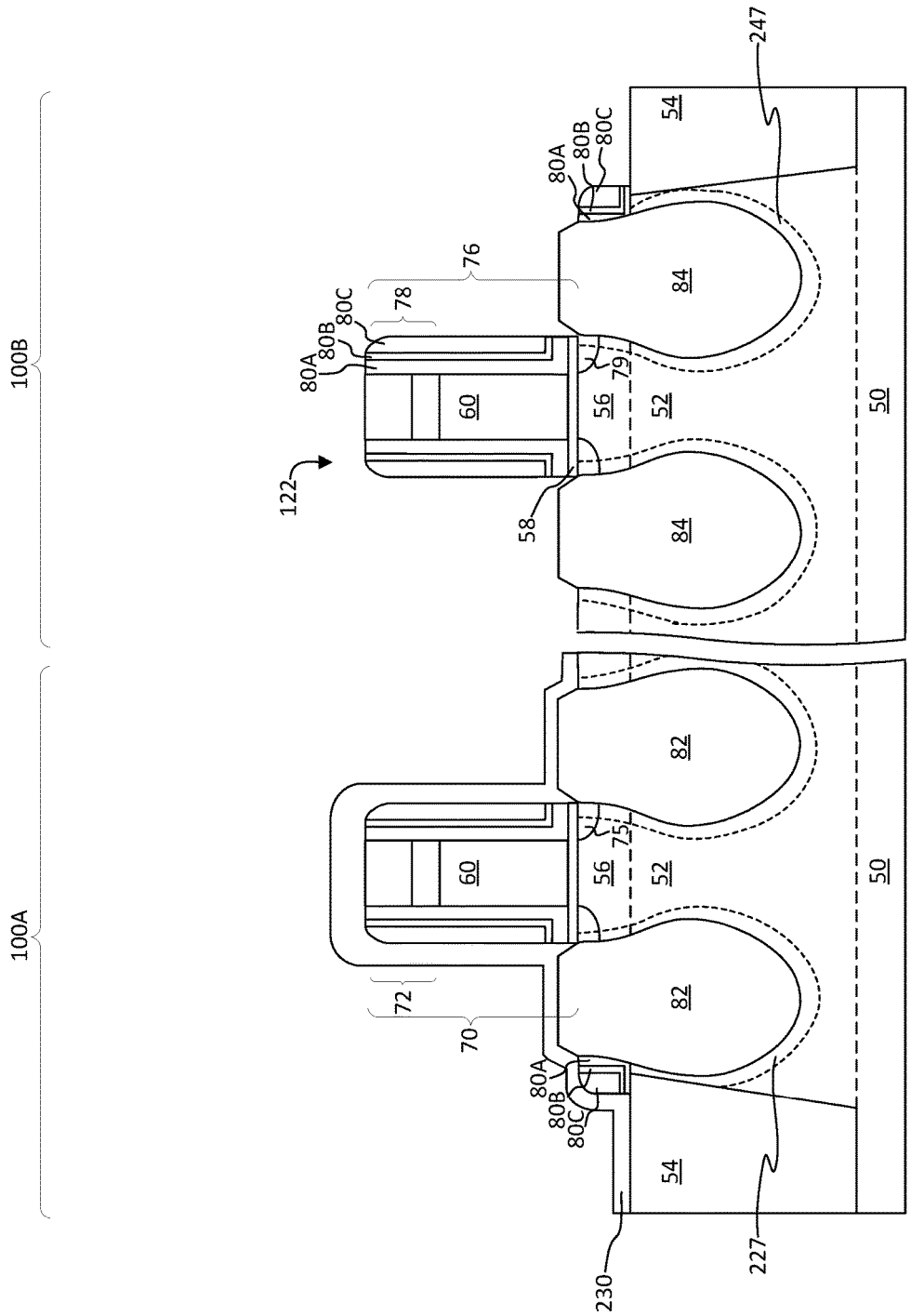
Figure 20C:
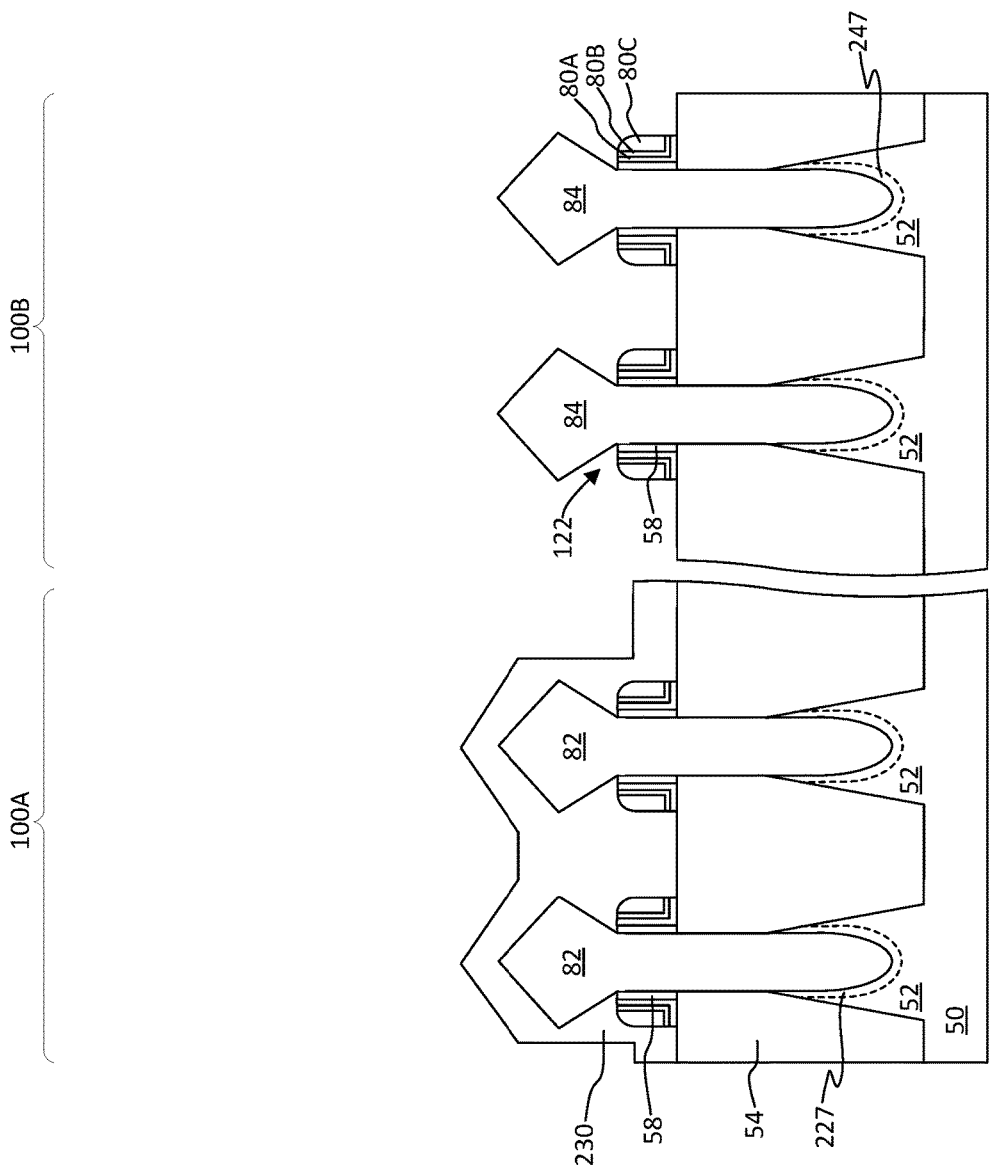

FIGS. 20B and 20C illustrate the formation of epitaxial source/drain regions 84 in the second region 100B. In some embodiments, the epitaxial source/drain regions 84 in the second region 100B are epitaxially grown in the recesses using MOCVD, MBE, LPE, VPE, SEG, a combination thereof, or the like. The epitaxial source/drain regions 84 may include any acceptable material, such as any material that is appropriate for p-type FinFETs. For example, if the fin 56 is silicon, the epitaxial source/drain regions 84 may comprise SiGe, SiGeB, Ge, GeSn, or the like. The epitaxial source/drain regions 84 may have surfaces raised from respective surfaces of the fins 56 and may have facets. The epitaxial source/drain regions 84 are formed in the fins 56 such that each dummy gate 76 is disposed between respective neighboring pairs of the epitaxial source/drain regions 84. In some embodiments epitaxial source/drain regions 84 may extend past the fins 56 and into the semiconductor strips 52, such as illustrated in FIG. 20B.

The material of the epitaxial source/drain regions 84 in the second region 100B may be implanted with dopants, similar to the process previously discussed for forming the LDD regions 79, followed by an anneal (see FIGS. 8A, 8B, and 8C). The source/drain regions 84 may have an impurity concentration in a range from about $10^{19}$ cm$^{-3}$ to about $10^{21}$ cm$^{-3}$. The p-type impurities for the source/drain regions 84 in the second region 100B, e.g., the PMOS region, may be any of the p-type impurities previously discussed. In other embodiments, the epitaxial source/drain regions 84 may be in situ doped during growth. In the illustrated embodiments, each of the source/drain regions 84 is physically separate from other source/drain regions 84. In other embodiments, two or more adjacent source/drain regions 84 may be merged. Examples of such embodiments are depicted in FIGS. 27C and 31C, such that two or three adjacent source/drain regions 84 are merged to form a common source/drain region. In some embodiments, more than two adjacent source/drain regions 84 may be merged.

Due to the film doping of the U-shaped recess 246 (see FIGS. 20B and 20C) providing a smooth sidewall profile of the recess, the epitaxial source/drain regions 84 may be formed in a more uniform manner and produce a larger volume than would otherwise be produced without the film doping.

The dimensions and characteristics of the epitaxial/source drain regions 84 may be similar to that described above with respect to the epitaxial source/drain regions 82 of FIG. 14D and are not repeated.

Figure 21A:
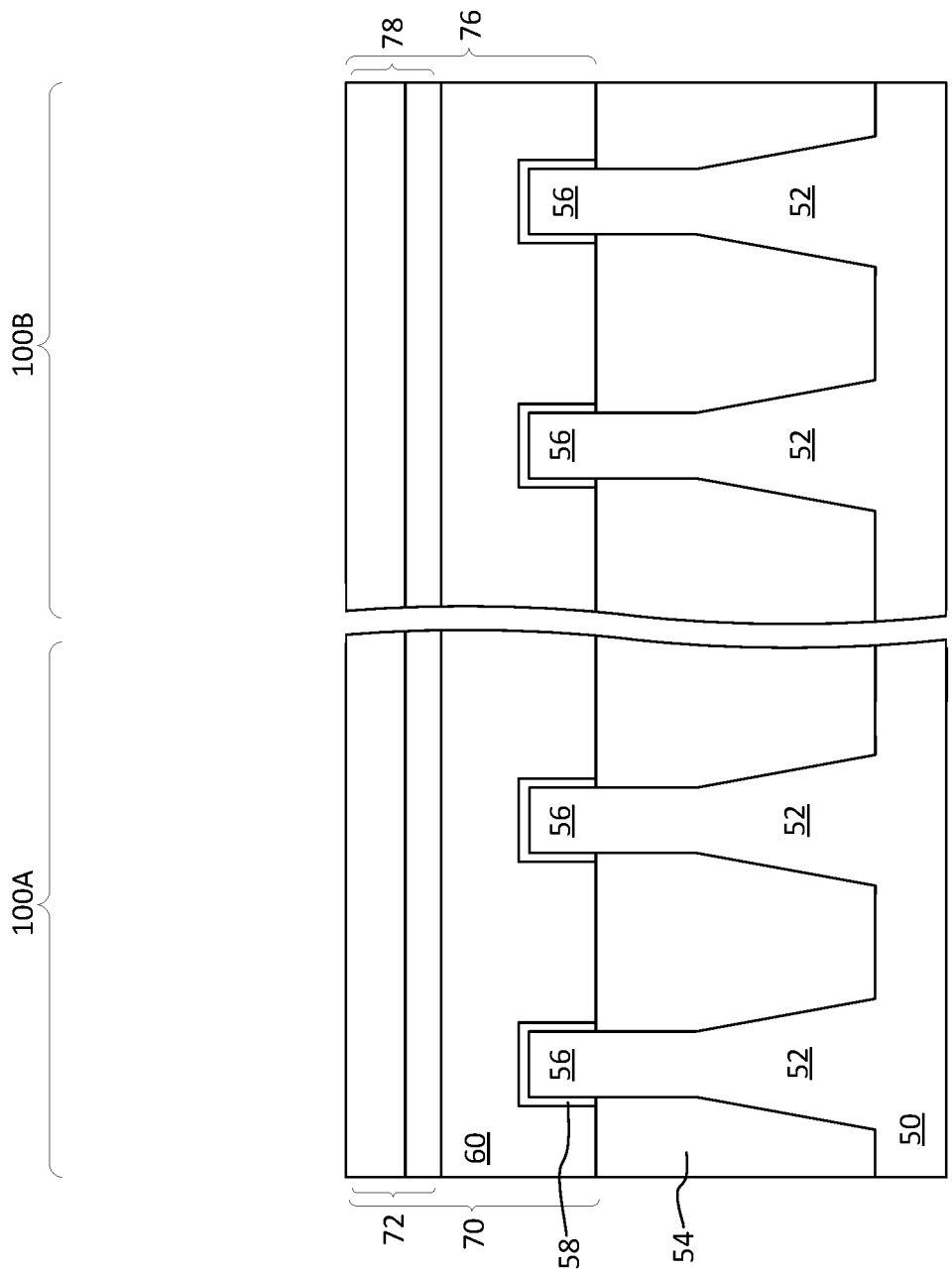
Figure 21B:
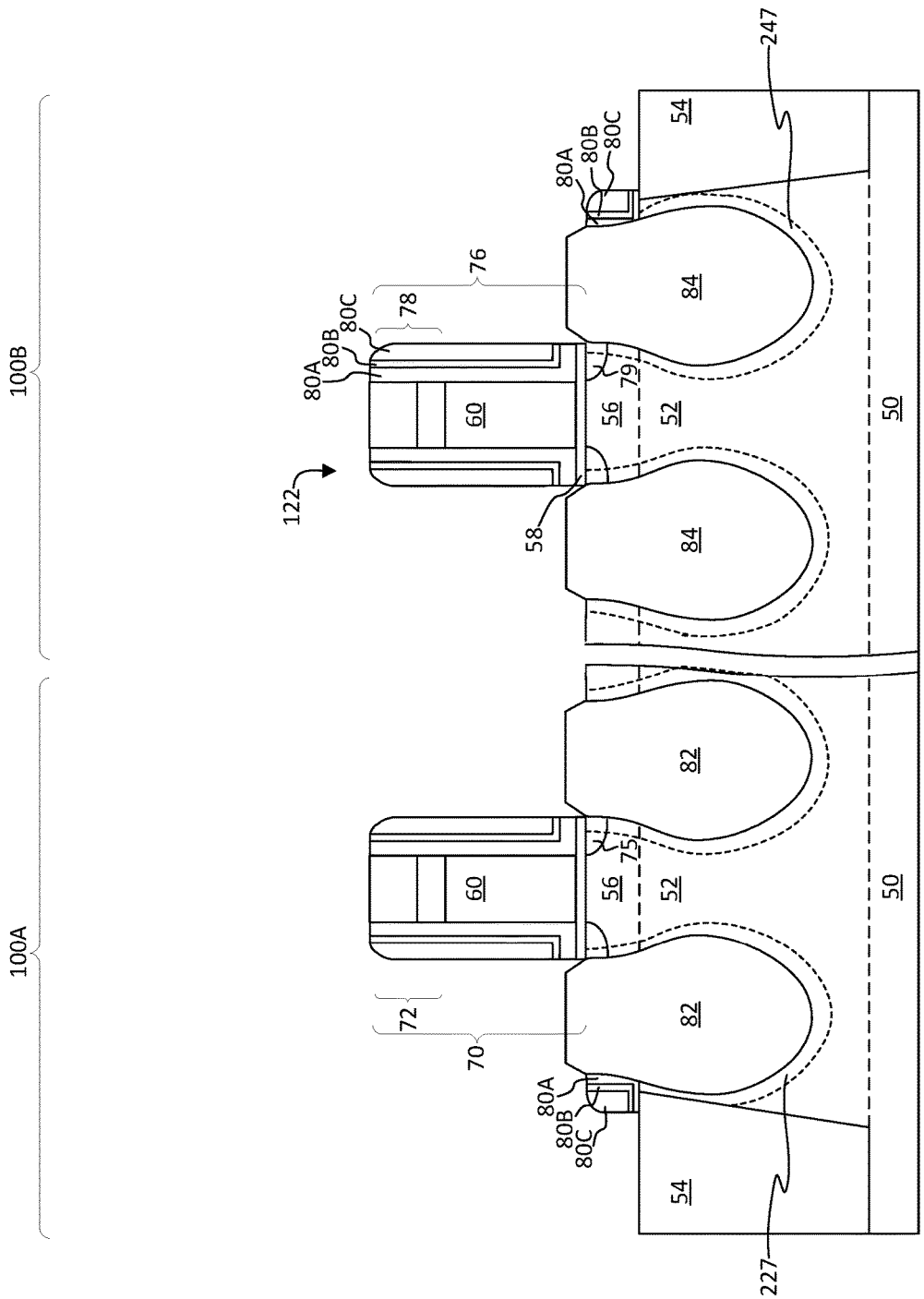
Figure 21C:
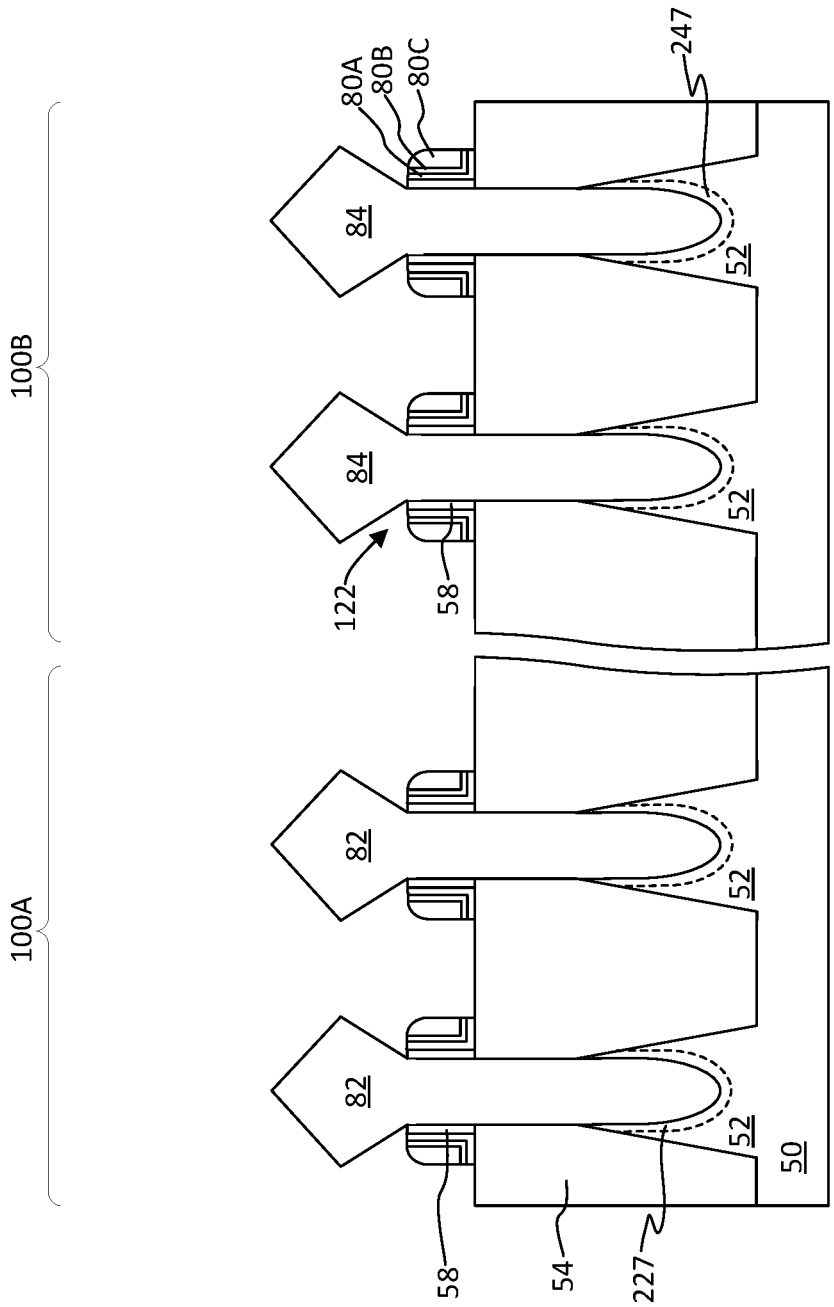

Referring to FIGS. 21A, 21B, and 21C, the mask 230 protecting the first region 100A is removed using any suitable technique.

FIGS. 22A through 25C illustrate the replacement of the dummy gates 70 in the first region 100A and the dummy gates 76 in the second region 100B with a replacement gate structure. In some embodiments the replacement gate structure may be a metal gate, such as described below. As referenced above, although a gate-last process is illustrated and discussed, one of skill will understand that a gate-first process may also be used.

Figure 22A:
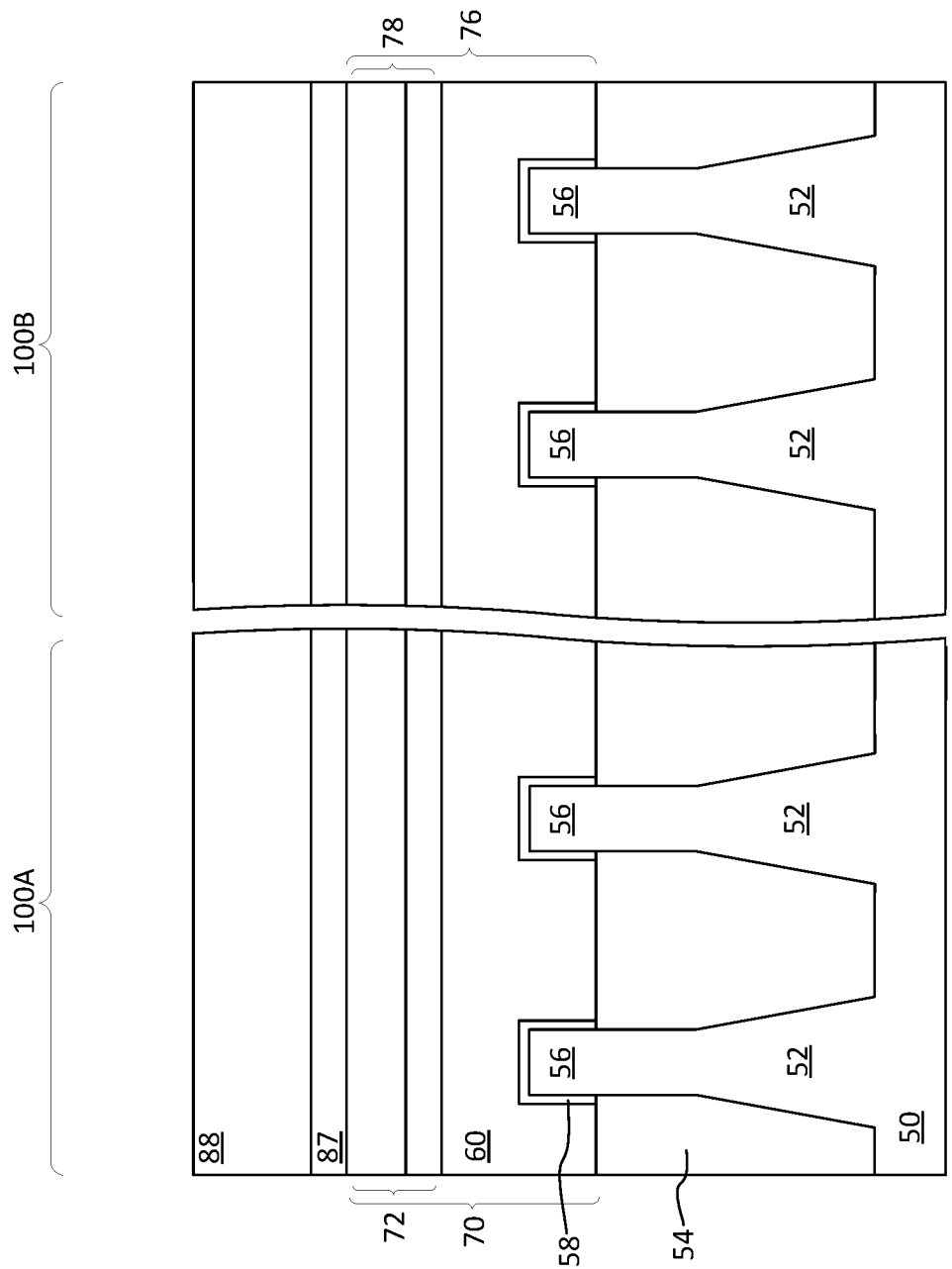
Figure 22B:
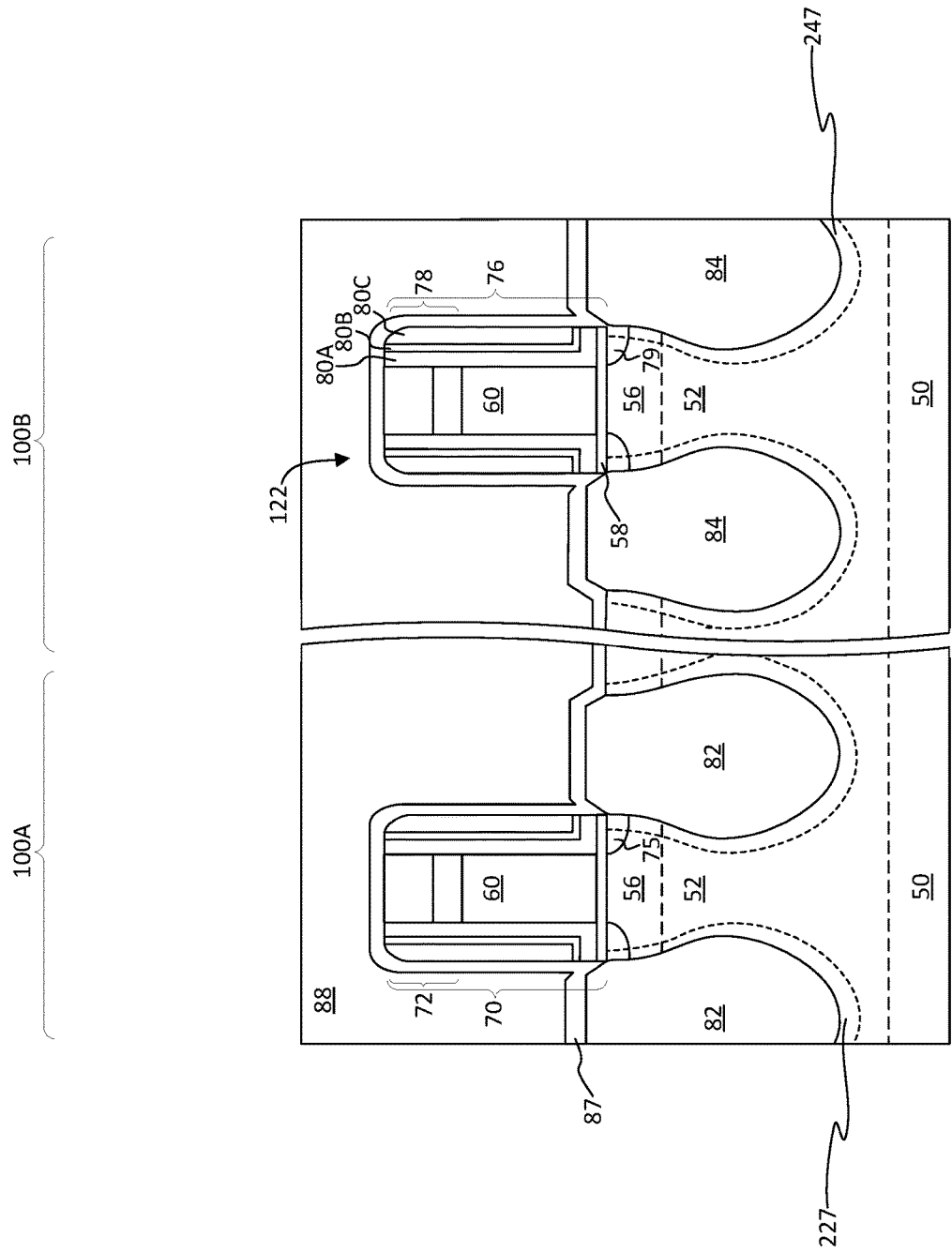
Figure 22C:
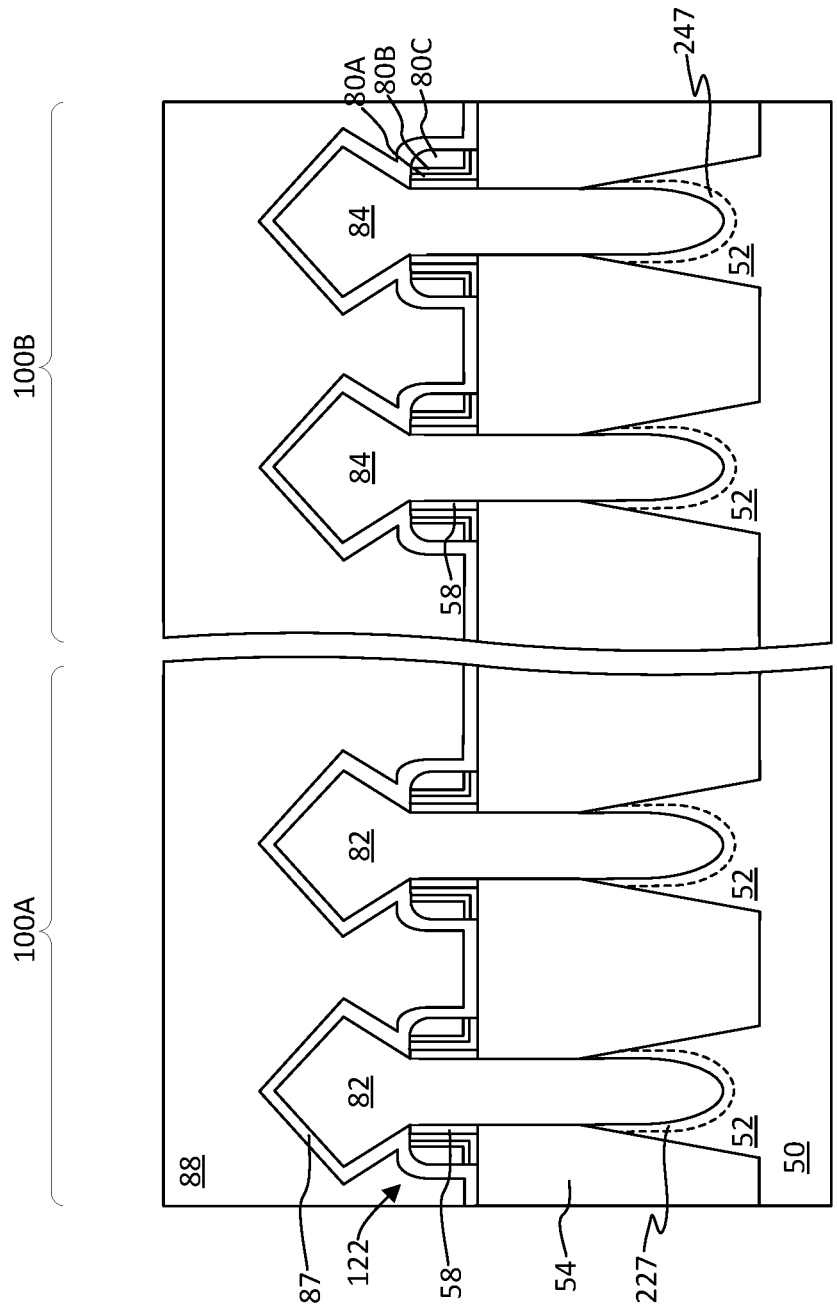

Referring to FIGS. 22A, 22B, and 22C, an etch stop layer 87 and an interlayer dielectric (ILD) 88 are deposited over the dummy gates 70 and 76, and over the source/drain regions 82 and 84. In an embodiment, the ILD 88 is a flowable film formed by a flowable CVD. In some embodiments, the ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, PECVD, a combination thereof, or the like. In some embodiments, the etch stop layer 87 is used as a stop layer while patterning the ILD 88 to form openings for subsequently formed contacts. Accordingly, a material for the etch stop layer 87 may be chosen such that the material of the etch stop layer 87 has a lower etch rate than the material of ILD 88.

Figure 23A:
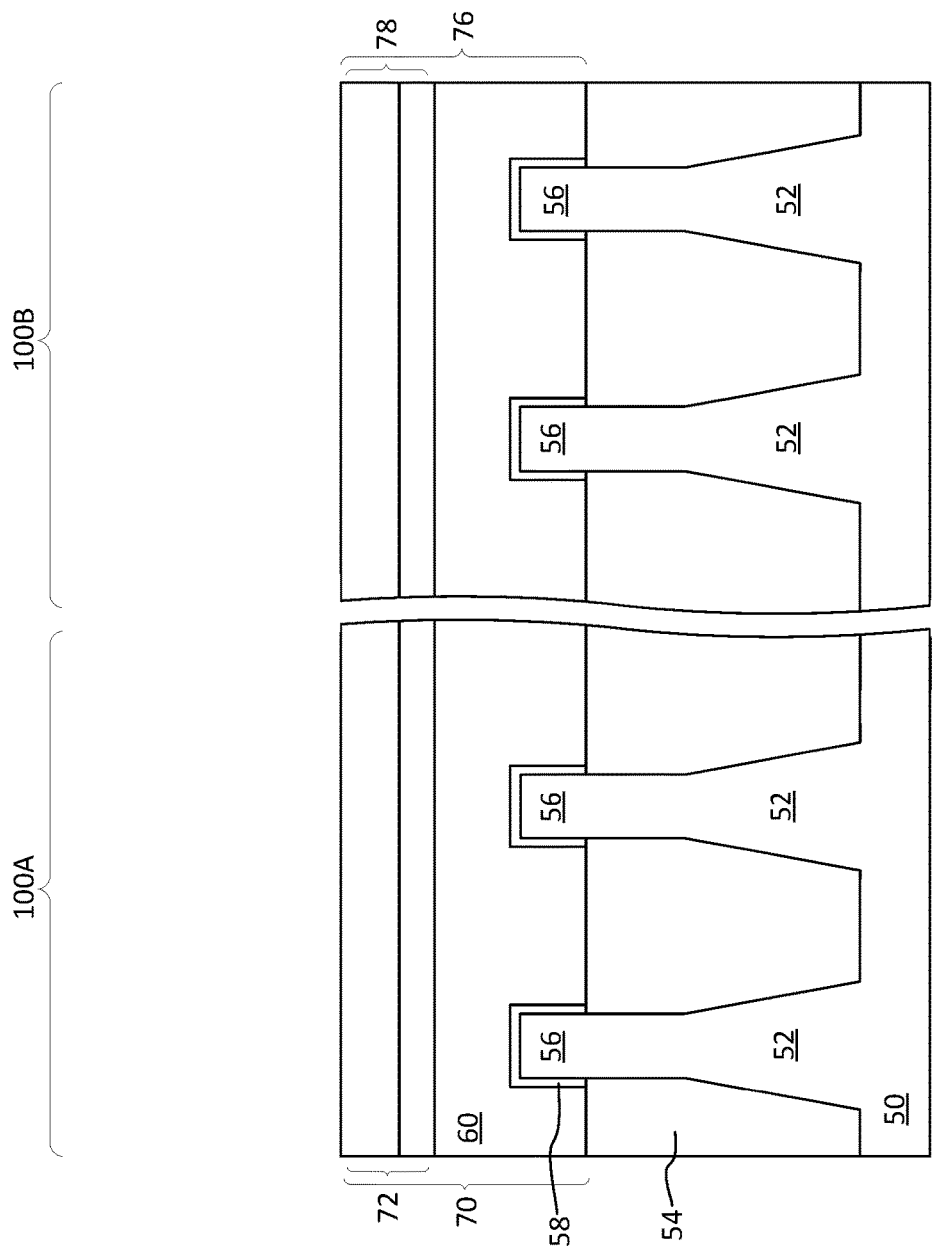
Figure 23B:
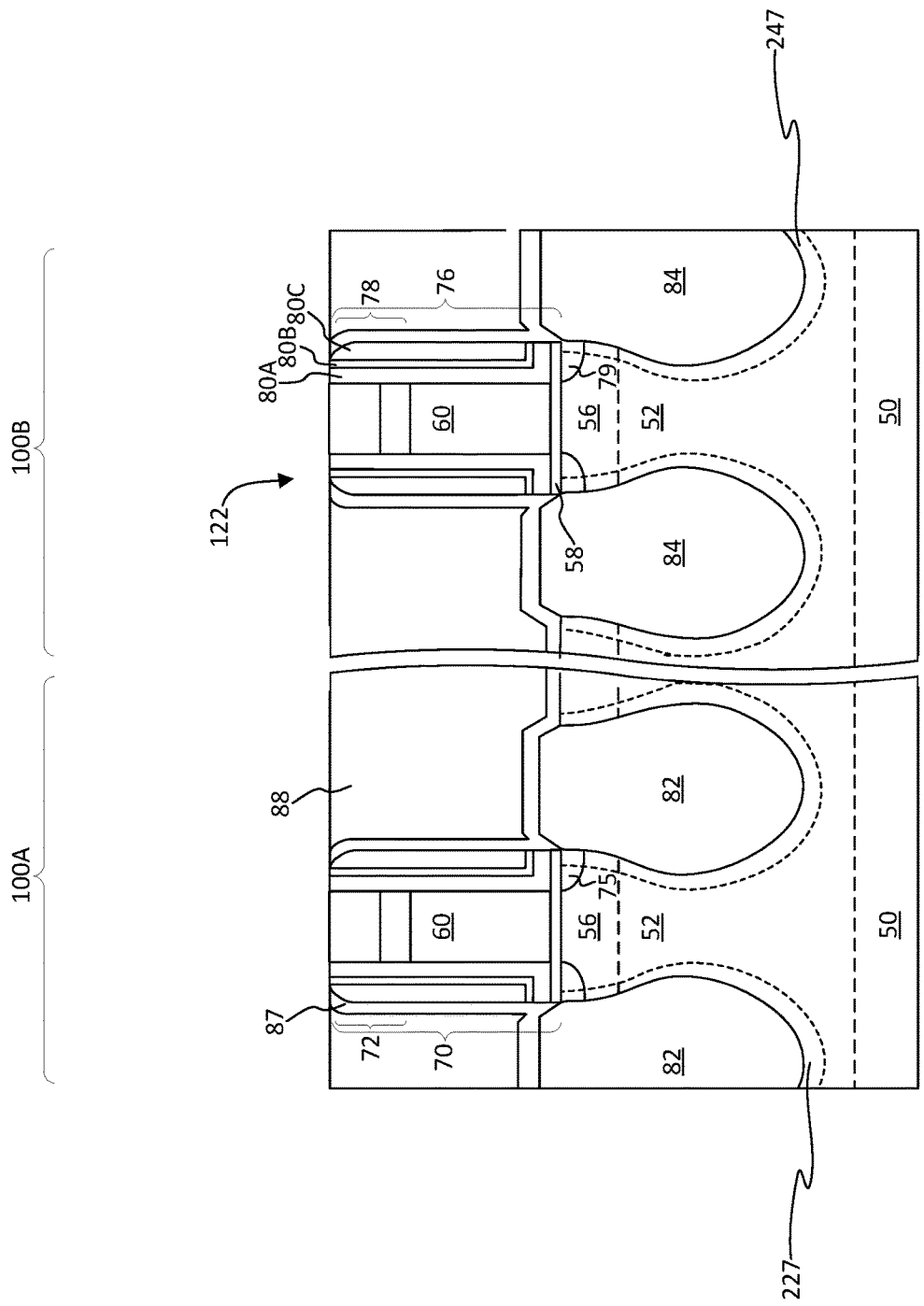
Figure 23C:
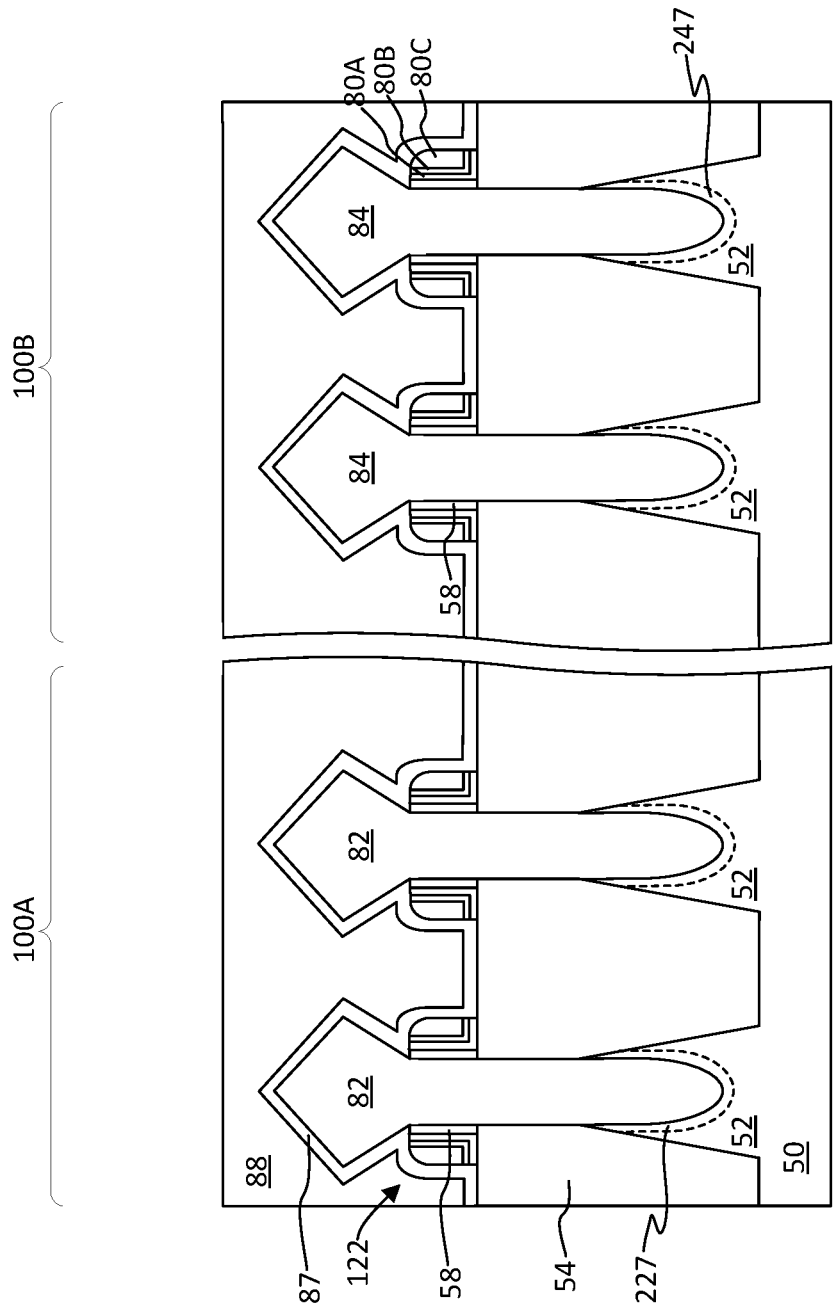

Referring to FIGS. 23A, 23B, and 23C, a planarization process, such as a CMP, may be performed to level the top surface of ILD 88 with the top surfaces of the dummy gates 70 and 76. After the planarization process, top surfaces of the dummy gates 70 and 76 are exposed through the ILD 88. In some embodiments, the CMP may also remove the masks 72 and 78, or portions thereof, on the dummy gates 70 and 76.

Figure 24B:
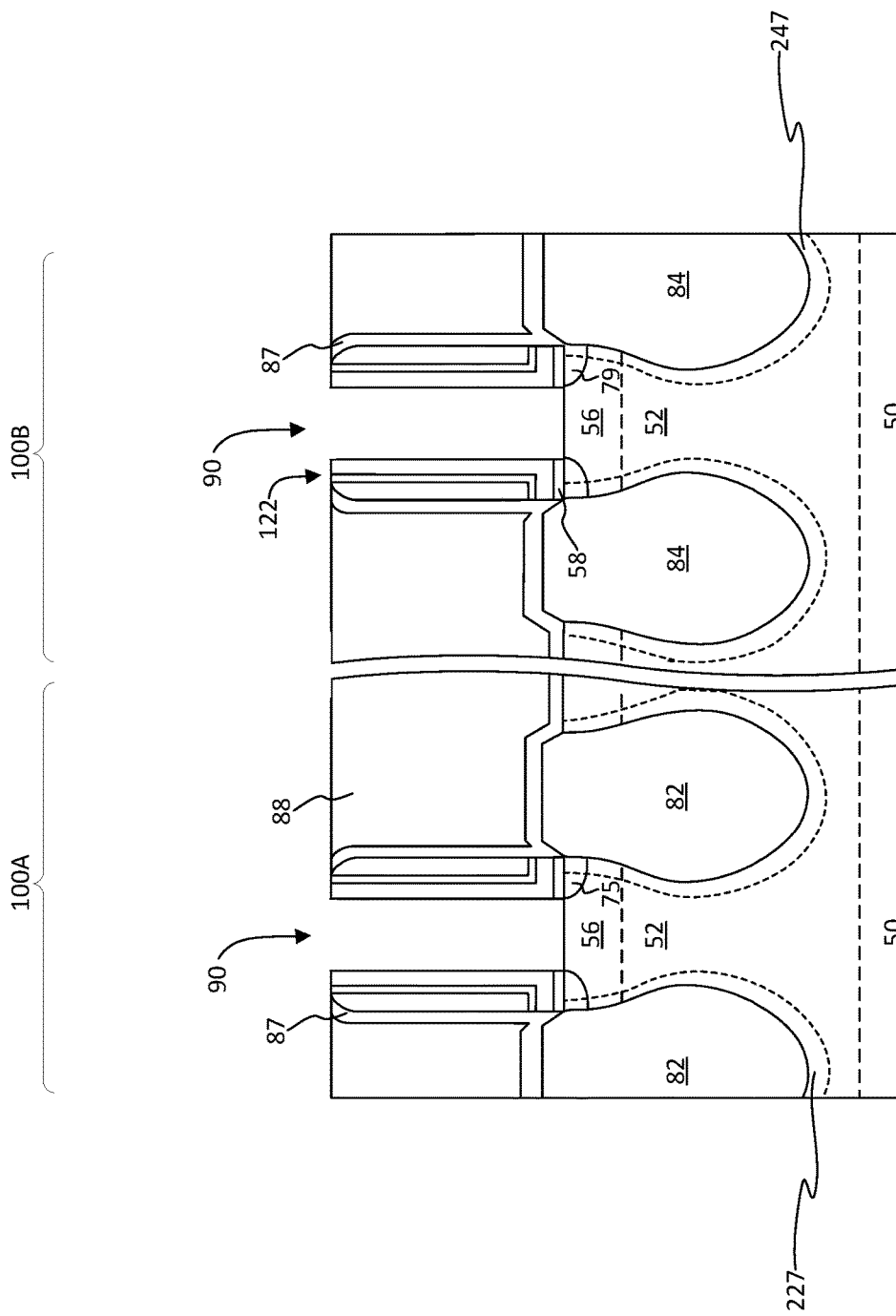
Figure 24C:
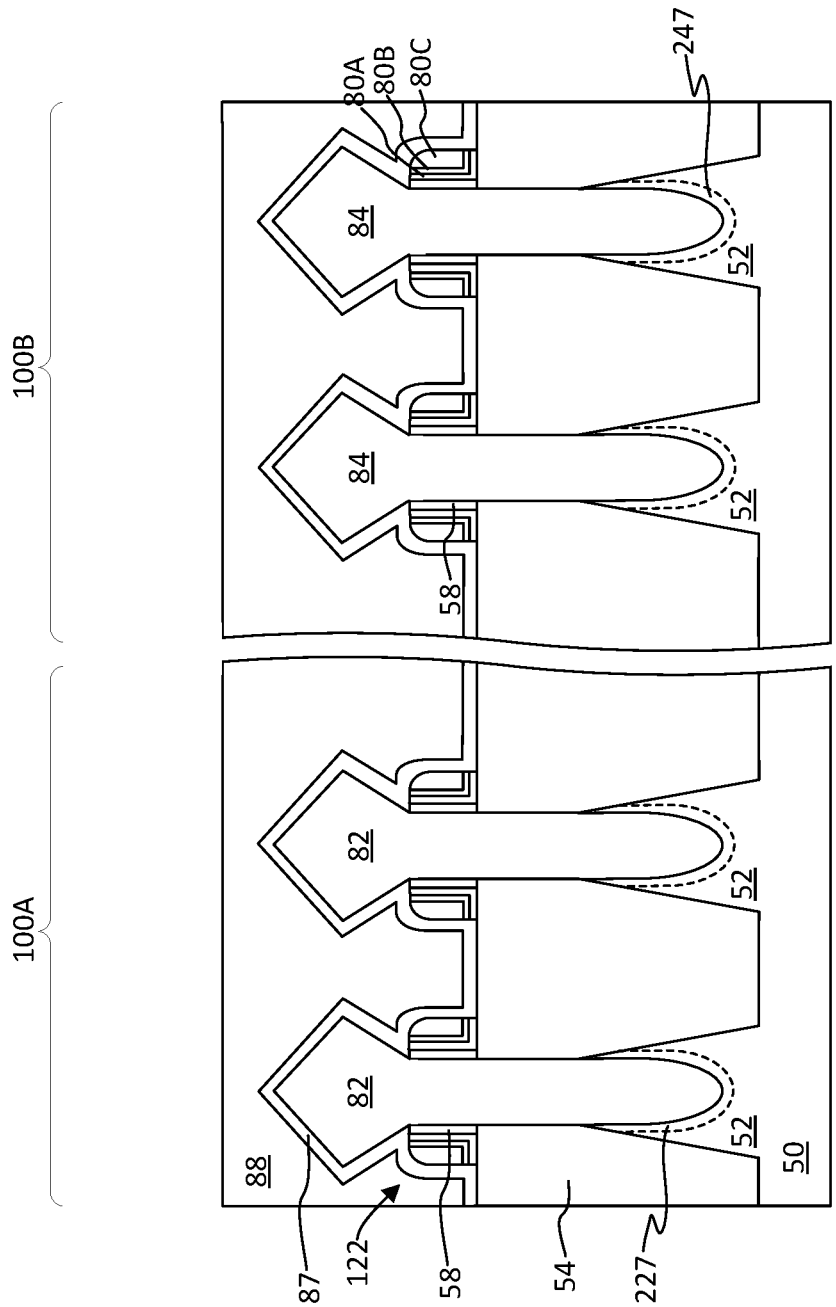

Referring to FIGS. 24A, 24B, and 24C, remaining portions of masks 72 and 78 and the dummy gates 70 and 76 are removed in an etching step(s), so that recesses 900 are formed. Each of the recesses 900 exposes a channel region of a respective fin 56. Each channel region is disposed between neighboring pairs of the epitaxial source/drain regions 82 in the first region 100A or between neighboring pairs of the epitaxial source/drain regions 84 in the second region 100B. In some embodiments, during the removal the dummy dielectric layer 58 may be used as an etch stop layer and exposed when the dummy gates 70 and 76 are etched. The exposed dummy dielectric layer 58 may then be removed after the removal of the dummy gates 70 and 76. In some embodiments, portions of the dummy dielectric layer 58 which were not exposed by the process of removing the dummy gates 70 and 76 may remain, such as illustrated in FIG. 24B.

Figure 25A:
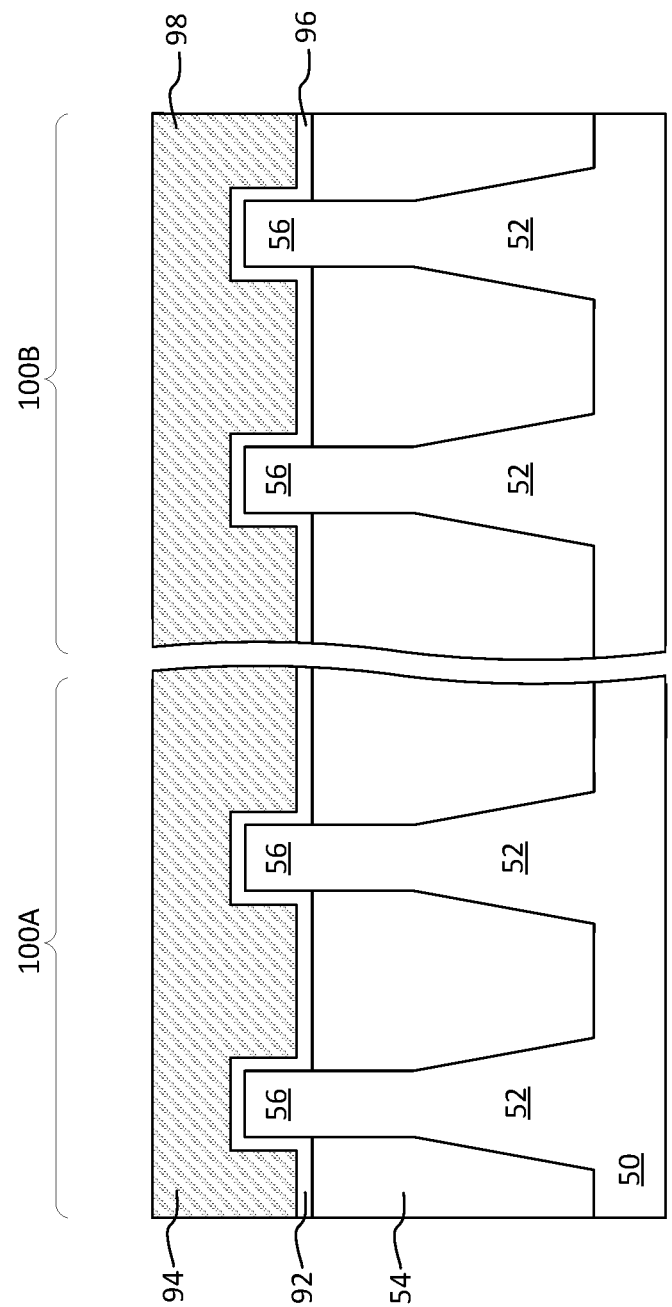
Figure 25B:
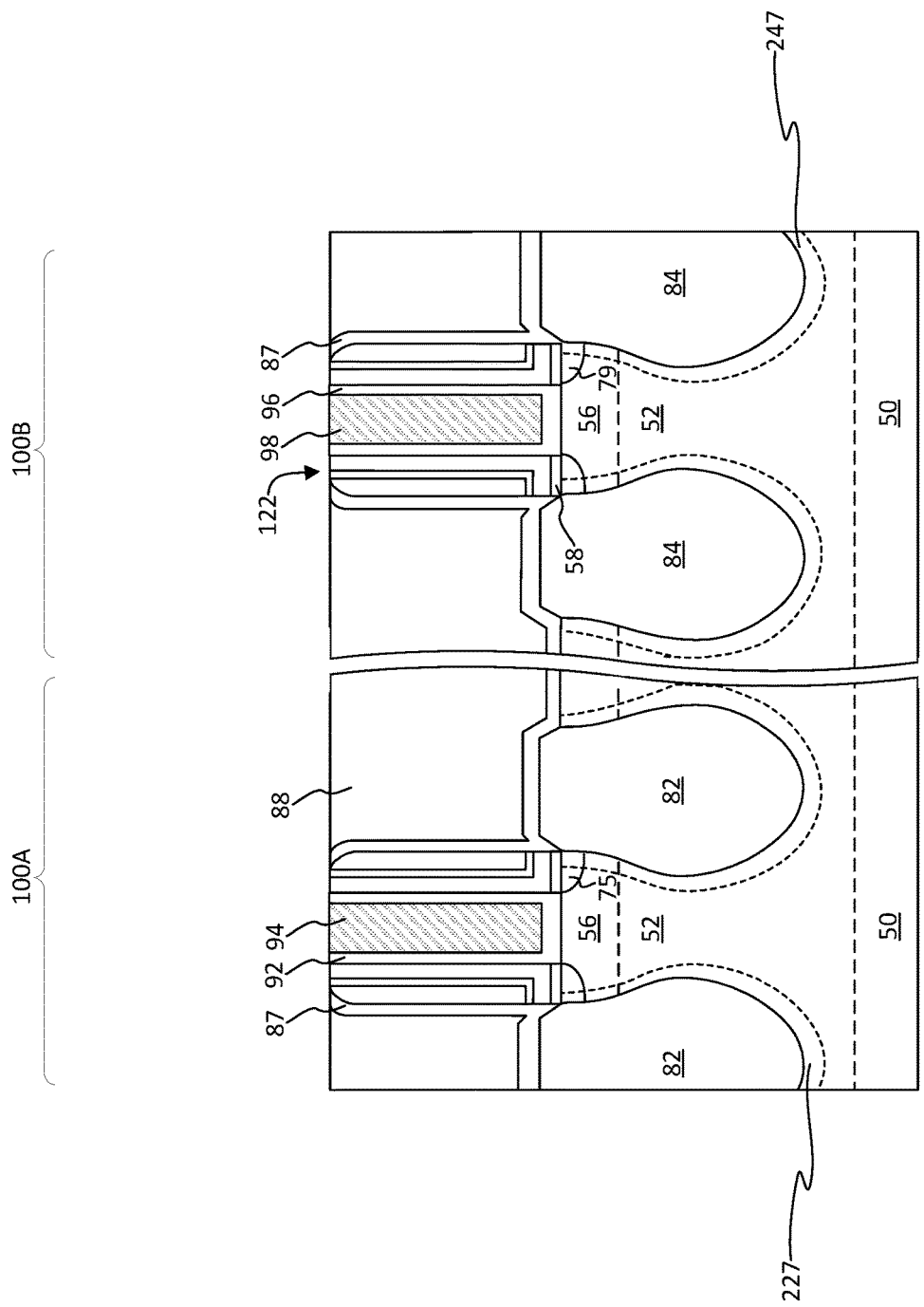
Figure 25C:
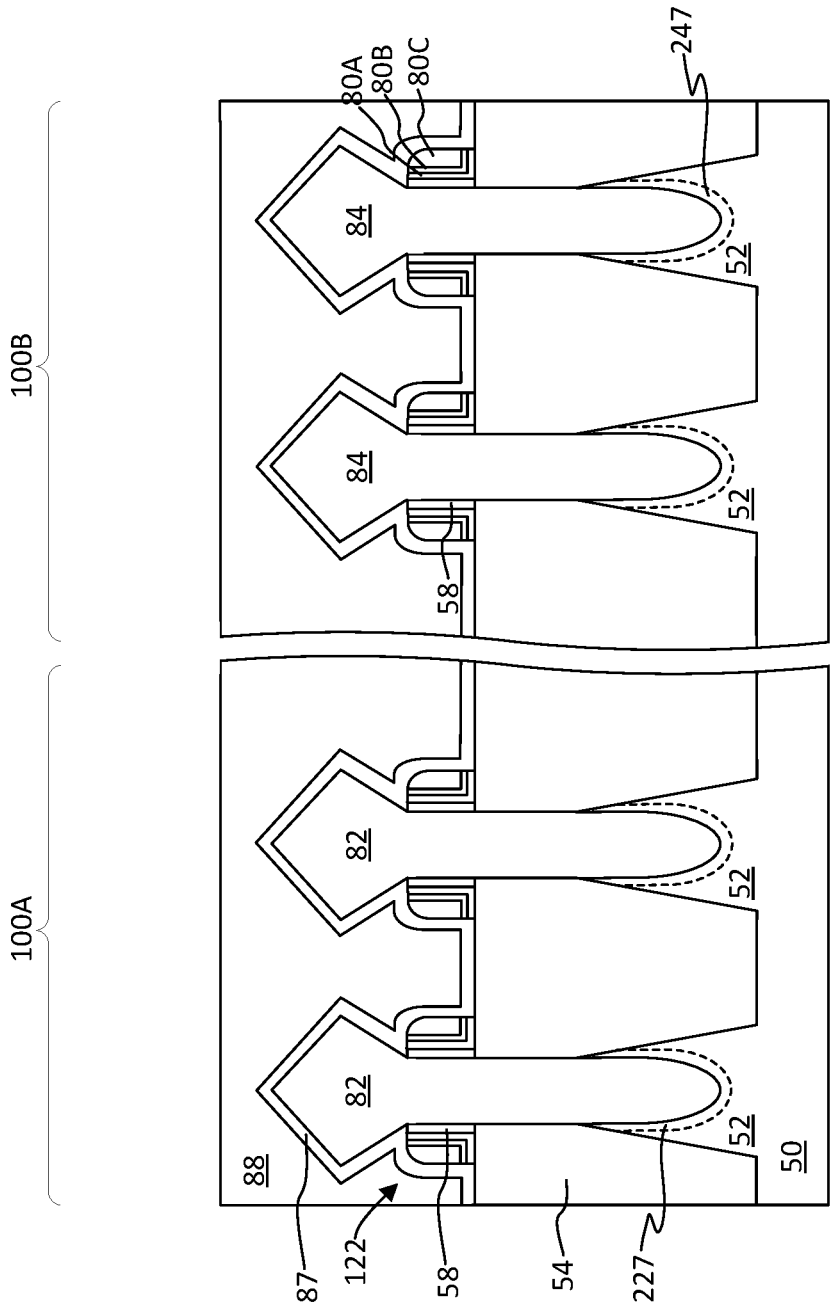

Referring to FIGS. 25A, 25B, and 25C, gate dielectric layers 92 and 96, and gate electrodes 94 and 98 are formed for replacement gates in the first region 100A and the second region 100B, respectively. The gate dielectric layers 92 and 96 are formed in the recesses 9o, such as on the top surfaces and the sidewalls of the fins 56, on sidewalls of the gate spacers 122 and 130, respectively, and on a top surface of the ILD 88. In some embodiments, the gate dielectric layers 92 and 96 are deposited in a blanket-deposited layer. In some embodiments, the gate dielectric layers 92 and 96 comprise silicon oxide, silicon nitride, or multilayers thereof. In other embodiments, the gate dielectric layers 92 and 96 include a high-k dielectric material, and in these embodiments, the gate dielectric layers 92 and 96 may have a k value greater than about 7.0, and may include a metal oxide or a silicate of Hf, Al, Zr, La, Mg, Ba, Ti, Pb, and combinations thereof. The formation methods of the gate dielectric layers 92 and 96 may include Molecular-Beam Deposition (MBD), ALD, CVD, PECVD, a combination thereof, or the like. In some embodiments, the formation may result in a conformally deposited layer with horizontal portions and vertical (or non-horizontal) portions having substantially the same thickness, for example, with the vertical thickness of the vertical portions of the dielectric layers 92 and 96 and the horizontal thickness of the horizontal portions of the dielectric layers 92 and 96 having a difference smaller than 20 percent. In some embodiments, the gate dielectric layers 92 and 96 may be thermally grown, such as described above with respect to the dummy dielectric layer 58

Next, the gate electrodes 94 and 98 are deposited over the gate dielectric layers 92 and 96, respectively, and fill the remaining portions of the recesses 90. The gate electrodes 94 and 98 may be made of a metal-containing material such as TiN, TaN, TaC, TiC, TiO, Co, Ru, Al, Ag, Au, W, Ni, Ti, Cu, combinations thereof, or multi-layers thereof. After the filling of the gate electrodes 94 and 98, a planarization process, such as a CMP, may be performed to remove the excess portions of the gate dielectric layers 92 and 96, and the gate electrodes 94 and 98, which excess portions are over the top surface of ILD 88. The resulting remaining portions of material of the gate electrodes 94 and 98, and the gate dielectric layers 92 and 96 thus form replacement gates of the resulting FinFETs.

Although not illustrated, the gate electrodes 94 and 98 may include a series of one or more stacked layers (not shown). The stacked layers may be deposited in the recesses 90 over sidewalls and bottoms of the gate electrodes 94 and 98 and over the top surface of the ILD 88. Stacked layers may be formed by a blanket-deposition method such as ALD or CVD and have a substantially uniform thickness within process variations. In some embodiments, the formation of the gate electrodes 94 and 98 may result in a conformally deposited layers having horizontal portions and vertical (or non-horizontal) portions which have substantially the same thickness, for example, with the vertical thickness of the vertical portions of the layers and the horizontal thickness of the horizontal portions having a difference smaller than 20 percent. The stacked layers may include a diffusion barrier layer and one or more work function layers over the diffusion barrier layer. The diffusion barrier layer may be formed of titanium nitride (TiN) or thallium nitride. The work function layer(s) determine the work function of the gate, and may include at least one layer, or a plurality of layers formed of different materials. The specific material of the work function layer may be selected according to whether the respective FinFET is an n-type FinFET or a p-type FinFET. For example, when the FinFET is an n-type FinFET, the work function layer may include an AlTiC layer. When the FinFET is a p-type FinFET, the work function layer may include an AlTiN and/or AlTiC layer. After the deposition of the work function layer(s), a barrier layer (not shown), which may be another TiN layer, may be formed.

In some embodiments, the formation of the gate dielectric layers 92 and 96 may occur simultaneously such that the gate dielectric layers 92 and 96 are made of the same materials, and the formation of the gate electrodes 94 and 98 may occur simultaneously such that the gate electrodes 94 and 98 are made of the same materials. However, in other embodiments, the gate dielectric layers 92 and 96 may be formed by distinct processes, such that the gate dielectric layers 92 and 96 may be made of different materials, and the gate electrodes 94 and 98 may be formed by distinct processes, such that the gate electrodes 94 and 98 may be made of different materials. Various masking steps may be used to mask and expose appropriate regions when using distinct processes.

Figure 26A:
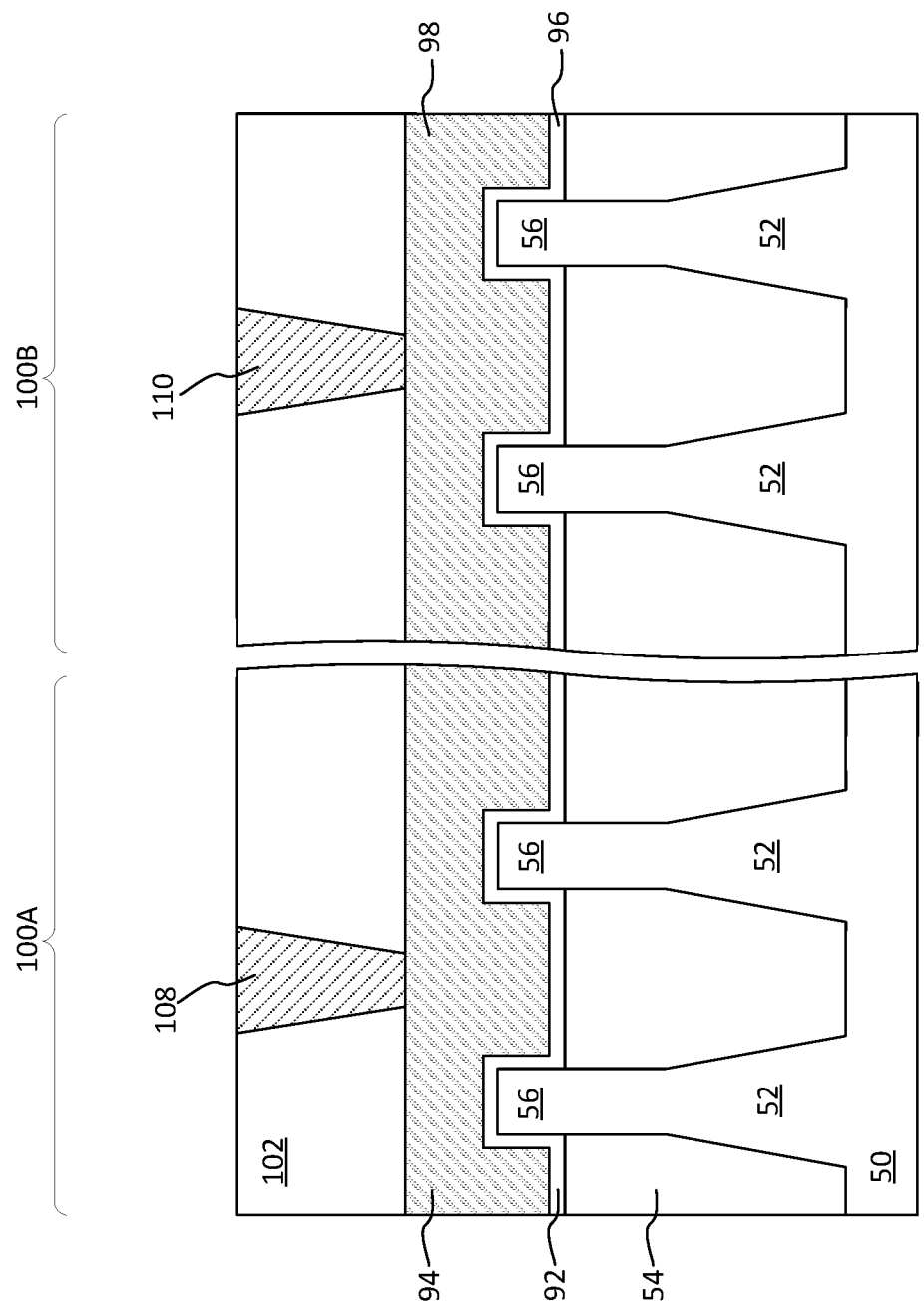
Figure 26B:
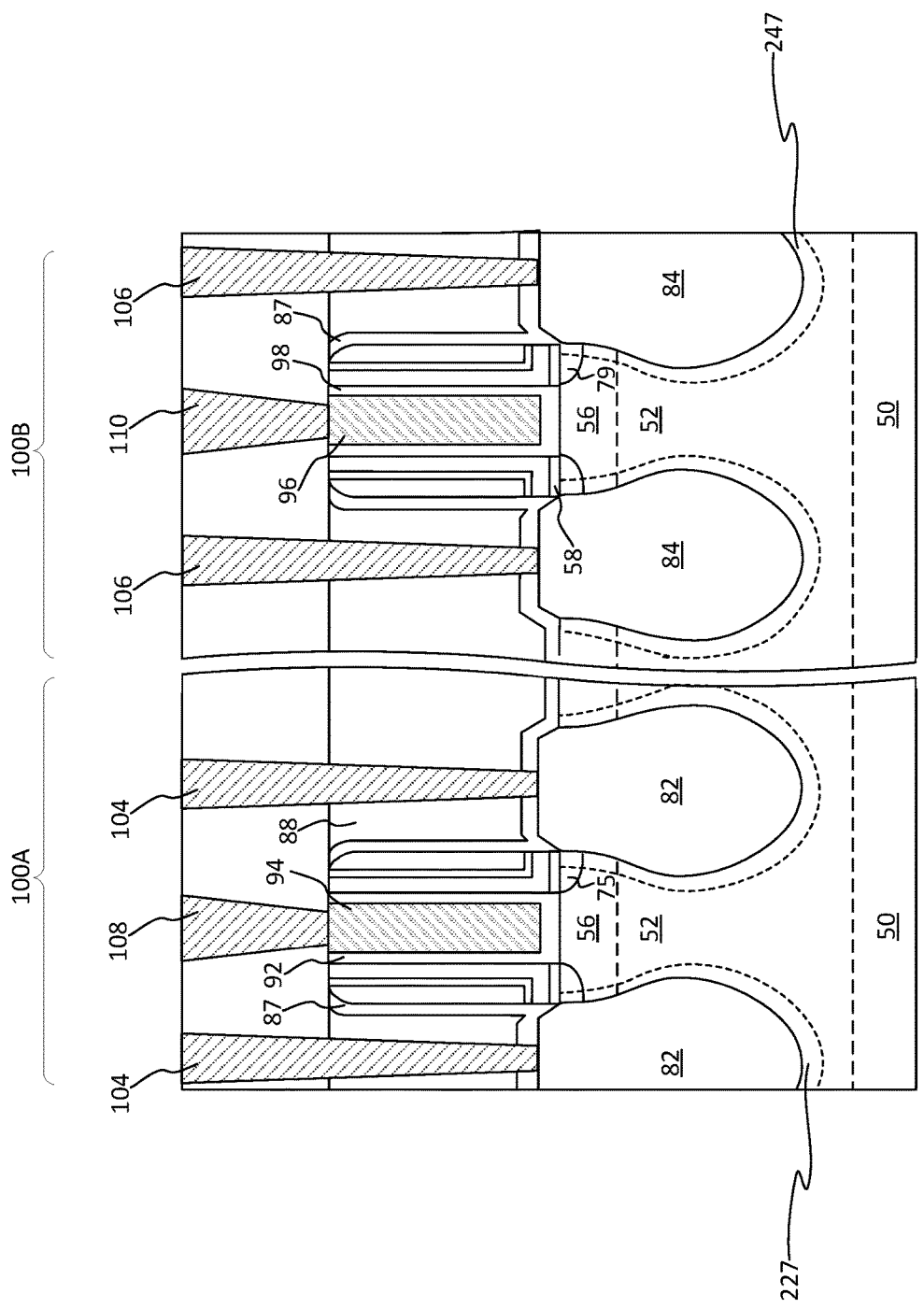
Figure 26C:
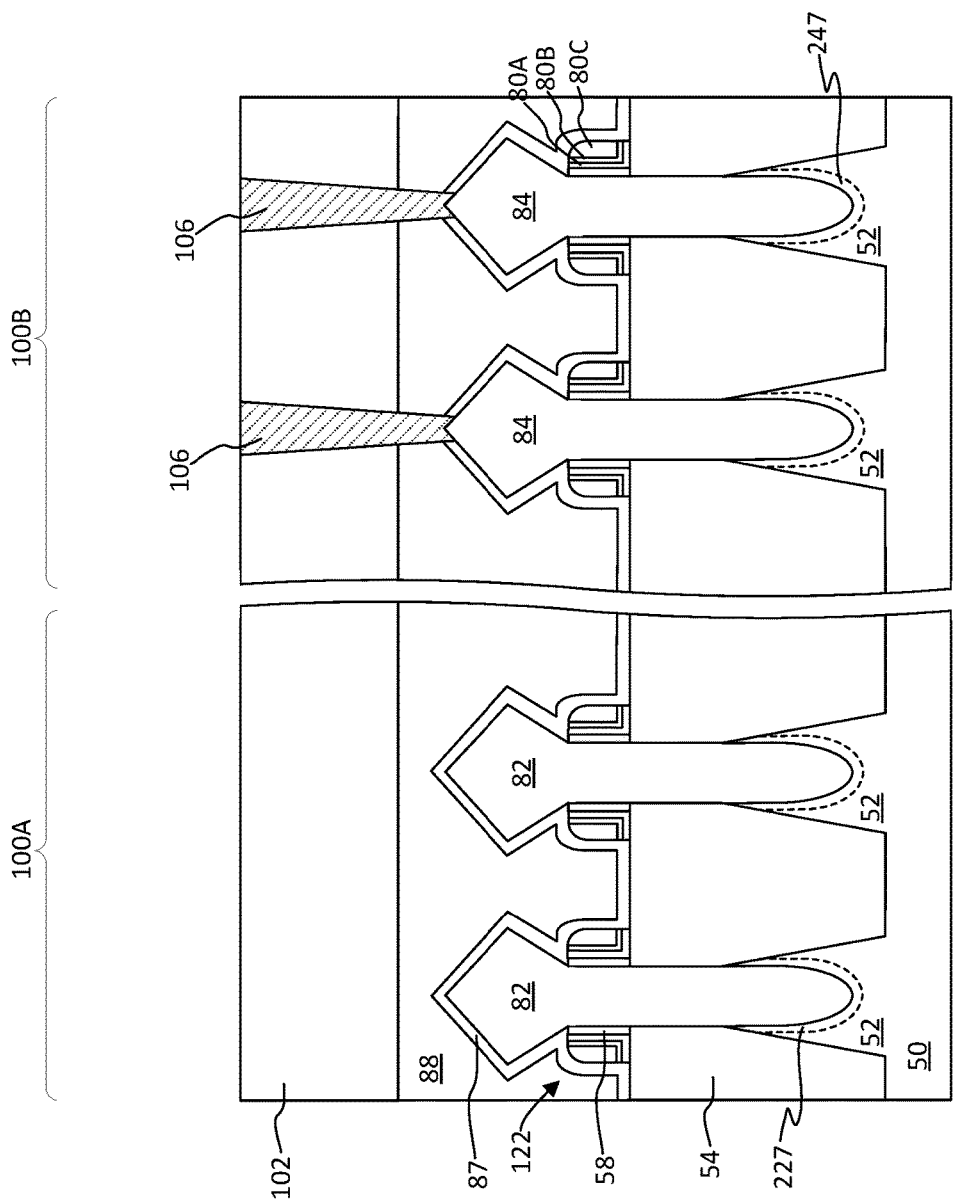

FIGS. 26A, 26B, and 26C illustrates the FinFET device after the formation of contacts to the source/drain regions 82 and 84 and gates 94 and 96. A second ILD 102 is deposited over the ILD 88, contacts 104 and 106 are formed through the ILD 102 and the ILD 88, and contacts 108 and 110 are formed through the ILD 102. In an embodiment, the ILD 102 is formed using similar materials and methods as ILD 88, described above with reference to FIGS. 22A, 22B, and 22C, and the description is not repeated. In some embodiments, the ILD 102 and the ILD 88 are formed of a same material. In other embodiments, the ILD 102 and the ILD 88 are formed of different materials.

Openings for the contacts 104 and 106 are formed through the ILDs 88 and 102, and the etch stop layer 87. Openings for the contacts 108 and 110 are formed through the ILD 102 and the etch stop layer 87. These openings may all be formed simultaneously in a same process, or in separate processes. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess materials from a top surface of the ILD 102. The remaining liner and conductive material form contacts 104, 106, 108, and 110 in the openings. An anneal process may be performed to form a silicide (not shown) at the interface between the epitaxial source/drain regions 82 and 84 and the contacts 104 and 105, respectively. The contacts 104 are physically and electrically coupled to the epitaxial source/drain regions 82, the contacts 106 are physically and electrically coupled to the epitaxial source/drain regions 84, the contact 108 is physically and electrically coupled to the gate electrode 94, and the contact 110 is physically and electrically coupled to the gate electrode 98.

FIG. 27C illustrates a cross-sectional view of a FinFET device that is similar to the FinFET device illustrated in FIGS. 26A, 26B, and 26C, with like elements labeled with like numerical references. In some embodiments, the FinFET device of FIG. 27C may be formed using similar materials and processes of the FinFET device of FIGS. 26A, 26B, and 26C, described above with reference to FIGS. 1-26C, and the description is not repeated. In the illustrated embodiment, two adjacent source/drain regions 82 and two adjacent source/drain regions 84 are merged to form respective common source/drain regions. In other embodiments, more than two adjacent source/drain regions 82 and more than two adjacent source/drain regions 84 may be merged (e.g., see FIG. 29C).

Figures 28C, 29C:
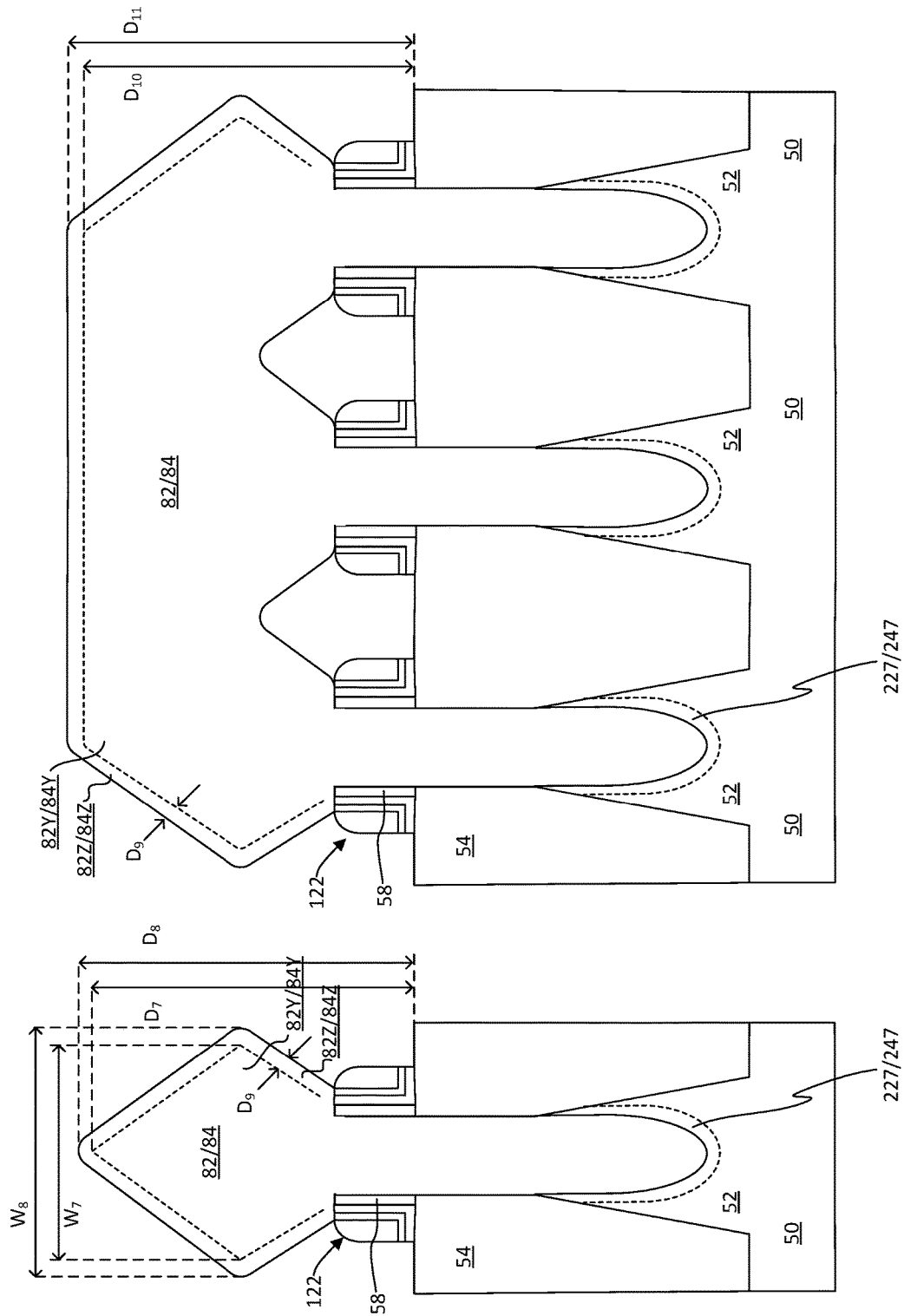

FIGS. 28c and 29C illustrate magnified portions of a cross-section of an epitaxial source/drain region of a device showing various arrangements of the epitaxial materials, in accordance with some embodiments. The cross-sectional views of FIGS. 28C and 29C correspond to a FinFET device that is similar to the FinFET device illustrated in FIGS. 26A, 26B, and 26C, with like elements labeled with like numerical references. In some embodiments, the FinFET devices of FIGS. 28C and 29C may be formed using similar materials and processes of the FinFET device of FIGS. 26A, 26B, and 26C, described above with reference to FIGS. 1-26C, and the description is not repeated.

In FIG. 28C, a single epitaxial source/drain region 82/84 may be a portion of a single fin FinFET or may be a single fin of a multiple fin FinFET. Due to the dopant diffusion process (FIGS. 13B, 13C, 13D, 19B, and 19C), the shape of the epitaxial materials in the source/drain regions 82/84 may be smoother, larger, and more defined than without the doping. The epitaxial source/drain 82/84 may comprise a first epitaxial structure 82Y/84Y and a final layer of epitaxial material 82Z/84Z formed on the first epitaxial structure 82Y/84Y using processes and materials such as those described above with respect to FIGS. 14B, 14C, 14D, 20B, and 20C. The first epitaxial structure 82Y/84Y may be made of multiple layers of epitaxial material. Width $W_7$ corresponds to the width of the first epitaxial structure 82Y/84Y. In some embodiments width $W_7$ may be about 29 nm to about 39 nm. Width $W_8$ corresponds to the width of the epitaxial source/drain region 82/84 including the final layer of epitaxial material 82Z/84Z. In some embodiments width $W_8$ may be about 38 nm to about 50 nm. Distance $D_7$ corresponds to the height of the first epitaxial structure 82Y/84Y. In some embodiments the distance $D_7$ may be about 36 nm to about 48 nm. Distance $D_8$ corresponds to the height of the epitaxial source/drain regions 82/84 including the final layer of epitaxial material 82Z/84Z. In some embodiments $D_8$ may be about 43 nm to about 54 nm.

Distance $D_9$ corresponds to the thickness of the final layer of epitaxial material 82Z/84Z. In some embodiments $D_9$ may be about 3.5 nm to about 7.5 nm.

The profile of the epitaxial source/drain regions 82/84 may have a greater volume and height with better defined facets as a result of the intermetallic doping diffusion process described herein (see FIGS. 12B, 12C, 18B, and 18C, and accompanying description).

In FIG. 29C, a triple epitaxial source/drain region 82/84 may be a portion of the fins of a FinFET illustrating a crown-shaped structure having a merged epitaxial structure. Due to the dopant diffusion process (FIGS. 13B, 13C, 13D, 19B, and 19C), the shape of the epitaxial materials in the source/drain regions 82/84 may be smoother, larger, and more defined than without the doping. The epitaxial source/drain regions 82/84 may comprise a first merged epitaxial structure 82Y/84Y and a final layer of epitaxial material 82Z/84Z formed on the first merged epitaxial structure 82Y/84Y using processes and materials such as those described above with respect to FIGS. 14B, 14C, 14D, 20B, and 20C. The first epitaxial structure 82Y/84Y may be made of multiple layers of epitaxial material. Distance $D_{10}$ corresponds to the height of the first epitaxial structure 82Y/84Y. In some embodiments the distance $D_{10}$ may be about 51 nm to about 58 nm. Distance $D_{11}$ corresponds to the height of the epitaxial source/drain regions 82/84 including the final layer of epitaxial material 82Z/84Z. In some embodiments distance $D_{11}$ may be about 53 nm to about 64 nm. Distance $D_9$ corresponds to the thickness of the final layer of epitaxial material 82Z/84Z. In some embodiments the distance $D_9$ may be about 3.5 nm to about 7.5 nm.

Embodiments of the present disclosure provide an increased concentration of dopant impurities in the source/drain regions of an n-type FinFET, p-type FinFET, or both (such as in a complimentary configuration). The increased concentration of dopant provides enhanced carrier mobility and reduces sheet resistance in the source/drain regions. An additional benefit of the process of using thermal diffusion of a doped silicate glass to provide the dopant, is that the profile of the recessed fin in the source/drain areas (prior to the formation of an epitaxial source/drain region) has smoother surfaces. The smoother surfaces provide for an epitaxial structure in the source/drain regions (the epitaxial source/drain regions described above) which has a more defined faceted profile, having a greater height, width, and volume.

One embodiment is a method that includes etching a substrate to form a first semiconductor strip. A first dummy gate structure is formed over a first channel region of the first semiconductor strip, where the first dummy gate is perpendicular to the first semiconductor strip. A first recess is etched in the first semiconductor strip on a first side of the first dummy gate. A second recess is etched in the first semiconductor strip on a second side of the first dummy gate. A first intermetallic doping film is formed in the first recess and the second recess. A first dopant of the intermetallic doping film is diffused into the first semiconductor strip proximate the first recess and into the first semiconductor strip proximate the second recess. A source/drain region is epitaxially grown in the first recess and the second recess.

Another embodiment is a method that includes etching a first set of recesses in a source/drain area of a first region of a FinFET device and depositing a first intermetallic doping film in the first set of recesses. The first intermetallic doping film is annealed to diffuse dopant of the first intermetallic doping film adjacent to the first set of recesses. A first epitaxial source/drain region is grown in one or more recesses of the first set of recesses. The method also includes etching a second set of recesses in a source/drain area of a second region of a FinFET device and depositing a second intermetallic doping film in the second set of recesses, where the second intermetallic doping film is different than the first intermetallic doping film. The second intermetallic doping film is annealed to diffuse dopant of the second intermetallic doping film adjacent to the second set of recesses. A second epitaxial source/drain region is grown in one or more recesses of the second set of recesses.

One embodiment is a semiconductor device that includes a plurality of semiconductor strips and an isolation area formed between the plurality of semiconductor strips, where the isolation area having an upper surface lower than an upper surface of the plurality of semiconductor strips. The device also includes a plurality of gate stacks formed over a first channel region of the plurality of semiconductor strips, where the plurality of gate stacks are perpendicular to the plurality of semiconductor strips. A first epitaxial source/drain region is interposed between a first two of the plurality of gate stacks, where the first epitaxial source/drain region is formed in a first opening in a first strip of the plurality of semiconductor strips. A first dopant diffusion area surrounds the first epitaxial source/drain region and has a first concentration of the first dopant A first outside diffusion area surrounds and is continuous with at least a portion of the first dopant diffusion area, and has a second concentration of the first dopant. The first concentration of the first dopant is greater than the second concentration of the first dopant.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   etching a substrate to form a first semiconductor strip;
   forming a first dummy gate structure over a first channel region of the first semiconductor strip, the first dummy gate structure being perpendicular to the first semiconductor strip;
   etching a first recess in the first semiconductor strip on a first side of the first dummy gate structure;
   etching a second recess in the first semiconductor strip on a second side of the first dummy gate structure;
   forming a first intermetallic doping film in the first recess and the second recess;
   diffusing a first dopant of the first intermetallic doping film into the first semiconductor strip proximate the first recess and into the first semiconductor strip proximate the second recess;
   epitaxially growing a source/drain region in the first recess; and
   epitaxially growing a source/drain region in the second recess.

2. The method of claim 1, wherein the first dopant is selected from a group consisting of phosphorous, arsenic, antimony, bismuth, or a combination of two or more thereof.

3. The method of claim 1, wherein the first dopant is selected from a group consisting of boron, aluminum, gallium, indium, or a combination of two or more thereof.

4. The method of claim 1, wherein diffusing the first dopant comprises thermally annealing the first intermetallic doping film between 900 to 1000 degrees Celsius for 3 to 6 seconds.

5. The method of claim 1, wherein forming the first intermetallic doping film comprises:
   providing a first process gas at a first concentration, the first process gas being a source for silicon, and
   providing a second process gas at a second concentration, the second process gas being a source for the first dopant, wherein a ratio of the second concentration to the first concentration determines a concentration of the first dopant in the first intermetallic doping film.

6. The method of claim 5, wherein the first process gas comprises:
   tetraethylorthosilicate (TEOS) or silane ($SiH_4$), and wherein the second process gas comprises: $PH_3$, $POCl_3$, or $B_2H_6$.

7. The method of claim 1, further comprising:
   forming a second dummy gate structure over a second channel region of the first semiconductor strip, the first channel region being separated from the second channel region by an isolation structure;
   etching a third recess in the first semiconductor strip on a first side of the second dummy gate structure;
   etching a fourth recess in the first semiconductor strip on a second side of the second dummy gate structure;
   forming a second intermetallic doping film in the third recess and the fourth recess;
   diffusing a second dopant of the second intermetallic doping film into the first semiconductor strip proximate the third recess and into the first semiconductor strip proximate the fourth recess, wherein the second dopant is different from the first dopant; and
   epitaxially growing a source/drain region in the third recess and a source/drain region in the fourth recess.

8. The method of claim 7, further comprising:
   etching the substrate to form a second semiconductor strip parallel to the first semiconductor strip, wherein the first dummy gate structure is formed over a first channel region of the second semiconductor strip, and wherein the second dummy gate structure is formed over a second channel region of the second semiconductor strip;
   depositing an isolation material between the first and second semiconductor strip;
   diffusing the first dopant of the first intermetallic doping film into the second semiconductor strip; and
   diffusing the second dopant of the second intermetallic doping film into the second semiconductor strip.

9. A method comprising:
   etching a first set of recesses in a source/drain area of a first region of a FinFET device;
   depositing a first intermetallic doping film in the first set of recesses;
   annealing the first intermetallic doping film to diffuse a dopant of the first intermetallic doping film adjacent to the first set of recesses;
   removing the first intermetallic doping film;
   growing a first epitaxial source/drain region in one or more recesses of the first set of recesses;
   etching a second set of recesses in a source/drain area of a second region of a FinFET device;
   depositing a second intermetallic doping film, different than the first intermetallic doping film, in the second set of recesses;
   annealing the second intermetallic doping film to diffuse a dopant of the second intermetallic doping film adjacent to the second set of recesses;
   removing the second intermetallic doping film; and
   growing a second epitaxial source/drain region in one or more recesses of the second set of recesses.

10. The method of claim 9, wherein the dopant of the first intermetallic doping film is selected from a list consisting of phosphorous, arsenic, antimony, bismuth, or a combination of two or more thereof, and wherein the dopant of the second intermetallic doping film is selected from a list consisting of boron, aluminum, gallium, indium, or a combination of two or more thereof.

11. The method of claim 9, wherein the first intermetallic doping film is a first doped silicate glass and wherein the second intermetallic doping film is a second doped silicate glass.

12. The method of claim 11, wherein the annealing the first intermetallic doping film comprises annealing the first doped silicate glass between 900 to 1000 degrees Celsius for 3 to 6 seconds.

13. The method of claim 9, further comprising:
   forming a first dummy gate structure perpendicular to and over one or more semiconductor fins, wherein the first set of recesses are etched in the one or more semiconductor fins on opposite sides of the first dummy gate structure.

14. The method of claim 13, wherein the first epitaxial source/drain region comprises a plurality of epitaxial structures merged into a single faceted structure.

15. The method of claim 13, further comprising:
   replacing the first dummy gate structure with a first replacement gate structure, the first replacement gate structure including a gate electrode;
   forming a first dielectric layer over the first replacement gate structure; and
   forming a contact through the first dielectric layer to the gate electrode.

16. The method of claim 9, wherein:
   depositing the first intermetallic doping film comprises:
      providing a first process gas at a first concentration, the first process gas being a source for silicon, and
      providing a second process gas at a second concentration, the second process gas being a source for the first dopant; and
   depositing the second intermetallic doping film comprises:
      providing a third process gas at a third concentration, the third process gas being a source for silicon, and
      providing a fourth process gas at a fourth concentration, the fourth process gas being a source for the second dopant.

17. A method comprising:
   etching a first recess in a first semiconductor strip;
   depositing a first intermetallic doping film in the first recess;
   annealing the first intermetallic doping film to diffuse a first dopant of the first intermetallic doping film into the first semiconductor strip surrounding the first recess, the first dopant corresponding to an n-type dopant;
   removing the first intermetallic doping film; and
   growing a first epitaxial source/drain region in the first recess.

18. The method of claim 17, further comprising:
   etching a second recess in a second semiconductor strip;
   depositing a second intermetallic doping film in the second recess;

annealing the second intermetallic doping film diffusing a second dopant of the second intermetallic doping film into the second semiconductor strip surrounding the second recess, the second dopant corresponding to a p-type dopant;

removing the second intermetallic doping film; and growing a second epitaxial source/drain region in the first recess.

19. The method of claim 17, wherein an isolation material surrounds a bottom portion of the first semiconductor strip, wherein etching the first recess comprises etching the first semiconductor strip until the first recess has a bottommost point below an uppermost surface of the isolation material.

20. The method of claim 17, wherein depositing the first intermetallic doping film comprises:

providing a first process gas to a process chamber at a first concentration, the first process gas being a source for silicon, and providing a second process gas to the process chamber at a second concentration, the second process gas being a source for the first dopant, wherein a ratio of the second concentration to the first concentration determines a concentration of the first dopant in the first intermetallic doping film.

* * * * *